US010632456B2

(12) United States Patent
Tsukida et al.

(10) Patent No.: US 10,632,456 B2
(45) Date of Patent: Apr. 28, 2020

(54) PROCESS FOR PRODUCING ORGANIC ACID ESTER-TYPE LIQUID, AND PROCESS FOR PRODUCING SOLVENT OF RESIST FOR PRODUCING ELECTRONIC PART OR RINSING LIQUID FOR PRODUCING ELECTRONIC PARTS

(71) Applicant: MUSASHINO CHEMICAL LABORATORY, LTD., Tokyo (JP)

(72) Inventors: Masakazu Tsukida, Kitaibaraki (JP); Hitoshi Takada, Tokyo (JP)

(73) Assignee: MUSASHINO CHEMICAL LABORATORY, LTD., Tokyo (JP)

( * ) Notice: Subject to any disclaimer, the term of this patent is extended or adjusted under 35 U.S.C. 154(b) by 242 days.

(21) Appl. No.: 15/743,043

(22) PCT Filed: Jun. 28, 2016

(86) PCT No.: PCT/JP2016/069059
§ 371 (c)(1),
(2) Date: Jan. 9, 2018

(87) PCT Pub. No.: WO2017/010277
PCT Pub. Date: Jan. 19, 2017

(65) Prior Publication Data
US 2019/0076833 A1 Mar. 14, 2019

(30) Foreign Application Priority Data
Jul. 10, 2015 (JP) .................................. 2015-138977

(51) Int. Cl.
*B01J 31/08* (2006.01)
*B01J 35/10* (2006.01)
(Continued)

(52) U.S. Cl.
CPC .............. *B01J 31/08* (2013.01); *B01J 35/10* (2013.01); *G03F 7/0048* (2013.01);
(Continued)

(58) Field of Classification Search
CPC .... G03F 7/0048; G03F 7/0382; G03F 7/0397; G03F 7/16; G03F 7/32; G03F 7/40; H01L 21/027; B01J 31/08; B01J 35/10
See application file for complete search history.

(56) References Cited

U.S. PATENT DOCUMENTS

2008/0274422 A1 11/2008 Masunaga et al.
2009/0127201 A1 5/2009 Kobayashi

FOREIGN PATENT DOCUMENTS

EP 3299423 A1 3/2018
JP 62-35838 A 2/1987
(Continued)

OTHER PUBLICATIONS

Machine translation of JP H10-159198A to Shimizu et al. (1998) (obtained from Google Patents Oct. 2019) (Year: 1998).*
(Continued)

*Primary Examiner* — Lucas A Stelling
(74) *Attorney, Agent, or Firm* — Westerman, Hattori, Daniels & Adrian, LLP

(57) ABSTRACT

A process for producing an organic acid ester-type liquid is disclosed which is a process for removing an organic peroxide contained in an organic acid ester-type liquid which is a solvent of a resist for producing electronic parts or an organic acid ester-type liquid which is a rinsing liquid for producing electronic parts, which comprises contacting the organic acid ester-type liquid with a platinum group metal catalyst to remove the organic peroxide in the organic acid ester-type liquid, and a resist solvent for producing electronic parts or a rinsing liquid for producing electronic parts which comprises an organic acid ester-type liquid in which an organic peroxide contained therein has been removed by using the producing process and a peroxide value (POV) thereof is 2 mmoL/kg or less.

17 Claims, 7 Drawing Sheets

(51) Int. Cl.

| | | |
|---|---|---|
| *G03F 7/004* | (2006.01) | |
| *G03F 7/038* | (2006.01) | |
| *G03F 7/039* | (2006.01) | |
| *G03F 7/16* | (2006.01) | |
| *G03F 7/32* | (2006.01) | |
| *G03F 7/40* | (2006.01) | |
| *H01L 21/027* | (2006.01) | |

(52) U.S. Cl.
CPC .......... *G03F 7/0382* (2013.01); *G03F 7/0397* (2013.01); *G03F 7/16* (2013.01); *G03F 7/32* (2013.01); *G03F 7/40* (2013.01); *H01L 21/027* (2013.01)

(56) References Cited

FOREIGN PATENT DOCUMENTS

| | | |
|---|---|---|
| JP | 64-13039 A | 1/1989 |
| JP | 3-114544 A | 5/1991 |
| JP | 6-248249 A | 9/1994 |
| JP | 6-248250 A | 9/1994 |
| JP | 7-501140 A | 2/1995 |
| JP | 8-252579 A | 10/1996 |
| JP | 9-213612 A | 8/1997 |
| JP | 10-158198 A | 6/1998 |
| JP | 2002-306976 A | 10/2002 |
| JP | 2008-276045 A | 11/2008 |
| JP | 2010-214320 A | 9/2010 |
| JP | 2010-214321 A | 9/2010 |
| JP | 2010-214322 A | 9/2010 |
| JP | 2010-240641 A | 10/2010 |
| JP | 2010-259989 A | 11/2010 |
| JP | 2011-36807 A | 2/2011 |
| JP | 2014-32407 A | 2/2014 |
| JP | 2014-71287 A | 4/2014 |
| JP | 2014-202807 A | 10/2014 |
| JP | 2015-127796 A | 7/2015 |
| WO | WO-2015080041 A1 * | 6/2015 |
| WO | 2016/104565 A1 | 6/2016 |

OTHER PUBLICATIONS

Machine translation of WO 2015/080041 to Enomoto et al. (Jun. 4, 2015) (obtained from Google Patents Oct. 2019) (Year: 2015).*

Notification of Reasons for Refusal (final) dated Apr. 3, 2018, issued in counterpart Japanese Application No. 2017-504442, with English machine translation. (6 pages).

Extended (supplementary) European Search Report dated Feb. 11, 2019, issued in counterpart European Application No. 16824257.6. (9 pages).

International Search Report dated Aug. 2, 2016, issued in counterpart International Application No. PCT/JP2016/069059 (4 pages).

Notification of Reasons for Refusal dated Nov. 28, 2017, issued in counterpart Japanese Patent Application No. 2017-504442, w/English translation (7 pages).

* cited by examiner

PROCESS FOR PRODUCING ORGANIC ACID ESTER-TYPE LIQUID, AND PROCESS FOR PRODUCING SOLVENT OF RESIST FOR PRODUCING ELECTRONIC PART OR RINSING LIQUID FOR PRODUCING ELECTRONIC PARTS

BACKGROUND OF THE INVENTION

Field of the Invention

The present invention relates to a process for removing an organic peroxide in an organic acid ester-type liquid, more specifically to a process for producing an organic acid ester-type liquid in which an organic peroxide contained in an organic liquid which is a solvent of the resist for producing electronic parts or the organic acid ester-type liquid which is a rinsing liquid for producing electronic parts by subjecting to a specific treatment.

Description of the Related Art

In the process for producing electronic parts such as an imaging tube, a display, an integrated circuit, a printed circuit board, a semiconductor chip, an orientation film, etc., fine processing is necessary, and at that time, image formation (patterning) is carried out by using various kinds of resists. In the image formation by the resist, a resist liquid is coated onto various kinds of substrates, patterning irradiation is carried out by an energy beam such as light, electromagnetic wave including an X-ray, etc.; particle beam including electron beam, etc.; and the like, then, after developing by a developing solution, a treatment of rinsing with a rinsing liquid, etc., is carried out, and the resist remained onto the substrate is removed.

The solvent in the above-mentioned resist liquid is generally an organic acid ester-type liquid (for example, Patent document 1), and a developing solution is generally an aqueous basic solution.

Also, the above-mentioned rinsing liquid may be an organic acid ester-type liquid, or an aqueous solution into which various water-soluble compounds or an organic liquid has been dissolved (for example, Patent documents 2 and 3).

Further, in the removal of the above-mentioned resist, there are a method in which no liquid is used such as ashing, etc., a method of using an aqueous solution into which a basic substance, etc., has been dissolved, and a method of using an organic acid ester-type liquid, etc., and among these, when a liquid is used, rinsing is thereafter carried out by using the organic acid ester-type liquid or a rinsing liquid comprising an aqueous solution, etc., in some cases (for example, Patent document 4).

With regard to water to be used in the course of producing an electronic part, it has been known that an inorganic peroxide such as hydrogen peroxide, etc., contained in water used mainly as a washing solution causes bad effects on the electronic part and, for example, in Patent documents 5 and 6, there are disclosed technical thought to remove hydrogen peroxide in water to be used for producing a semiconductor and the removing method.

However, as mentioned above, in the course of producing the electronic parts, various organic acid ester-type liquids are used depending on the procedural steps, and in the past, to remove the organic peroxide from the organic acid ester-type liquid has itself scarcely been known for that purpose, and an idea (thought) itself that the organic acid ester-type liquid from which the organic peroxide is bother to be removed is used for producing the electronic parts has hardly exist.

On the other hand, it has been known a method for removing the organic peroxide not for producing an electronic part, but for removing it from an organic liquid as an olefin-based compound product or an organic solvent to be used for a reaction (for example, Patent documents 7 to 10).

There is disclosed a method in Patent document 7 that an organic peroxide is removed from an olefin-based hydrocarbon which has been used in a reaction which does not like inclusion of an organic peroxide to produce a final product.

Moreover, there are disclosed methods in Patent documents 8 to 10 that an organic peroxide is used in an oxidation reaction or as a polymerization initiator, etc., and then, the organic peroxide is removed from an organic solvent into which the unreacted organic peroxide remains.

However, a level of removal of the organic peroxide from the organic liquid mentioned above was extremely bad (it was sufficient even when it was bad) since the objects thereof were not to inhibit the usual chemical reaction, or to prevent from explosion of a concentrated residue of the organic peroxide at the time of distillation after polymerization or reaction for reusing the solvent used therefor, etc., which was far poor from the level required for producing electronic parts.

On the other hand, various means to remove a peroxide from water or the organic liquid have been known, with regard to removal of hydrogen peroxide in water, and a method for removing hydrogen peroxide in water by using a palladium catalyst is disclosed in Patent document 5. There is also disclosed a method which removes hydrogen peroxide in water by using a carried catalyst in which a platinum group metal is carried onto a monolithic anion exchanger in Patent document 6.

Furthermore, with regard to removal of the organic peroxide from the organic liquid, there is disclosed a method for removing an organic peroxide in an olefin-based hydrocarbon by using a platinum-carried catalyst in Patent document 7, a method of removing an organic peroxide by using an ion exchange resin onto which an acid or an amine compound has been carried in Patent documents 8 and 9, and a method of removing an organic peroxide by using a platinum or palladium catalyst which is carried on a solid such as silica and activated charcoal, etc., in Patent document 10.

However, the techniques disclosed in the above-mentioned Patent document 5 to 10 are to remove hydrogen peroxide in water, or with regard to the methods of removing an organic peroxide from an organic liquid, the removal levels thereof are not sufficient for producing electronic parts, so that these techniques are insufficient for removing an organic peroxide in an organic acid ester-type liquid to be used for producing electronic parts, whereby these cannot be applied at all to this field of the art.

In recent years, precision has been increasingly demanded for electronic parts, but the above-mentioned conventional techniques are insufficient and there is room for further improvement.

On the other hand, the organic acid ester-type liquid generates an organic peroxide by reacting with an oxygen in the air. In particular, when the temperature is high as in the summer season, etc., increase in the peroxide value becomes remarkable. In order to reduce the increased peroxide value, a refining method by redistillation is common, which leads to a decrease in product yield and an increase in production cost.

Also for the same reason it is expected that a peroxide value will increase even during transportation. In particular, when export requires long distance transportation, increase thereof becomes remarkable. For this reason, it has been desired to develop a method for reducing the peroxide value before shipment, a method for suppressing increase in the peroxide value during transportation, and a method for reducing the increased peroxide value.

PRIOR ART DOCUMENT

Patent Documents

Patent document 1: JP 2014-032407A
Patent document 2: JP 2014-071287A
Patent document 3: JP 2014-202807A
Patent document 4: JP H09-213612A
Patent document 5: JP S62-035838A
Patent document 6: JP 2010-240641A
Patent document 7: JP H01-013039A
Patent document 8: JP H06-248249A
Patent document 9: JP H06-248250A
Patent document 10: JP H10-158198A

SUMMARY OF THE INVENTION

The present invention has been accomplished in view of the above-mentioned background art, and an object thereof is to provide a more excellent resist (liquid) and rinsing liquid which can be used in the respective processes for producing the electronic parts using a liquid(s) even when fine processing more than before is required.

The present inventor has intensively studied to solve the above-mentioned problems, and as a result, the inventor has found that the above-mentioned problems can be solved by more strictly removing an extremely minute amount of an organic peroxide contained in an organic acid ester-type liquid which is a solvent for a resist to be used in the process of producing electronic parts or an organic acid ester-type liquid which is a rinsing liquid to be used in the process of producing electronic parts to obtain an excellent material for the electronic parts, whereby the present invention has been accomplished.

That is, the present invention is to provide a process for producing an organic acid ester-type liquid, which is a process for removing an organic peroxide contained in an organic acid ester-type liquid which is a solvent of the resist for producing electronic parts or an organic acid ester-type liquid which is a rinsing liquid for producing electronic parts, the process comprises contacting the organic acid ester-type liquid with a platinum group metal catalyst to remove the organic peroxide in the organic acid ester-type liquid.

Also, the present invention is to provide the above-mentioned process for producing an organic acid ester-type liquid, wherein the organic acid ester-type liquid containing the organic peroxide is contacted with a carrier onto which the platinum group metal catalyst has been carried, and the carrier onto which the platinum group metal catalyst has been carried is a material in which the platinum group metal catalyst is carried onto an organic porous anion exchanger having a monolith structure.

Further, the present invention is to provide an organic peroxide-removed organic acid ester-type liquid which comprises an organic acid ester-type liquid which is a solvent of the resist for producing electronic parts or an organic acid ester-type liquid which is a rinsing liquid for producing electronic parts from which an organic peroxide is removed until a peroxide value (POV) becomes 2 mmoL/kg or less.

Moreover, the present invention is to provide an organic peroxide-removed organic acid ester-type liquid which comprises an organic acid ester-type liquid having a peroxide value (POV) of 100 mmoL/kg or less from which an organic peroxide is removed until a peroxide value (POV) becomes 2 mmoL/kg or less.

Furthermore, the present invention is to provide a process for producing a resist solvent for producing electronic parts or a rinsing liquid for producing electronic parts which comprises a process of removing an organic peroxide contained in an organic acid ester-type liquid which is a solvent of the resist for producing electronic parts or a rinsing liquid for producing electronic parts by using the above-mentioned process for producing an organic acid ester-type liquid.

Also, the present invention is to provide a resist solvent for producing electronic parts or a rinsing liquid for producing electronic parts which comprises the above-mentioned organic peroxide-removed organic acid ester-type liquid, which is used as a solvent of the resist for producing electronic parts or a rinsing liquid for producing electronic parts, and a peroxide value (POV) is 2 mmoL/kg or less.

Further, the present invention is to provide an organic peroxide-removed organic acid ester-type liquid which comprises an organic acid ester-type liquid an increased amount of the peroxide value (POV) with a lapse of time of which is 100 mmol/(kg·month) or less from which an organic peroxide is removed until the peroxide value (POV) becomes 2 mmol/(kg·month) or less.

Moreover, the present invention is to provide a method for reprocessing an organic acid ester-type liquid using the above-mentioned process for producing an organic acid ester-type liquid, which comprises contacting an organic acid ester-type liquid in which a peroxide value (POV) is increased during storage or transportation with a platinum group metal catalyst to remove an organic peroxide in the organic acid ester-type liquid.

According to the present invention, the above-mentioned problems and the above-mentioned tasks have been solved, and "a process for producing an organic acid ester-type liquid in which an organic peroxide has been removed" suitable for manufacturing electronic parts can be provided.

More specifically, for example, in the process of producing electronic parts such as an imaging tube, a display, integrated circuit (IC), a printed circuit board, etc., for example, a color filter resist for an imaging element such as a CCD image sensor, etc.; a color filter resist for a display such as a liquid crystal, a plasma, an organic EL, etc.; an electromagnetic wave (visible rays, ultraviolet rays, X rays, etc.) resist such as a photoresist for producing an integrated circuit (IC), etc.; a particle beam resist such as an electron beam, etc., for producing an integrated circuit (IC); a resist for producing a printed circuit board, etc., have been used. For example, when an organic peroxide is provisionally removed from the solvent of such "a resist for producing electronic parts" by using the process of the present invention, problems are difficultly generated in the (cross-sectional) shape of the respective resist patterns and a predetermined suitable shape such as a rectangular, etc., can be obtained.

More specifically, for example, in the case of a chemical amplification type negative resist or positive resist, even when the exposure conditions, the prebaking conditions, the elapsed time and the developing conditions, etc., were optimum, when the conventional organic liquid was used as a resist solvent, the side walls of the respective resist patterns after development tend to be in a drum shape (a central portion of a side wall is recessed), or in a barrel shape (a central portion of a side wall bulges); in the case of the negative resist, the corner of the ridge formed by the upper surface and the side surface became rounded, and in the case of the positive resist, there was a case that a bumpy appearance like an eave exceeded the side surface from the upper surface. In addition, in the case of the negative resist, there was a case that curing failure was considered to be caused.

Thus, when the process for producing an organic acid ester-type liquid of the present invention is used, the above-mentioned problems are solved or relieved.

The organic liquid obtained by using the process for producing an organic acid ester-type liquid of the present invention is, in particular, suitable as a solvent of the resist for producing electronic parts in a chemical amplification type.

Patterning (image formation) is carried out, in the chemical amplification type resist, by subjecting to "irradiation by an electromagnetic wave (visible rays, ultraviolet rays, X rays, etc.) or a particle beam (electron beam, etc.)" (in the following, the matter in the double quotation marks is sometimes simply referred to as exposure), a catalyst such as a radical, an acid, etc., is generated from a catalyst generator such as a photoacid generator, etc., only the portion at which the catalyst exists, by heating (prebaking, etc.) or with a lapse of time at room temperature (for example, 30° C.), etc., in the case of the positive resist, by cutting chemical bonds of "a compound having an unstable group to an acid", and in the case of the negative resist, by causing polymerization or crosslinking to the compound.

Therefore, only the exposed portion at which the catalyst is present changes with a catalytic amount of the catalyst alone, so that the presence of an extremely minor amount of impurities becomes, for example, a catalyst poison, whereby causing problems in the shape of individual resist patterns, and patterning failure is likely caused.

In the resist coating film after coating and drying the resist and before exposure or in the resist coating film after exposure and before development, it can be considered to exist a residual solvent of the resist or a solvent derived material of the resist, and accordingly, the organic peroxide in the remaining solvent also exists, which causes the above-mentioned problems.

Accordingly, the organic acid ester-type liquid obtained by using the process for removing the organic peroxide of the present invention is particularly suitable as a solvent of the chemical amplification type resist for producing electronic parts.

Also, when the conventional organic liquid is used as a rinsing liquid after development of the resist or as a rinsing liquid after peeling off the resist that has finished its role, the organic peroxide derived from the rinsing liquid is not remained on the substrate (for example, silicon wafer, etc.) which is a main body of the electronic parts.

Characteristic feature of the present invention resides in the thought itself that the organic peroxide contained in the organic acid ester-type liquid which is a solvent of a resist liquid for producing electronic parts or an organic acid ester-type liquid which is a rinsing liquid for producing electronic parts is to be removed prior to preparing the resist liquid or the rinsing liquid.

Further, when the organic peroxide is removed by the specific method, a good resist pattern can be obtained by further exerting the above-mentioned effects, and the organic peroxide is not remained onto the substrate as a main body after development of the resist or after rinsing which is subjected to after peeling off of the resist.

Moreover, if the organic peroxide in the above-mentioned organic acid ester-type liquid is removed preferably until a peroxide value (POV) becomes 2 mmol/kg or less, more preferably 1 mmol/kg or less, particularly preferably 0.5 mmol/kg or less, further preferably 0.3 mmol/kg or less, and most preferably 0.1 mmol/kg or less, when the organic acid ester-type liquid is used as a liquid for preparing the resist, a good resist pattern can be obtained by exerting the above-mentioned effects, and when it is used as a rinsing liquid after development of the resist or after rinsing which is subjected to after peeling off of the resist, the organic peroxide is not to be remained after the rinsing process so that no problem occurs in the final electronic parts.

Furthermore, if a peroxide is firstly removed from the organic acid ester-type liquid by the specific process of the present invention, thereafter, an increased width of the peroxide in the liquid is suppressed during the storage of the organic acid ester-type liquid.

That is, if the organic peroxide in the organic acid ester-type liquid is removed until a peroxide value (POV) of the organic acid ester-type liquid preferably becomes 2 mmol/kg or less, more preferably 1 mmol/kg or less, particularly preferably 0.5 mmol/kg or less, further preferably 0.3 mmol/kg or less, and most preferably 0.1 mmol/kg or less, stability with a lapse of time with regard to increase in the organic peroxide becomes good. That is, an increased amount (an increased amount of the peroxide value (POV) with a lapse of time) of the peroxide value (POV) with a lapse of time can be made 2 mmol/(kg·month) or less.

Also, even when the peroxide value (POV) is increased during the storage or transportation, an organic acid ester-type liquid which is a solvent of the resist for producing electronic parts or a rinsing liquid for producing electronic parts having a low peroxide value (POV) can be provided by lowering the peroxide value (POV) without lowering yield.

EMBODIMENTS TO CARRY OUT THE INVENTION

Figure 1:
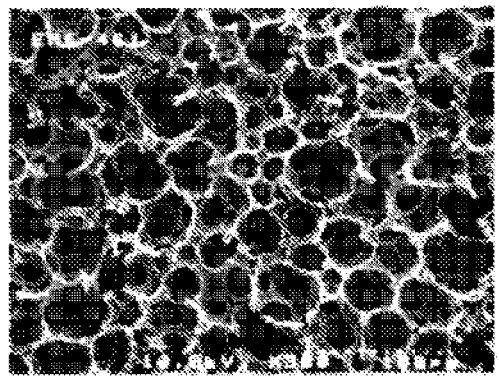
FIG. 1 is an SEM photograph of an example of the embodiment of the first monolith anion exchanger.

In the following, the present invention is explained, but the present invention is not limited by the following specific embodiments, and can be optionally changed within the range of the technical thought of the present invention.

The present invention is a process for removing an organic peroxide contained in an organic acid ester-type liquid which is a solvent of the resist for producing electronic parts or an organic acid ester-type liquid which is a rinsing liquid for producing electronic parts.

One of the characteristic features of the present invention resides in the thought that the organic peroxide is to be previously removed from the above-mentioned organic acid ester-type liquid, and the present invention has been done by confirming that the above-mentioned effects can be obtained if the organic peroxide is previously removed from the above-mentioned organic acid ester-type liquid.

The "electronic parts" in the present invention are not particularly limited as long as it is the electronic parts in which the presence of the organic peroxide has an adverse effect on the manufacturing process and/or the final product, more specifically, for example, it refers to active parts (elements) such as electron tubes and semiconductors, etc.; passive parts (elements) such as vibrators and piezoelectric elements, etc.; mechanical parts such as printed circuit boards and antennas, etc.; and the like.

Among these, whereas the objective electronic parts which exerts the effects of the present invention are not particularly limited to the following, for example, the electron tube may be mentioned a display such as a plasma display, a liquid crystal display, an organic EL display, etc.; an imaging tube; etc., and the semiconductor may be mentioned an integrated circuit (IC), a transistor, a diode; etc. The integrated circuit (IC) may be mentioned a large scale integrated circuit (LSI); a general-purpose memory such as a dynamic random access memory (DRAM), a static random access memory (SRAM), etc.; and the like. Also, the printed circuit board may be mentioned a hybrid integrated circuit, etc.

Fine processing is necessary, for example, in the process of manufacturing electronic parts such as an imaging tube, a display, an integrated circuit (IC), a printed circuit board, etc., and image formation (patterning) by various kinds of resists is performed. Such a resist may be mentioned, for example, a color filter resist for an imaging element such as a CCD image sensor, etc.; a color filter resist for a display such as a liquid crystal, a plasma, an organic EL, etc.; an electromagnetic wave (visible rays, ultraviolet rays, X rays, etc.) resist such as a photoresist for producing an integrated circuit (IC), etc.; a particle beam resist such as an electron beam, etc., for producing an integrated circuit (IC); a resist for producing a printed circuit board, etc.

In the image formation by these resists, a resist liquid is coated onto various kinds of substrates, "patterning irradiation by energy beam such as light, electromagnetic wave including X rays, etc.; particle beam including electron beam, etc.; and the like" (hereinafter simply referred to as "exposure") is carried out, then, after developing by a developing solution, a treatment of rinsing with a rinsing liquid, etc., is carried out, and the resist remained onto the substrate is peeled off and removed, thereafter, the peeling liquid is rinsed, if necessary.

The "process for producing an organic acid ester-type liquid" of the present invention is a production process of removing an organic peroxide from the organic acid ester-type liquid which is a solvent of the resist to be used for fine processing at the time of manufacturing electronic parts, and is a production process of removing an organic peroxide from the organic acid ester-type liquid which is a rinsing liquid for removing a developing solution after development or a rinsing liquid to remove the peeling liquid after peeling the remaining resist which has finished its role at the time of manufacturing electronic parts.

According to the present invention, if the organic peroxide is previously removed from the organic acid ester-type liquid which is a solvent of a resist, good resist pattern can be obtained after development as mentioned above. Also, according to the present invention, if the organic peroxide is previously removed from the organic acid ester-type liquid which is a rinsing liquid, remaining of the organic peroxide can be suppressed after rinsing as mentioned above.

The "process for producing an organic acid ester-type liquid" of the present invention is a process for removing the organic peroxide contained in the organic acid ester-type liquid, and comprises removing the organic peroxide in the organic liquid by contacting the organic acid ester-type liquid with a platinum group metal catalyst.

The platinum group metal catalyst may be mentioned a ruthenium catalyst, a rhodium catalyst, a palladium catalyst, an osmium catalyst, an iridium catalyst or a platinum catalyst. These may be used a single kind alone, or may be used two or more kinds in combination, and further, two or more kinds of metals may be used as an alloy. Among these, in the point that the effect of removing the organic peroxide is high, a palladium catalyst, a platinum catalyst, and a platinum/palladium alloy catalyst, etc., are preferred, and a palladium catalyst is particularly preferred in the same point.

It is preferred that the above-mentioned platinum group metal catalyst is carried on a carrier, and the organic acid ester-type liquid is contacted therewith. That is, the "production process of the organic peroxide-removed organic acid ester-type liquid" of the present invention is preferred that the organic peroxide is removed by contacting the above-mentioned organic acid ester-type liquid with a carrier onto which the platinum group metal catalyst has been carried.

The carrier is not particularly limited as long as it can suitably carry the above-mentioned platinum group metal catalyst to exert the effect of removing the organic peroxide by the platinum group metal catalyst, and more specifically, there may be mentioned, for example, an inorganic carrier such as silica, alumina, talc, zeolite, calcium silicate, diatomaceous earth, allophane, pearlite, etc.; and an organic carrier such as activated charcoal, hydrocarbon, a synthetic resin, etc.

The above-mentioned "synthetic resin" may be preferably mentioned an ion exchange resin, a crosslinked resin having fine pores, etc.

The above-mentioned ion exchange resin is not particularly limited, and particularly preferably an anion exchange resin such as a strongly basic anion exchange resin and a weakly basic anion exchange resin, etc., for removing the organic peroxide with good efficiency. Also, the "crosslinked resin having fine pores" is not a material comprising closed cells or "non-penetrating hole" alone, but a crosslinked resin having through holes can be mentioned as a preferred material. Here, the "crosslinked resin" refers to a resin which is crosslinked and the resin components of which are substantially not dissolved in the organic liquid.

Furthermore, as the "crosslinked resin having through holes", a crosslinked resin having a monolith structure may be mentioned as the particularly preferred material. Here, the "monolith structure" refers to a structure having fine continuous through holes.

More preferred embodiment of the present invention is the above-mentioned process for removing the organic peroxide, wherein the above-mentioned carrier is a strongly basic anion exchanger having a monolith structure.

In the carrier in the present invention, a material in which a platinum group metal catalyst is carried onto an anion exchanger having a monolith structure has high ability to remove the organic peroxide from the organic acid ester-type liquid. That is, a particularly preferred embodiment of the process for removing the organic peroxide is a process wherein the organic acid ester-type liquid is contacted with the "carrier in which the platinum group metal catalyst is carried onto the anion exchanger having a monolith structure".

In the following, the "carrier in which the platinum group metal catalyst is carried onto an organic porous anion exchanger having a monolith structure" is explained.

The "organic porous anion exchanger having a monolith structure" in the present invention includes those described as the "first monolith anion exchanger", the "second monolith anion exchanger", the "third monolith anion exchanger" and the "fourth monolith anion exchanger" at the paragraph numbers from [0164] to [0260] of JP 2010-240641A and those described in Examples of JP 2010-240641A, and those described in Japanese Journal of Polymer Science and Technology, Vol., 62, No. 1, pp. 7-16 (2005).

The "carrier in which the platinum group metal catalyst is carried onto the organic porous anion exchanger having a monolith structure" in the present invention includes those described at the paragraph numbers from [0261] to [0267] of JP 2010-240641A, and those described in Japanese Journal of Polymer Science and Technology, Vol. 68, No. 5, pp. 320-325 (2011).

In the "carrier in which the platinum group metal catalyst is carried onto the organic porous anion exchanger having a monolith structure" in the present invention, the "organic porous anion exchanger having a monolith structure" is a material which can be obtained by introducing the anion exchange group into a monolithic structural body.

In the present specification, the "organic porous body having a monolith structure" is sometimes simply abbreviated to as "monolith". Also, the "organic porous anion exchanger having a monolith structure" is sometimes simply abbreviated to as the "anion exchanger having a monolith structure" or the "monolith anion exchanger".

In the following, the preparation method of the preferred "carrier in which the platinum group metal catalyst is carried onto the anion exchanger having a monolith structure (the monolith anion exchanger)" and an example of the constitution are shown while the present invention is not limited by these.

The process for producing an organic acid ester-type liquid of the present invention is preferably the above-mentioned process for producing an organic acid ester-type liquid, wherein the above-mentioned platinum group metal catalyst is a platinum group metal-carried catalyst in which nanoparticles of a platinum group metal having an average particle size of 1 to 100 nm are carried onto the organic porous anion exchanger having a monolith structure, the organic porous anion exchanger having a monolith structure comprises a continuous skeletal phase and a continuous porous phase, a thickness of the continuous skeleton is 1 to 100 μm, an average diameter of the continuous pore is 1 to 1,000 μm, a total pore volume is 0.5 to 50 mL/g, an ion exchange capacity per a weight in a dry state is 0.5 to 6 mg equivalent/g, ion exchange groups are uniformly distributed in the organic porous anion exchanger having a monolith structure, and a carried amount of the platinum group metal is 0.004 to 20% by mass in a dry state.

The "anion exchanger having a monolith structure (the monolith anion exchanger)" in the present invention is particularly preferably the following first to the sixth monolith anion exchanger.

In the following, the first to the sixth monolith anion exchangers, and a carrier on which a platinum group metal catalyst is carried are explained.

<Explanation of First Monolith Anion Exchanger>

The first monolith anion exchanger is characterized in that a material having a continuous cell structure which has common openings (mesopores) having an average diameter of 1 to 1,000 μm in the walls of the macropores are interconnected to each other, a total pore volume is 1 to 50 mL/g, an ion exchange capacity per a weight is 0.5 to 6 mg equivalent/g in a dry state, and ion exchange groups are uniformly distributed in the organic porous anion exchanger having a monolith structure.

In FIG. 1, a SEM photograph of an example of the embodiment of the first monolith anion exchanger is shown.

The first monolith anion exchanger is a continuous macropore structural body in which bubble-like macropores are overlapped with each other, the overlapped portions are common openings (mesopores) having an average diameter of 1 to 1,000 μm, preferably 10 to 200 μm, particularly preferably 20 to 100 μm in a dry state, and almost all the part is an open pore structure. In the open pore structure, when a liquid flows, the inside of the bubbles formed by the macropore and the mesopore becomes a flow passage. The overlap between the macropores and the macropores is 1 to 12 for one macropore, and 3 to 10 for many macropores. The average diameter of the mesopores of the first monolith anion exchanger is larger than the average diameter of the mesopores of the monolith since the entire monolith swells when the anion exchange groups are introduced into the monolith.

If the average diameter of the mesopore in a dry state is less than 1 μm, the pressure loss at the time of liquid flow becomes remarkably large, while if the average diameter of the mesopore in a dry state exceeds 1,000 μm, the contact between the liquid to be treated and the monolith anion exchanger becomes insufficient and the removal characteristic of the organic peroxide is lowered.

By making the structure of the monolith anion exchanger a continuous cell structure as mentioned above, the macropore group and the mesopore group can be formed uniformly, as well as the pore volume and the specific surface area can be made markedly large as compared with a particle aggregation type porous body as disclosed in JP H8-252573A.

Incidentally, the average diameter of the openings of the monolith in a dry state and the average diameter of the openings of the first monolith anion exchanger in a dry state are values measured by the mercury penetration method. Also, the average diameter of the openings of the first monolith anion exchanger in a wet state is a value calculated by multiplying the average diameter of the openings of the first monolith anion exchanger in a dry state by the swelling ratio.

More specifically, when the diameter of the first monolith anion exchanger in a wet state was x1 (mm), the diameter of the first monolith anion exchanger in a dry state obtained by drying the first monolith anion exchanger in a wet state was y1 (mm), and the average diameter of the openings of the first monolith anion exchanger in a dry state measured by the mercury penetration method was z1 (μm), the average diameter (μm) of the openings of the first monolith anion exchanger in a wet state can be calculated by the following formula: the "average diameter (μm) of the openings of the first monolith anion exchanger in a wet state=z1×(x1/y1)".

When the average diameter of the openings of the monolith in a dry state before introducing the anion exchange groups, and the swelling ratio of the first monolith anion exchanger in a wet state to the monolith in a dry state to which the anion exchange groups had been introduced into the monolith in a dry state are known, it is also possible to calculate the average diameter of the openings of the first monolith anion exchanger in a wet state by multiplying the average diameter of the openings of the monolith in a dry state by the swelling ratio.

The total pore volume of the first monolith anion exchanger according to the present invention is 1 to 50 mL/g, suitably 2 to 30 mL/g. If the total pore volume is less than 1 mL/g, the pressure loss at the time of liquid flow becomes large, further an amount of the permeated liquid per a unit cross-sectional area decreases and the treatment capacity is lowered. On the other hand, if the total pore volume exceeds 50 mL/g, mechanical strength is lowered, the monolith anion exchanger is largely deformed particularly when the liquid is flown at a high flow rate. Further, contact efficiency of the liquid to be treated with the monolith anion exchanger and the platinum group metal nanoparticles carried thereon is lowered, so that the catalytic effect is also lowered.

The total pore volume is at most 0.1 to 0.9 mL/g in the conventional particulate porous ion exchange resin, so that a high pore volume of 1 to 50 mL/g and a high specific surface area exceeding and never seen in the conventional ones can be used. In the present invention, the total pore volume of the first monolith anion exchanger is a value measured by the mercury penetration method. The total pore volume of the first monolith anion exchanger is the same in both of a dry state and a wet state.

The anion exchange capacity per a mass in a dry state of the first monolith anion exchanger according to the present invention is preferably 0.5 to 6.0 mg equivalent/g. If the anion exchange capacity per a mass in a dry state is less than 0.5 mg equivalent/g, a carried amount of the platinum group metal nanoparticles is lowered, whereby hydrogen peroxide decomposition characteristics or dissolved oxygen removal characteristics is lowered. On the other hand, if the anion exchange capacity per a mass in a dry state exceeds 6.0 mg equivalent/g, the volume change of the swelling and shrinkage of the monolith anion exchanger due to the change of the ionic form becomes remarkably large, and in some cases, cracks and crushing occur in the monolith anion exchanger.

The anion exchange capacity per a volume in a wet state of the first monolith anion exchanger according to the present invention is not particularly limited, and in general it is 0.05 to 0.5 mg equivalent/mL. An ion exchange capacity of the porous body into which the ion exchange groups have been introduced only the surface cannot be determined universally depending on the kind of the porous body or the ion exchange group, and it is at most 500 μg equivalent/g.

In the first monolith anion exchanger according to the present invention, the material constituting the skeleton of the continuous macropore structural body is an organic polymer material having a crosslinking structure. A crosslinking density of the polymer material is not particularly limited, and the crosslinking structure unit is preferably contained in an amount of 0.3 to 10 mol %, suitably 0.3 to 5 mol % of based on the whole constitutional units constituting the polymer material.

If the crosslinking structure unit is less than 0.3 mol %, it is not preferred since mechanical strength is insufficient, on the other hand, if it exceeds 10 mol %, it is not preferred since there is a case where introduction of the anion exchange groups becomes difficult.

The kind of the polymer material is not particularly limited, and may be mentioned, for example, a crosslinked polymer including an aromatic vinyl polymer such as polystyrene, poly(α-methylstyrene), poly(vinyl toluene), poly(vinylbenzyl chloride), poly(vinyl biphenyl), poly(vinyl naphthalene), etc.; a polyolefin such as polyethylene, polypropylene, etc.; a halogenated polyolefin such as poly(vinyl chloride), polytetrafluoroethylene, etc.; a nitrile-based polymer such as polyacrylonitrile, etc.; a (meth)acryl-based polymer such as poly(methyl methacrylate), poly(glycidyl methacrylate), poly(ethyl acrylate), etc. The above-mentioned polymer may be a polymer obtained by copolymerizing a single vinyl monomer and a crosslinking agent, or may be a polymer obtained by polymerizing a plural number of vinyl monomers and a cross linking agent, and may be a material in which two or more kinds of polymers are blended.

Among these organic polymer materials, a crosslinked polymer of an aromatic vinyl polymer is preferred in the points of easiness in forming the continuous macropore structure, easiness in introducing the anion exchange group and high mechanical strength, and high stability to an acid or an alkali, and in particular, a styrene-divinylbenzene copolymer and a vinylbenzyl chloride-divinylbenzene copolymer may be mentioned as a preferred material.

The anion exchange group of the first monolith anion exchanger according to the present invention may be mentioned a quaternary ammonium group such as a trimethyl ammonium group, a triethyl ammonium group, a tributyl ammonium group, a dimethylhydroxyethyl ammonium group, a dimethylhydroxypropyl ammonium group, a methyldihydroxyethyl ammonium group, etc., a tertiary sulfonium group and a phosphonium group, etc.

In the first monolith anion exchanger according to the present invention, the introduced anion exchange groups are uniformly distributed not only at the surface of the porous body but also at the inside of the skeleton of the porous body. The "anion exchange groups are uniformly distributed" herein mentioned means that distribution of the anion exchange group is uniform at least a μm order at the surface and the inside of the skeleton. The distributed state of the anion exchange groups can be relatively easily confirmed by using EPMA after ion-exchanging the counter anion with a chloride ion or a bromide ion, etc. When the anion exchange groups are uniformly distributed not only at the surface of the monolith but also at the inside of the skeleton of the porous body, the physical properties and the chemical properties at the surface and at the inside can be made uniform, so that durability against swelling and shrinkage is improved.

(Process for Producing First Monolith Anion Exchanger)

A process for producing the first monolith anion exchanger according to the present invention is not particularly limited, and may be mentioned a method in which a component containing the anion exchange group is made a monolith anion exchanger with one step, a method in which a monolith is formed by a component containing no anion exchange group, thereafter, the anion exchange groups are introduced thereinto, etc. Among these methods, the method in which a monolith is formed by a component containing no anion exchange group, thereafter, the anion exchange groups are introduced thereinto is preferred since the porous structure of the monolith anion exchanger can be easily controlled and it is possible to introduce the anion exchange group quantitatively.

An example of the producing process in accordance with the method described in JP 2002-306976A is shown in the following. That is, the first monolith anion exchanger can be produced by mixing an oil-soluble monomer containing no anion exchange group, a surfactant, water and, if necessary, a polymerization initiator to obtain a water droplets in oil type emulsion, the emulsion is polymerized to form a porous body, thereafter, the anion exchange groups are introduced thereinto.

The oil-soluble monomer containing no anion exchange group refers to a lipophilic monomer containing no anion exchange group such as a quaternary ammonium group, etc., and having low solubility in water. Specific examples of these monomers may be mentioned styrene, α-methylstyrene, vinyl toluene, vinylbenzyl chloride, divinylbenzene, ethylene, propylene, isobutene, butadiene, isoprene, chloroprene, vinyl chloride, vinyl bromide, vinylidene chloride, tetrafluoroethylene, acrylonitrile, methacrylonitrile, vinyl acetate, methyl acrylate, ethyl acrylate, butyl acrylate, 2-ethylhexyl acrylate, trimethylolpropane triacrylate, butanediol diacrylate, methyl methacrylate, ethyl methacrylate, propyl methacrylate, butyl methacrylate, 2-ethylhexyl methacrylate, cyclohexyl methacrylate, benzyl methacrylate, glycidyl methacrylate, ethylene glycol dimethacrylate, etc. These monomers may be used a single kind alone or two or more kinds in combination.

In the present invention, it is preferred to select a crosslinking monomer such as divinylbenzene, ethylene glycol dimethacrylate, etc., as at least one component of an oil-soluble monomer, and a content thereof is made 0.3 to 10 mol %, suitably 0.3 to 5 mol % in the whole oil-soluble monomers, in the points that the anion exchange group can be quantitatively introduced in the later process and practically sufficient mechanical strength can be secured.

The surfactant is not particularly limited as long as it can form a water droplets in oil type (W/O) emulsion when an oil-soluble monomer containing no anion exchange group and water are mixed, and may be used a nonionic surfactant such as sorbitan monooleate, sorbitan monolaurate, sorbitan monopalmitate, sorbitan monostearate, sorbitan trioleate, polyoxyethylene nonylphenyl ether, polyoxyethylene stearyl ether, polyoxyethylenesorbitan monooleate, etc.; an anionic surfactant such as potassium oleate, sodium dodecylbenzenesulfonate, dioctyl sodium sulfosuccinate, etc.; a cationic surfactant such as distearyl dimethyl ammonium chloride, etc.; an amphoteric surfactant such as lauryl dimethyl betaine, etc. These surfactants may be used a single kind alone or two or more kinds in combination. The water droplets in oil type emulsion refers to an emulsion in which the oil phase is a continuous phase and water droplets are dispersed therein.

An amount of the above-mentioned surfactant to be added cannot be unconditionally determined since it largely varies depending on the kind of the oil-soluble monomer and the size of the objective emulsion particles (macropores), and can be selected in the range of about 2 to 70% based on the total amount of the oil-soluble monomer and the surfactant. Also, it is not essential, but for control the shape and the size of bubbles of the porous body, an alcohol such as methanol, stearyl alcohol, etc.; a carboxylic acid such as stearic acid, etc.; a hydrocarbon such as octane, dodecane, toluene, etc.; a cyclic ether such as tetrahydrofuran, dioxane, etc., may be co-presented in the system.

As the polymerization initiator which may be used depending on necessity at the time of forming the porous body, a compound generating a radial(s) by heat and photoirradiation is suitably used. The polymerization initiator may be water soluble or oil-soluble, and may be mentioned, for example, 2,2'-azobis(isobutyronitrile), 2,2'-azobis(2,4-dimethylvaleronitrile), 2,2'-azobis(2-methylbutyronitrile), 2,2'-azobis(4-methoxy-2,4-dimethylvaleronitrile), dimethyl 2,2'-azobisisobutyrate, 4,4'-azobis(4-cyanovaleric acid), 1,1'-azobis(cyclohexane-1-carbonitrile), benzoyl peroxide, lauroyl peroxide, potassium persulfate, ammonium persulfate, tetramethylthiuram disulfide, etc., azobisisobutyronitrile, azobisdimethylvaleronitrile, azobiscyclohexanenitrile, azobiscyclohexanecarbonitrile, benzoyl peroxide, potassium persulfate, ammonium persulfate, hydrogen peroxide-ferrous chloride, sodium persulfate-acidic sodium sulfite, tetramethylthiuram disulfide, etc. However, polymerization may proceed only by heating or light irradiation without adding a polymerization initiator in some cases, so that addition of a polymerization initiator is not necessary in such a system.

The mixing method at the time of mixing an oil-soluble monomer containing no anion exchange group, a surfactant, water and a polymerization initiator to form a water droplets in oil type emulsion is not particularly limited, and there may be used a method in which the respective components are mixed all at once, oil-soluble monomer, a method in which oil-soluble components such as an oil-soluble monomer(s), a surfactant and an oil-soluble polymerization initiator, and water soluble components such as water and a water soluble polymerization initiator are separately dissolved uniformly, and then, the respective components are mixed, etc.

A mixing device for forming the emulsion is also not particularly limited, and a usual mixer, a homogenizer, a high pressure homogenizer, and a so-called planetary type stirring device in which a material(s) to be treated is/are charged in a mixing apparatus, and the mixing apparatus is rotated while revolving around the revolving axis in an inclined state to stir and mix the material(s) to be treated, may be used, and an appropriate device may be selected for obtaining an objective emulsion particle size.

The mixing conditions are not particularly limited, and a rotation speed of stirring and a stirring time which are capable of obtaining an objective emulsion particle size can be arbitrarily set. Among these mixing apparatuses, the planetary type stirring device can uniformly form water droplets in the W/O emulsion, and the average diameter can be arbitrarily set within a wide range, so that it is preferably used.

The polymerization conditions for polymerizing the thus obtained water droplets in oil type emulsion may be selected various conditions depending on the kind of the monomer(s) and a type of the initiator. For example, when azobisisobutyronitrile, benzoyl peroxide, potassium persulfate, etc., is used as a polymerization initiator, polymerization under heating may be carried out in a sealed apparatus under inert atmosphere at 30 to 100° C. for 1 to 48 hours, and when hydrogen peroxide-ferrous chloride, sodium persulfate-acidic sodium sulfite, etc., is/are used as an initiator(s), polymerization may be carried out in a sealed apparatus under inert atmosphere at 0 to 30° C. for 1 to 48 hours. After completion of the polymerization, the product is taken out, subjected to Soxhlet extraction by a solvent such as isopropanol, etc., and unreacted monomer and residual surfactant are removed to obtain a monolith.

<Explanation of Second Monolith Anion Exchanger>

The second monolith anion exchanger is characterized in that organic polymer particles having an average particle size of 1 to 50 μm are agglomerated to form a three-dimensionally continuous skeletal portion, three-dimensionally continuous pores having an average diameter of 20 to 100 μm are present between the skeletons, a total pore volume is 1 to 10 mL/g, an ion exchange capacity per a weight in a dry state is 0.5 to 6 mg equivalent/g, and ion exchange groups are uniformly distributed in the organic porous anion exchanger having a monolith structure.

Figure 2:
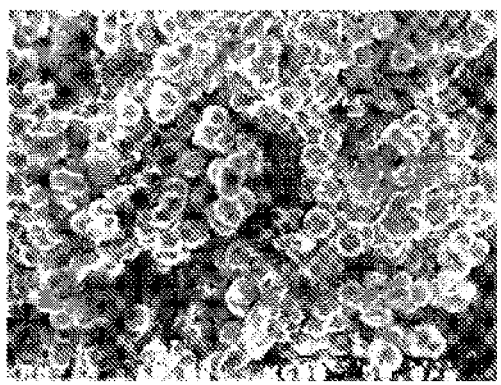
FIG. 2 is an SEM photograph of an example of the embodiment of the second monolith anion exchanger.

In FIG. 2, a SEM photograph of an example of the embodiment of the second monolith anion exchanger is shown.

The basic structure of the second monolith anion exchanger is a particle agglomerated type structure in which organic polymer particles having a crosslinking structure unit and an average particle size in a wet state of 1 to 50 μm, preferably 1 to 30 μm are agglomerated to form a three-dimensionally continuous skeletal portion, and three-dimensionally continuous pores having an average diameter in a wet state of 20 to 100 μm, preferably 20 to 90 μm are present between the skeletons, and the three-dimensionally continuous pores become flow passages of a liquid or a gas.

If the average particle size of the organic polymer particles in a wet state is less than 1 μm, it is not preferred since the average diameter in a wet state of the continuous pores between the skeletons becomes small as less than 20 μm, while if it exceeds 50 μm, it is not preferred since contact between the organic liquid and the monolith anion exchanger becomes insufficient, and as a result, the organic peroxide removal effect is lowered. Also, if the average diameter in a wet state of the three-dimensionally continuous pores existing between the skeletons is less than 20 μm, it is not preferred since pressure loss when the organic liquid is permeated becomes large, on the other hand, if it exceeds 100 μm, it is not preferred since contact between the organic liquid and the monolith anion exchanger becomes insufficient, and the organic peroxide removal characteristics are lowered.

The average particle size of the organic polymer particles of the second monolith anion exchanger in a wet state can be simply and easily measured by using the SEM. More specifically, first, a SEM photograph of the cross-section at the optionally extracted portion of the second monolith anion exchanger in a dry state is photographed, the diameters of the whole particles of the organic polymer particles in the SEM photograph were measured, and the average particle size of the organic polymer particles in the second monolith anion exchanger in a dry state is measured. Then, the average particle size of the organic polymer particles in the second monolith anion exchanger in a wet state is calculated by multiplying the obtained average particle size of the organic polymer particles in a dry state by the swelling ratio.

For example, when the diameter of the second monolith anion exchanger in a wet state was x1 (mm), the diameter of the second monolith anion exchanger in a dry state obtained by drying the second monolith anion exchanger in a wet state was y1 (mm), and an SEM photograph of the cross-section of the second monolith anion exchanger in a dry state is photographed, and the average particle size when the diameter of the whole particles of the organic polymer particles in the SEM photograph was measured was z1 (μm), the average particle size of the organic polymer particles (μm) in the second monolith anion exchanger in a wet state can be calculated by the following formula: the "average particle size (μm) of the organic polymer particles in the second monolith anion exchanger in a wet state=$z1 \times (x1/y1)$".

When the average particle size of the organic polymer particles in the monolith in a dry state before introducing the anion exchange groups, and a swelling ratio of the second monolith anion exchanger in a wet state to the monolith in a dry state in which the anion exchange groups are introduced into the monolith in a dry state are known, the average particle size of the organic polymer particles in the second monolith anion exchanger in a wet state can be calculated by multiplying the average particle size of the organic polymer particles in the monolith in a dry state by the swelling ratio.

The total pore volume of the second monolith anion exchanger according to the present invention is 1 to 10 mL/g. If the total pore volume is less than 1 mL/g, it is not preferred since the pressure loss at the time of liquid flow becomes large, and further it is not preferred since an amount of the permeated liquid per a unit cross-sectional area becomes small and the treatment capacity is lowered. On the other hand, if the total pore volume exceeds 10 mL/g, it is not preferred since the ion exchange capacity per a volume of the second monolith anion exchanger is lowered and a carried amount of the platinum group metal per a volume is lowered.

In the present invention, the total pore volume of the monolith (the second monolith anion exchanger) can be obtained by the mercury penetration method. Also, the total pore volume of the monolith (the second monolith anion exchanger) is the same in both of a dry state and a wet state.

In the second monolith anion exchanger according to the present invention, the material of the three-dimensionally continuous skeletal portion by agglomerating the organic polymer particles is an organic polymer material having a crosslinking structure unit. That is, the organic polymer material has a constitutional unit comprising the vinyl monomer(s) and a crosslinking agent constitutional unit having two or more vinyl groups in the molecule, and the polymer material contains 1 to 5 mol %, preferably 1 to 4 mol % of the crosslinking structure unit based on the whole constitutional unit constituting the polymer material. If the crosslinking structure unit is less than 1 mol %, it is not preferred since mechanical strength is insufficient, and on the other hand, if it exceeds 5 mol %, it is not preferred since the diameter of the pores continuously present three-dimensionally between the above-mentioned skeletons becomes small and the pressure loss becomes large. A kind of the polymer material is not particularly limited and, for example, it is the same as the polymer material constituting the first monolith, so that its explanation is omitted.

In the second monolith anion exchanger, the anion exchange capacity per a volume in a wet state is not particularly limited, and it is generally 0.2 to 1.0 mg equivalent/mL. The second monolith anion exchanger according to the present invention can remarkably increase the anion exchange capacity per a volume while keeping the pressure loss low. If the ion exchange capacity per a volume is less than 0.2 mg equivalent/mL, it is not preferred since a carried amount of the platinum group metal nanoparticles per a volume is lowered. On the other hand, if the anion exchange capacity per a volume exceeds 1.0 mg equivalent/mL, it is not preferred since the volume change of the swelling and shrinkage of the second monolith anion exchanger due to the change of the ionic form becomes remarkably large, and in some cases, cracks and crushing occur in the second monolith anion exchanger.

The anion exchange capacity per a dry mass of the second monolith anion exchanger is not particularly limited, but the anion exchange groups are uniformly introduced into the surface and the inside of the skeleton of the porous body so that it shows a value of 3 to 6 mg equivalent/g. The ion exchange capacity or the porous body into which the ion exchange groups are introduced only at the surface is at most 500 µg equivalent/g although it cannot be unconditionally determined depending on the kind of the porous body or the ion exchange group.

The vinyl monomer and the oil-soluble monomer to be used in the production of the second monolith anion exchanger are the same as the oil-soluble monomer used in the production of the first monolith anion exchanger, so that their explanations are omitted.

The crosslinking agent in the production of the second monolith anion exchanger is the same as the crosslinking agent used in the production of the first monolith anion exchanger, so that its explanation is omitted. An amount of the crosslinking agent to be used based on the total amount of the vinyl monomer and the crosslinking agent ({crosslinking agent/(vinyl monomer+crosslinking agent)}×100) is 1 to 5 mol %, preferably 1 to 4 mol %. The used amount of crosslinking agent greatly affects the porous structure of the resulting monolith, if the used amount of the crosslinking agent exceeds 5 mol %, it is not preferred since the size of the continuous pores formed between the skeletons becomes small. On the other hand, if the used amount of the crosslinking agent is less than 1 mol %, it is not preferred since mechanical strength of the porous body is insufficient and it is greatly deformed at the time of passing the liquid or the porous body is destroyed.

The organic solvent to be used in the present invention is an organic solvent which dissolves the vinyl monomer or the crosslinking agent but does not dissolve the polymer formed by polymerization of the vinyl monomer, in other words, it is a poor solvent to the polymer formed by polymerization of the vinyl monomer. The organic solvent greatly varies depending on the kind of the vinyl monomer so that it is difficult to enumerate the general specific examples and, for example, when the vinyl monomer is styrene, the organic solvent may be mentioned an alcohol such as methanol, ethanol, propanol, butanol, hexanol, cyclohexanol, octanol, 2-ethylhexanol, decanol, dodecanol, ethylene glycol, tetramethylene glycol, glycerol, etc.; a linear ether such as diethyl ether, ethylene glycol dimethyl ether, etc.; and a linear saturated hydrocarbon such as hexane, octane, decane, dodecane, etc.

Among these, an alcohol is preferred since the particle aggregation structure is easily formed by static polymerization and the three-dimensionally continuous pores become large. Also, even when it is a good solvent for the polystyrene such as benzene and toluene, it is used with the above-mentioned poor solvent, and when the amount to be used is a little, it is used as an organic solvent.

The polymerization initiator to be used for the production of the second monolith is the same as the polymerization initiator to be used for the production of the first monolith anion exchanger, so that its explanation is omitted. An amount of the polymerization initiator to be used greatly varies depending on the kind of the monomer or the polymerization temperature, etc., and the used amount of the polymerization initiator based on the total amount of the vinyl monomer and the crosslinking agent ({polymerization initiator/(vinyl monomer+crosslinking agent)}×100) is about 0.01 to 5 mol %.

In the process for producing the second monolith, when the polymerization is carried out under the conditions that the polymerization of the vinyl monomer dissolved in the organic solvent proceeds rapidly, the organic polymer particles having an average particle size close to 1 µm precipitate and aggregate to form a three-dimensionally continuous skeletal portion. The conditions under which the polymerization of the vinyl monomer proceeds rapidly vary depending on the vinyl monomer, the crosslinking agent, the polymerization initiator and the polymerization temperature, etc., which cannot be determined unconditionally, and may be mentioned to increase an amount of the crosslinking agent, to heighten the monomer concentration, or to heighten the temperature, etc. In consideration of such polymerization conditions, the polymerization conditions which agglomerate the organic polymer particles having an average particle size of 1 to 50 µm may be appropriately determined.

Further, for forming the three-dimensionally continuous pores having an average diameter of 20 to 100 µm between the skeletons, an amount of the crosslinking agent to be used based on the total amount of the vinyl monomer and the crosslinking agent is made a specific amount as mentioned above. Moreover, for making the total pore volume of the monolith 0.5 to 10 mL/g, the conditions vary depending on the vinyl monomer, the crosslinking agent, the polymerization initiator and the polymerization temperature, etc., which cannot be determined unconditionally, and the polymerization may be generally carried out with the condition that an amount of the organic solvent to be used based on the total amount of the organic solvent, the monomer and the crosslinking agent to be used ({organic solvent/(organic solvent+monomer+crosslinking agent)}×100) is 30 to 80% by mass, suitably 40 to 70% by mass.

As the polymerization conditions, various conditions can be selected depending on the kind of the monomers and the kind of the initiators. For example, when 2,2'-azobis-(isobutyronitrile), 2,2'-azobis(2,4-dimethylvaleronitrile), benzoyl peroxide, lauroyl peroxide, potassium persulfate, etc., is used as the initiator, the polymerization may be carried out under heating in a sealed apparatus under inert atmosphere at 30 to 100° C. for 1 to 48 hours. After completion of the polymerization, the product is taken out, and extracted with a solvent such as acetone, etc., for the purpose of removing the unreacted vinyl monomer and the organic solvent to obtain a monolith.

<Explanation of Third Monolith Anion Exchanger>

The third monolith anion exchanger is a co-continuous structural body comprising three-dimensionally continuous skeletons having an average thickness of 1 to 60 µm which comprises an aromatic vinyl polymer containing 0.3 to 5.0 mol % of the crosslinking structure unit based on the whole constitutional units into which the ion exchange groups have been introduced and three-dimensionally continuous pores having an average diameter of 10 to 200 µm between the skeletons, in which a total pore volume is 0.5 to 10 mL/g, an ion exchange capacity per a weight in a dry state is 0.5 to 6 mg equivalent/g, and ion exchange groups are uniformly distributed in the organic porous anion exchanger having a monolith structure.

Figure 3:
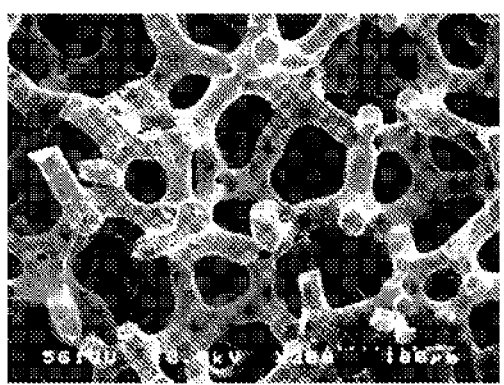
FIG. 3 is an SEM photograph of an example of the embodiment of the third monolith anion exchanger.
Figure 4:
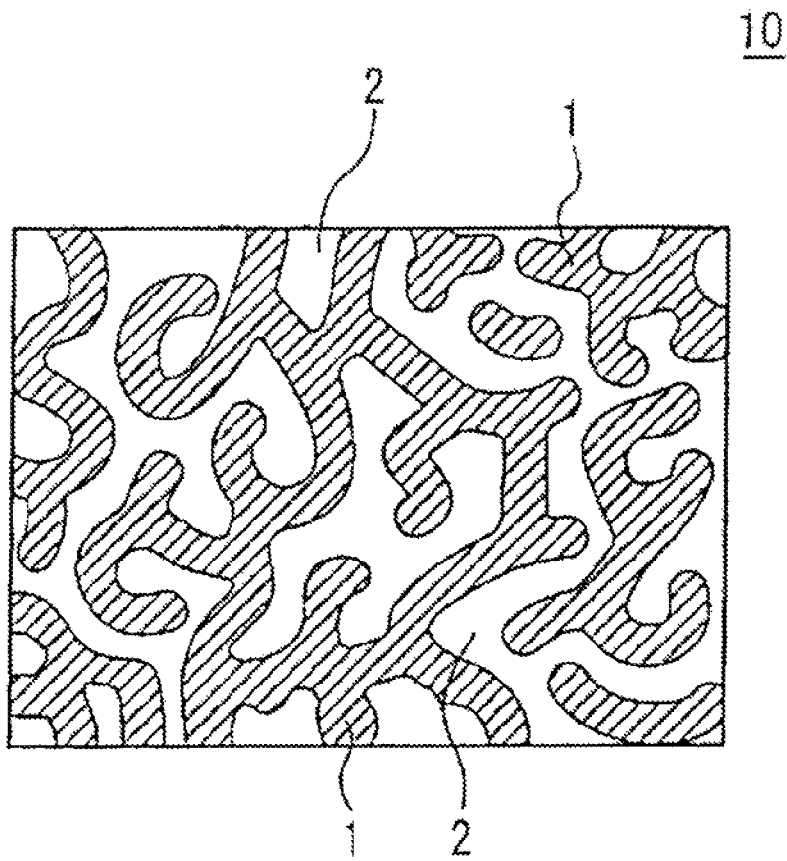
FIG. 4 is a drawing in which the skeletal part appearing as the cross-section of the SEM photograph of the third monolith anion exchanger is transcripted.

In FIG. 3, a SEM photograph of an example of the embodiment of the third monolith anion exchanger is shown, and in FIG. 4, a drawing in which the skeletal part appearing as the cross-section of the SEM photograph of the third monolith anion exchanger is transcripted is shown.

The third monolith anion exchanger is a co-continuous structural body comprising three-dimensionally continuous skeletons having an average thickness in a wet state of 1 to 60 μm which comprises an aromatic vinyl polymer containing 0.3 to 5.0 mol % of the crosslinking structure unit based on the whole constitutional units into which the anion exchange groups have been introduced and three-dimensionally continuous pores having an average diameter in a wet state of 10 to 200 μm between the skeletons, in which the total pore volume is 0.5 to 10 mL/g, the ion exchange capacity per a volume in a wet state is 0.2 to 1.0 mg equivalent/mL, and the anion exchange groups are uniformly distributed in the porous ion exchanger.

The third monolith anion exchanger is a co-continuous structural body comprising three-dimensionally continuous skeletons having an average thickness in a wet state of 1 to 60 μm, preferably 3 to 58 μm into which the anion exchange groups have been introduced, and three-dimensionally continuous pores having an average diameter in a wet state of 10 to 200 μm, preferably 15 to 180 μm, particularly preferably 20 to 150 μm between the skeletons.

That is, the co-continuous structure is, as shown in the schematic drawing of FIG. 4, a structure 10 in which the continuous skeletal phase 1 and the continuous pore phase 2 are intertwined with each other and both of these form a three-dimensionally continuous structure. The continuous pores 2 has high continuity of the pores as compared with the conventional open-cell type monolith or the particle agglomeration type monolith and has no bias in its size, so that extremely uniform adsorption behavior of ions can be achieved. In addition, mechanical strength is high since the skeleton is thick.

The thickness of the skeleton and the diameter of the pores of the third monolith anion exchanger becomes large than the thickness of the skeleton and the diameter of the pores of the monolith since the entire monolith swells when the anion exchange groups are introduced into the monolith. The continuous pores can accomplish extremely uniform adsorption behavior of the anions since the continuity of the pores is higher than that of the conventional open-cell type or the particle agglomeration type ones and the size thereof is not biased. If the average diameter of the three-dimensionally continuous pores in a wet state is less than 10 μm, it is not preferred since the pressure loss at the time of liquid flow becomes large, while if it exceeds 200 μm, it is not preferred since contact of the organic liquid and the organic porous anion exchanger is insufficient, and as a result, removal of the organic peroxide in the organic liquid is insufficient.

If the average thickness in a wet state of the skeleton is less than 1 μm, it is not preferred since, in addition to the defect that the anion exchange capacity per a volume is lowered, mechanical strength is lowered, in particular, the third monolith anion exchanger is largely deformed when a liquid is passed therethrough at a high flow rate. Further, it is not preferred since contact efficiency of the organic liquid and the third monolith anion exchanger is lowered and the catalytic effect is lowered. On the other hand, if the thickness of the skeleton exceeds 60 μm, it is not preferred since the skeleton becomes too thick and the pressure loss at the time of liquid flow becomes large.

The average diameter in a wet state of the pores of the above-mentioned continuous structural body is a value calculated by multiplying the average diameter of the pores of the third monolith anion exchange in a dry state measured by the mercury penetration method by the swelling ratio. More specifically, when the diameter of the third monolith anion exchanger in a wet state was x2 (mm), the diameter of the third monolith anion exchanger in a dry state obtained by drying the third monolith anion exchanger in a wet state was y2 (mm), and the average diameter of the pores when the third monolith anion exchanger in a dry state is measured by the mercury penetration method was z2 (μm), the average diameter (μm) of the pores in a wet state of the third monolith anion exchanger can be calculated by the following formula: the "average diameter (μm) of the pores in a wet state of the third monolith anion exchanger=z2×(x2/y2)".

When the average diameter of the pores of the monolith in a dry state before introducing the anion exchange groups, and the swelling ratio of the third monolith anion exchanger in a wet state to the monolith in a dry state to which the anion exchange groups had been introduced into the monolith in a dry state are known, it is also possible to calculate the average diameter of the pores of the third monolith anion exchange in a wet state by multiplying the average diameter of the pores of the monolith in a dry state by the swelling ratio.

The average thickness in a wet state of the skeleton of the above-mentioned continuous structural body is a value obtained by subjecting to an SEM observation of the third monolith anion exchanger in a dry state at least three times, measuring the thicknesses of the skeleton in the obtained image and calculating by multiplying the average value by the swelling ratio.

More specifically, when the diameter of the third monolith anion exchanger in a wet state was x3 (mm), the diameter of the third monolith anion exchanger in a dry state obtained by drying the third monolith anion exchanger: in a wet state was y3 (mm), and an average value of the thicknesses of the skeleton in the obtained image by subjecting to an SEM observation of the third monolith anion exchanger in a dry state at least three times was z3 (μm), the average thickness (μm) of the skeleton of the continuous structural body of the third monolith anion exchanger in a wet state can be calculated by the following formula: the "average thickness (μm) of the skeleton of the continuous structural body of the third monolith anion exchanger in a wet state=z3×(x3/y3)".

When the average thickness of the skeleton of the monolith in a dry state before introducing the anion exchange groups, and the swelling ratio of the third monolith anion exchanger in a wet state to the monolith in a dry state to which the anion exchange groups had been introduced into the monolith in a dry state are known, it is also possible to calculate the average thickness of the skeleton of the third monolith anion exchanger in a wet state by multiplying the average thickness of the skeleton of the monolith in a dry state by the swelling ratio. The skeleton is a rod-like shape and a circular cross-sectional shape, and a material having a different cross-sectional shape such as an elliptical cross-sectional shape may be contained. The thickness in this case is the average of the short diameter and the long diameter.

The total pore volume of the third monolith anion exchanger is 0.5 to 10 mL/g. If the total pore volume is less than 0.5 mL/g, it is not preferred since the pressure loss at the time of liquid flow becomes large, and further an amount of the permeated liquid per a unit cross-sectional area becomes small and the amount of a treatment liquid is lowered. On the other hand, if the total pore volume exceeds 10 mL/g, it is not preferred since the anion exchange capacity per a volume is lowered, a carried amount of the platinum group metal nanoparticles is lowered and the catalytic effect is lowered. It is also not preferred since mechanical strength is lowered and the third monolith anion exchanger is largely deformed particularly when the liquid is flown at a high flow rate.

Further, it is not preferred since contact efficiency of the organic liquid and the third monolith anion exchanger is lowered so that the organic peroxide removal effect is lowered. If the size and the total pore volume of the three-dimensionally continuous pores are within the above-mentioned range, contact with the organic liquid is extremely uniform, the contact area is large, and it is possible to pass the liquid with a low pressure loss. The total pore volume of the monolith (the monolith intermediate, the monolith and the monolith anion exchanger) is the same in both of a dry state and a wet state.

In the third monolith anion exchanger, the material constituting the skeleton of the co-continuous structural body is an aromatic vinyl polymer containing 0.3 to 5 mol %, preferably 0.5 to 3.0 mol % of the crosslinking structure unit based on the whole constitutional units and is hydrophobic. If the crosslinking structure unit is less than 0.3 mol %, it is not preferred since mechanical strength is insufficient, and on the other hand, if it exceeds 5 mol %, the structure of the porous body tends to deviate from the co-continuous structure. A kind of the aromatic vinyl polymer is not particularly limited, and may be mentioned, for example, polystyrene, poly(α-methylstyrene), poly(vinyl toluene), poly(vinylbenzyl chloride), poly(vinyl biphenyl), poly(vinyl naphthalene), etc.

The above-mentioned polymer may be a polymer obtained by copolymerizing a single vinyl monomer and a crosslinking agent, or may be a polymer obtained by polymerizing a plural number of vinyl monomers and a crosslinking agent, and may be a material in which two or more kinds of polymers are blended. Among these organic polymer materials, a styrene-divinylbenzene copolymer or a vinylbenzyl chloride-divinylbenzene copolymer is preferred in the points of easiness in forming the co-continuous structure, easiness in introducing the anion exchange group and high mechanical strength, and high stability to an acid or an alkali.

The third monolith anion exchanger has an ion exchange capacity of 0.2 to 1.0 mg equivalent/mL in the anion exchange capacity per a volume in a wet state. If the anion exchange capacity per a volume is less than 0.2 mg equivalent/mL, it is not preferred since a carried amount of the platinum group metal nanoparticles is lowered. On the other hand, if the anion exchange capacity per a volume exceeds 1.0 mg equivalent/mL, it is not preferred since the pressure loss at the time of liquid flow becomes large. The anion exchange capacity per a mass of the third monolith anion exchanger in a dry state is not particularly limited, and is 3 to 6 mg equivalent/g since the ion exchange groups are uniformly introduced into the surface of the skeleton and the inside of the skeleton of the porous body.

The ion exchange capacity of the porous body into which the ion exchange groups have been introduced only the surface of the skeleton cannot be determined universally depending on the kind of the porous body or the ion exchange group, and it is at most 500 μg equivalent/g.

The anion exchange group in the third monolith anion exchanger is the same as the anion exchange group in the first monolith anion exchanger, so that its explanation is omitted. In the third monolith anion exchanger, the introduced anion exchange groups are uniformly distributed not only at the surface of the porous body but also at the inside of the skeleton of the porous body. The definition of uniformly distributed is the same as the definition of uniformly distributed in the first monolith anion exchanger.

(Producing Method of Third Monolith Anion Exchanger)

The third monolith anion exchanger can be obtained by subjecting to the processes of Step I in which a mixture of an oil-soluble monomer containing no ion exchange group, a surfactant and water is stirred to prepare a water droplets in oil type emulsion, then, the water droplets in oil type emulsion is polymerized to obtain a continuous macropore structure monolithic organic porous intermediate having a total pore volume exceeding 16 mL/g and 30 mL/g or less, Step II in which a mixture comprising an aromatic vinyl monomer, 0.3 to 5 mol % of a crosslinking agent having at least two or more vinyl groups in one molecule based on the whole oil-soluble monomers, an organic solvent which dissolves an aromatic vinyl monomer or the crosslinking agent but does not dissolve a polymer formed by polymerization of the aromatic vinyl monomer and a polymerization initiator is prepared, Step III in which the mixture obtained in Step II is polymerized in a stationary state in the presence of the monolithic organic porous intermediate obtained in Step I to obtain a co-continuous structural body, and a step of introducing the anion exchange groups into the co-continuous structural body obtained in the Step III.

The Step I to obtain the monolith intermediate in the third monolith anion exchanger may be carried out in accordance with the method described in JP 2002-306976A.

In Step I, the oil-soluble monomer containing no ion exchange group is the same as the oil-soluble monomer used for the production of the first monolith anion exchanger, so that its explanation is omitted. It is preferred that crosslinking monomers such as divinylbenzene, ethylene glycol dimethacrylate, etc., are selected as at least one component of the oil-soluble monomer and the content thereof is made 0.3 to 5 mol %, preferably 0.3 to 3 mol % based on the whole oil-soluble monomers since it is advantageous for forming a co-continuous structure.

The surfactant is the same as the surfactant used in Step I of the first monolith anion exchanger, so that its explanation is omitted.

In Step I, a polymerization initiator may be used, if necessary, at the time of forming the water droplets in oil type emulsion. The polymerization initiator is the same as the polymerization initiator used for production of the first monolith anion exchanger, so that its explanation is omitted.

The mixing method at the time of mixing an oil-soluble monomer containing no ion exchange group, a surfactant, water and a polymerization initiator to form a water droplets in oil type emulsion is the same as the mixing method in Step I of the first monolith anion exchanger, so that its explanation is omitted.

In the process for producing the third monolith anion exchanger, the monolith intermediate obtained in Step I is an organic polymer material having the crosslinking structure, and suitably an aromatic vinyl polymer. A crosslinking density of the polymer material is not particularly limited, and the crosslinking structure unit is preferably contained in an amount of 0.3 to 5 mol %, preferably 0.3 to 3 mol % based on the whole constitutional unit constituting the polymer material.

If the crosslinking structure unit is less than 0.3 mol %, it is not preferred since mechanical strength is insufficient. On the other hand, if it exceeds 5 mol %, it is not preferred since the structure of the monolith is likely to deviate from the co-continuous structure. In particular, when the total pore volume is 16 to 20 mL/g which is a small value in the present invention, the crosslinking structure unit is preferably made less than 3 mol % for forming the co-continuous structure.

A kind of the polymer material of the monolith intermediate is the same as the kind of the polymer material of the monolith intermediate of the first monolith anion exchanger, so that its explanation is omitted. The total pore volume of the monolith intermediate is exceeding 16 mL/g and 30 mL/g or less, suitably exceeding 16 mL/g and 25 mL/g or less.

That is, the monolith intermediate is basically a continuous macropore structure, but since the opening (mesopore) which is an overlapping part of macropores and macropores is much larger, the skeleton constituting the monolith structure has an extremely similar structure from a two-dimensional wall surface to one-dimensional rod-like skeleton. When this is allowed to coexist in the polymerization system, a porous body with a co-continuous structure is formed using the structure of the monolith intermediate as a mold. If the total pore volume is too small, it is not preferred since the structure of the monolith obtained after polymerization of the vinyl monomer is changed from the co-continuous structure to the continuous macropore structure, and on the other hand, if the total pore volume is too large, it is not preferred since mechanical strength of the monolith obtained after polymerization of the vinyl monomer is lowered and the anion exchange capacity per a volume is lowered. For making the total pore volume of the monolith intermediate a specific range of the third monolith anion exchanger, a ratio of the monomer and water may be made approximately 1:20 to 1:40.

The monolith intermediate has an average diameter of the opening (mesopore) which is an overlapping part of macropores and macropores in a dry state is 5 to 150 μm. If the average diameter of the openings in a dry state is less than 5 μm, it is not preferred since the opening diameter of the monolith obtained after polymerization of the vinyl monomer becomes small and the pressure loss at the time of fluid permeation becomes large. On the other hand, if it exceeds 150 μm, it is not preferred since the opening diameter of the monolith obtained after polymerization of the vinyl monomer becomes too large, contact between the organic liquid and the monolith anion exchanger becomes insufficient, and as a result, the organic peroxide characteristics are lowered.

The monolith intermediate preferably comprises a material having a uniform structure in which a size of the macropore and a diameter of the opening are uniform, but it is not limited thereto, and it may be a material in which nonuniform macropores larger than the size of the uniform macropore in the uniform structure may be dotted.

In the process for producing the third monolith anion exchanger, Step II is a step for preparing a mixture comprising an aromatic vinyl monomer, 0.3 to 5 mol % of a crosslinking agent having at least two or more vinyl groups in one molecule based on the whole oil-soluble monomers, an organic solvent which dissolves an aromatic vinyl monomer or the crosslinking agent but does not dissolve a polymer formed by polymerization of the aromatic vinyl monomer and a polymerization initiator.

Step II is a step of preparing a mixture comprising a vinyl monomer, a crosslinking agent having at least two or more vinyl groups in one molecule, an organic solvent which dissolves the vinyl monomer or the crosslinking agent but does not dissolve the polymer formed by polymerization of the vinyl monomer and a polymerization initiator. There is no order in Step I and Step II, Step II may be carried out after Step I, or Step I may be carried out after Step II.

The vinyl monomer to be used in Step II is not particularly limited as long as it contains a polymerizable vinyl group in the molecule and is a lipophilic vinyl monomer having high solubility in the organic solvent, and it is preferred to select a vinyl monomer which forms the same kind or similar polymer material as the monolith intermediate to be co-presented in the above-mentioned polymerization system.

Specific examples of these vinyl monomers may be mentioned an aromatic vinyl monomer such as styrene, α-methylstyrene, vinyl toluene, vinylbenzyl chloride, vinyl biphenyl, vinyl naphthalene, etc., an α-olefin such as ethylene, propylene, 1-butene, isobutene, etc., a diene-based monomer such as butadiene, isoprene, chloroprene, etc., a halogenated olefin such as vinyl chloride, vinyl bromide, vinylidene chloride, tetrafluoroethylene, etc., a nitrile-based monomer such as acrylonitrile, methacrylonitrile, etc., a vinyl ester such as vinyl acetate, vinyl propionate, etc., a (meth)acrylic-based monomer such as methyl acrylate, ethyl acrylate, butyl acrylate, 2-ethylhexyl acrylate, methyl methacrylate, ethyl methacrylate, propyl methacrylate, butyl methacrylate, 2-ethylhexyl methacrylate, cyclohexyl methacrylate, benzyl methacrylate, glycidyl methacrylate, etc. These monomers may be used a single kind alone or two or more kinds in combination.

The vinyl monomer suitably used in the present invention is an aromatic vinyl monomer such as styrene, vinylbenzyl chloride, etc. There is no order in Step I and Step II, Step II may be carried out after Step I, or Step I may be carried out after Step II. In the process for producing the third monolith anion exchanger, the aromatic vinyl monomer to be used in Step II is not particularly limited as long as it contains a polymerizable vinyl group in the molecule and is a lipophilic aromatic vinyl monomer having high solubility in the organic solvent, and it is preferred to select a vinyl monomer which forms the same kind or similar polymer material as the monolith intermediate to be co-presented in the above-mentioned polymerization system.

An amount of these aromatic vinyl monomers to be added is 5 to 50-fold, preferably 5 to 40-fold in mass based on the monolith intermediate to be co-presented at the time of polymerization. If the amount of the aromatic vinyl monomer to be added is less than 5-fold based on the monolith intermediate, it is not preferred since the rod-like skeleton cannot be made thick and the anion exchange capacity per a volume after introducing the anion exchange groups becomes small. On the other hand, if the amount of the aromatic vinyl monomer to be added exceeds 50-fold, it is not preferred since the diameter of the continuous pores becomes small and the pressure loss at the time of liquid flow becomes large.

The crosslinking agent to be used in Step II suitably used is a material containing at least two polymerizable vinyl groups in the molecule and having high solubility in the organic solvent. Specific examples of the crosslinking agent may be mentioned divinylbenzene, divinyl naphthalene, divinyl biphenyl, ethylene glycol dimethacrylate, trimethylolpropane triacrylate, butanediol diacrylate, etc. These crosslinking agents may be used a single kind alone or two or more kinds in combination. Preferred crosslinking agent is an aromatic polyvinyl compound such as divinylbenzene, divinyl naphthalene, divinyl biphenyl, etc., from high mechanical strength and stability to hydrolysis.

An amount of the crosslinking agent to be used is 0.3 to 5 mol %, particularly 0.3 to 3 mol % based on the total amount of the vinyl monomer and the crosslinking agent, (whole oil-soluble monomers). If the amount of the crosslinking agent to be used is less than 0.3 mol %, it is not preferred since mechanical strength of the monolith is insufficient, and on the other hand, if it is too much, it is not preferred since quantitative introduction of the anion exchange groups becomes difficult in some cases. The amount of the above-mentioned the crosslinking agent to be used is preferably used with such an amount that it becomes substantially equal to the crosslinking density of the monolith intermediate to be co-presented at the time of polymerization of the vinyl monomer/the crosslinking agent. If the amounts of both to be used are far apart from each other, the distribution of the crosslinking density is uneven in the formed monolith, and cracks are likely to occur at the time of introducing the anion exchange groups.

The organic solvent to be used in Step II is an organic solvent which dissolves the vinyl monomer and the crosslinking agent but does not dissolve the polymer formed by polymerization of the vinyl monomer, in other words, it is a poor solvent to the polymer formed by polymerization of the vinyl monomer. The organic solvent greatly varies depending on the kind of the vinyl monomer so that it is difficult to enumerate the general specific examples and, for example, when the vinyl monomer is styrene, the organic solvent may be mentioned an alcohol such as methanol, ethanol, propanol, butanol, hexanol, cyclohexanol, octanol, 2-ethylhexanol, decanol, dodecanol, ethylene glycol, propylene glycol, tetramethylene glycol, glycerol, etc., a linear (poly)ether such as diethyl ether, ethylene glycol dimethyl ether, cellosolve, methyl cellosolve, butyl cellosolve, polyethylene glycol, polypropylene glycol, polytetramethylene glycol, etc., a linear saturated hydrocarbon such as hexane, heptane, octane, isooctane, decane, dodecane, etc., an ester such as ethyl acetate, isopropyl acetate, cellosolve acetate, ethyl propionate, etc. Also, even when it is a good solvent for the polystyrene such as dioxane, THF and toluene, it is used with the above-mentioned poor solvent, and when the amount to be used is a little, it is used as an organic solvent.

An amount of these organic solvents to be used is preferably used so that the concentration of the above-mentioned vinyl monomer becomes 30 to 80% by mass. If the amount of the organic solvent to be used is deviated from the above-mentioned range and the concentration of the vinyl monomer becomes less than 30% by mass, it is not preferred since the polymerization rate is lowered or the structure of the monolith after the polymerization is deviated from the scope of the present invention. On the other hand, if the concentration of the vinyl monomer exceeds 80% by mass, it is not preferred since there is a fear that the polymerization runaway.

The polymerization initiator to be used in Step II is the same as the polymerization initiator to be used for production of the first monolith anion exchanger, so that its explanation is omitted.

In the process for producing the third monolith anion exchanger, Step III is a step in which the mixture obtained in Step II is polymerized in a stationary state in the presence of the monolithic organic porous intermediate obtained in Step I to change the continuous macropore structure of the monolith intermediate to a co-continuous structure to obtain a co-continuous structural body. The monolith intermediate to be used in Step III plays an extremely important role in creating the monolith having the novel structure of the present invention. As disclosed in JP H7-501140A, etc., when the vinyl monomer and the crosslinking agent are subjected to standing polymerization in the specific organic solvent in the absence of the monolith intermediate, a particle agglomeration type monolithic organic porous body can be obtained.

To the contrary, when the monolith intermediate having a specific continuous macropore structure is present in the above-mentioned polymerization system as in the third monolith of the present invention, the structure of the monolith after polymerization changes drastically and the particle agglomeration structure disappears, whereby a monolith of the above-mentioned co-continuous structure can be obtained. Whereas the reason thereof has not been elucidated in detail, it can be considered that when no monolith intermediate is present, the crosslinked polymer formed by the polymerization is precipitated and deposited in a granular state to form a particle agglomeration structure, but when a porous body (intermediate) having a large total pore volume is present in the polymerization system, the vinyl monomer and the crosslinking agent are adsorbed and distributed from the liquid phase to the skeletal part of the porous body, the polymerization proceeds in the porous body, and the skeleton constituting the monolith structure changes from a two-dimensional wall surface to a one-dimensional rod-like skeleton to form a monolithic organic porous body having a co-continuous structure.

An inner volume of the reaction apparatus is not particularly limited as long as it has a size which can exist the monolith intermediate in the reaction apparatus, and it may be either of one that forms a gap around the monolith in a plan view when the monolith intermediate is placed in the reaction apparatus, or one in which the monolith intermediate enters in the reaction apparatus without gaps. Among these, an apparatus in which a thick-boned monolith after polymerization enters in the reaction apparatus without gaps and without receiving pressure from the inner wall of the apparatus is efficient since no distortion is generated in the monolith and no waste of reaction raw materials, etc., is generated. Even when the inner volume of the reaction apparatus is large and gaps are present around the monolith after polymerization, the vinyl monomer and the crosslinking agent are adsorbed and distributed to the monolith intermediate, so that no particle agglomeration structure product is formed at the gap portion in the reaction apparatus.

In Step III, the monolith intermediate is placed in the state of being impregnated by the mixture (solution) in the reaction apparatus. A formulation ratio of the mixture obtained in Step II and the monolith intermediate is suitable to formulate that an amount of the aromatic vinyl monomer to be added is 5 to 50-fold, preferably 5 to 40-fold in mass based on the monolith intermediate, as mentioned above. According to this constitution, it is possible to obtain a monolith with a co-continuous structure in which pores with moderate size are three-dimensionally continuous and thick-boned skeletons are three-dimensionally continuous.

In the reaction apparatus, the aromatic vinyl monomer and the crosslinking agent in the mixture are adsorbed and distributed to the skeleton of the stationary placed monolith intermediate, and the polymerization proceeds in the skeleton of the monolith intermediate. The basic structure of the monolith having a co-continuous structure is a structure in which a three-dimensionally continuous skeleton having an average thickness in a dry state of 0.8 to 40 μm, and three-dimensionally continuous pores having an average diameter in a dry state of 5 to 100 μm between the skeletons are arranged. The average diameter in a dry state of the above-mentioned three-dimensionally continuous pores can be obtained as a maximum value of the pore distribution curve by measuring the pore distribution curve by the mercury penetration method. The thickness of the skeleton of the monolith in a dry state may be calculated by performing SEM observation at least three times and measuring the average thickness of the skeleton in the obtained image. Also, the monolith having a co-continuous structure has a total pore volume of 0.5 to 10 mL/g.

The third monolith anion exchanger swells to, for example, 1.4 to 1.9-fold of the monolith since the anion exchange groups are introduced into the monolith having a co-continuous structure. In addition, even if the pore diameter is enlarged by swelling, the total pore volume does not change. Accordingly, the third monolith anion exchanger has high mechanical strength since it has a thick-boned skeleton despite the fact that the three-dimensionally continuous pores are much larger in size. Also, since the skeleton is thick, the anion exchange capacity per a volume in a wet state can be made large, and further, it is possible to pass the organic liquid at a low pressure and a large flow rate for a long time.

<Explanation of Fourth Monolith Anion Exchanger>

The fourth monolith anion exchanger comprises a continuous macropore structural body in which bubble-like macropores overlap with each other and this overlapping portion is an opening having an average diameter of 30 to 300 μm, a total pore volume is 0.5 to 10 mL/g, an ion exchange capacity per a weight in a dry state is 0.5 to 6 mg equivalent/g, the ion exchange group is uniformly distributed in the organic porous anion exchanger having a monolith structure, and in the SEM image of the cut surface of the continuous macropore structural body (dried body), the skeletal part area appearing in the cross-section is 25 to 50% in the image area.

Figure 5:
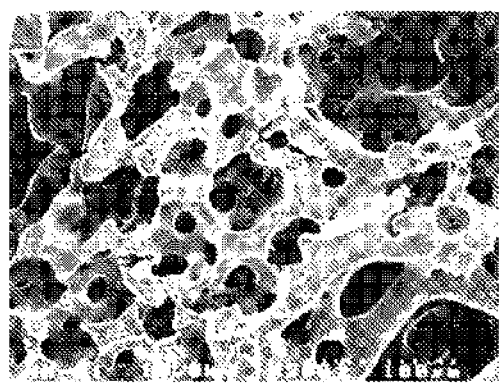
FIG. 5 is an SEM photograph of an example of the embodiment of the fourth monolith anion exchanger.
Figure 6:
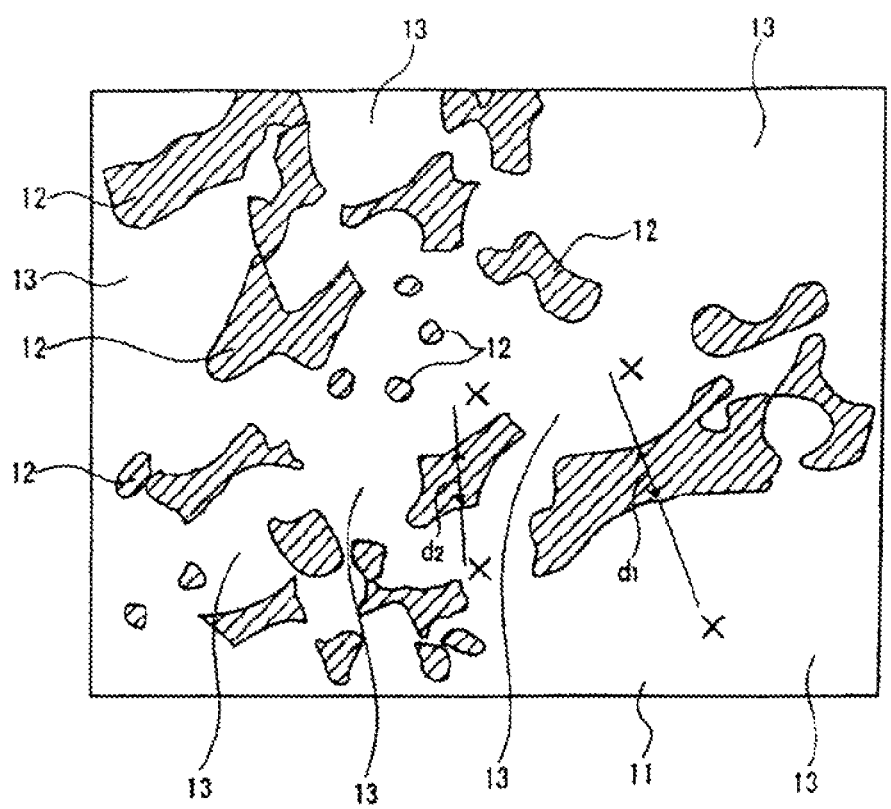
FIG. 6 is a schematic drawing of a co-continuous structure of the fourth monolith anion exchanger.

In FIG. 5, a SEM photograph of an example of the embodiment of the fourth monolith anion exchanger is shown, and in FIG. 6, a schematic drawing of the co-continuous structure of the fourth monolith anion exchanger is shown.

The fourth monolith anion exchanger has a continuous macropore structural body in which bubble-like macropores overlap with each other and this overlapping portion is an opening (mesopore) having an average diameter in a wet state or 30 to 300 μm, preferably 30 to 200 μm, particularly preferably 40 to 100 μm. The average diameter of the openings of the fourth monolith anion exchanger is larger than the average diameter of the openings of the monolith since the entire monolith swells when the anion exchange groups are introduced into the monolith. If the average diameter of the openings in a wet state is less than 30 μm, it is not preferred since the pressure loss at the time of liquid flow becomes large, while if the average diameter of the openings in a wet state is too large, it is not preferred since contact of the organic liquid, the fourth monolith anion exchanger and the carried platinum group metal nanoparticles is insufficient, and as a result, the organic peroxide removal characteristics are lowered. In the present invention, the average diameter of the openings of the monolith intermediate in a dry state, the average diameter of the openings of the monolith in a dry state and the average diameter of the openings of the fourth monolith anion exchanger in a dry state are values measured by the mercury penetration method.

The average diameter of the openings of the fourth monolith anion exchanger in a wet state is a value calculated by multiplying the average diameter of the openings of the fourth monolith anion exchanger in a dry state by the swelling ratio, and the method for calculation is the same method to be used in the first monolith so that it is omitted.

In the fourth monolith anion exchanger, the skeletal part area appearing in the cross-section in the SEM image of the cut surface of the continuous macropore structural body is 25 to 50%, preferably 25 to 45% in the image area. If the skeletal part area appearing in the cross-section is less than 25% in the image area, it is not preferred since it becomes a thin skeleton, mechanical strength is lowered and the fourth monolith anion exchanger is largely deformed particularly when the liquid is flown at a high flow rate. Moreover, it is not preferred since contact efficiency of the organic liquid, the fourth monolith anion exchanger and the platinum group metal nanoparticles carried thereon is lowered so that the catalytic effect is lowered, while if it exceeds 50%, it is not preferred since the skeleton becomes too thick and the pressure loss at the time of liquid flow becomes large.

In the monolith described in JP 2002-306976A, even if the formulation ratio of the oil phase part to water is increased and the skeleton part is thickened, there is a limit in the formulation ratio to secure common openings, and the maximum value of the skeleton part area appearing in the cross-section cannot exceed 25% in the image area.

The condition for obtaining the SEM image may be any condition as long as the skeletal part appearing on the cross-section of the cut surface appears clearly, for example, the magnification is 100 to 600 and the photograph region is about 150 mm×100 mm. The SEM observation is preferably carried out with images of three or more, preferably five or more, which are excluded in subjectivity and photographed at arbitrary cut surface and at cut surface portion of the monolith with different cutting positions and photographing sites. The monolith to be cut is in a dry state since it is subjected to an electron microscope. The skeletal part of the cut surface in the SEM image is explained by referring to FIG. 5 and FIG. 6. FIG. 6 is a drawing in which the skeletal part appearing as the cross-section of the SEM photograph of FIG. 5 is transcripted.

In FIG. 5 and FIG. 6, those which are roughly indefinite in shape and appear in cross-section are the "skeletal part appearing in the cross-section (reference numeral 12)" of the present invention, the circular hole shown in FIG. 5 is an opening (mesopore) and those having a relatively large curvature and curved surface are macropores (reference numeral 13 in FIG. 5).

The skeletal part area appearing in the cross-section of FIG. 6 is 28% in the rectangular shape image area 11. In this way, the skeletal part can be clearly judged. In the SEM image, the method for measuring an area of the skeletal part appearing in the cross-section of the cut surface is not particularly limited, and there may be mentioned a calculating method by automatic calculation by a computer, etc., or manual calculation after specifying the skeletal parts by subjecting to the conventionally known computer processing, etc. As the manual calculation, there may be mentioned a method in which an indefinite shape object is replaced with an aggregate such as a square, a triangle, a circle or a trapezoid, etc., and these are laminated to obtain the area.

The total pore volume of the fourth monolith anion exchanger is 0.5 to 10 mL/g, preferably 0.8 to 7 mL/g. If the total pore volume is less than 0.5 mL/g, it is not preferred since the pressure loss at the time of liquid flow becomes large, and further an amount of the permeated liquid per a unit cross-sectional area is small and the treatment capacity is lowered. On the other hand, if the total pore volume exceeds 10 mL/g, it is not preferred since mechanical strength is lowered and the fourth monolith anion exchanger is largely deformed particularly when the liquid is flown at a high flow rate. It is further not preferred since contact efficiency of the organic liquid, the fourth monolith anion exchanger and the platinum group metal nanoparticles carried thereon is lowered, so that the catalytic effect is also lowered. In the present invention, the total pore volume of the monolith (the monolith intermediate, the monolith and the monolith anion exchanger) is a value measured by the mercury penetration method. The total pore volume of the monolith (the monolith intermediate, the monolith and the monolith anion exchanger) is the same in both of a dry state and a wet state.

In the fourth monolith anion exchanger, the anion exchange capacity per a volume in a wet state is not particularly limited and is generally 0.2 to 1.0 mg equivalent/mL. The fourth monolith anion exchanger can further increase the opening diameter and thicken the skeleton of the continuous macropore structural body (thicken the wall portion of the skeleton), so that the anion exchange capacity per a volume can be greatly enlarged while suppressing the pressure loss to a low level.

If the anion exchange capacity per a volume is less than 0.2 mg equivalent/mL, it is not preferred since a carried amount of the platinum group metal nanoparticles is lowered. On the other hand, if the anion exchange capacity per a volume exceeds 1.0 mg equivalent/mL, it is not preferred since the pressure loss at the time of liquid flow becomes large. The anion exchange capacity per a mass of the fourth monolith anion exchanger is not particularly limited, and it is 3 to 6 mg equivalent/g since the anion exchange groups are uniformly introduced in the surface and inside of the skeleton of the porous body. An ion exchange capacity of the porous body into which the ion exchange groups have been introduced only the surface cannot be determined universally depending on the kind of the porous body or the ion exchange group, and it is at most 500 µg equivalent/g.

In the fourth monolith anion exchanger, a material constituting the skeleton of the continuous macropore structural body is an organic polymer material having the crosslinking structure. A crosslinking density of the polymer material is not particularly limited, and the crosslinking structure unit is preferably contained in an amount of 0.3 to 10 mol %, suitably 0.3 to 5 mol % based on the whole constitutional unit constituting the polymer material. If the crosslinking structure unit is less than 0.3 mol %, it is not preferred since mechanical strength is insufficient, and on the other hand, if it exceeds 10 mol %, it is not preferred since there is a case where introduction of the anion exchange groups becomes difficult.

The kind of the polymer material is not particularly limited and, for example, the polymer material constituting the first monolith may be used so that the explanation thereof is omitted.

The anion exchange group of the fourth monolith anion exchanger is the same as the anion exchange group in the first monolith anion exchanger, so that its explanation is omitted. In the fourth monolith anion exchanger, the introduced anion exchange groups are uniformly distributed not only at the surface of the porous body but also at the inside of the skeleton of the porous body. The definition of uniformly distributed is the same as the definition of uniformly distributed in the first monolith anion exchanger.

(Producing Method of Fourth Monolith Anion Exchanger)

The fourth monolith anion exchanger can be obtained by subjecting to the processes of Step I in which a mixture of an oil-soluble monomer containing no ion exchange group, a surfactant and water is stirred to prepare a water droplets in oil type emulsion, then, the water droplets in oil type emulsion is polymerized to obtain a continuous macropore structure monolithic organic porous intermediate (monolith intermediate) having a total pore volume of 5 to 16 mL/g, Step II in which a mixture comprising a vinyl monomer, a crosslinking agent having at least two or more vinyl groups in one molecule, an organic solvent which dissolves the vinyl monomer or the crosslinking agent but does not dissolve a polymer formed by polymerization of the vinyl monomer and a polymerization initiator is prepared, Step III in which the mixture obtained in Step II is polymerized in a stationary state in the presence of the monolith intermediate obtained in Step I to obtain a thick-boned organic porous body having thicker skeleton than the skeleton of the monolith intermediate, and Step IV of introducing the anion exchange groups into the thick-boned organic porous body obtained in the Step III.

In the process for producing the fourth monolith anion exchanger, Step I may be carried out in accordance with the method described in JP 2002-306976A.

In the production of the monolith intermediate in Step I, the oil-soluble monomer containing no ion exchange group is the same as the oil-soluble monomer to be used for producing the first monolith anion exchanger, so that its explanation is omitted.

The surfactant is the same as the surfactant to be used for producing the first monolith anion exchanger, so that its explanation is omitted.

In Step I, at the time of forming the water droplets in oil type emulsion, the polymerization initiator may be used, if necessary. The polymerization initiator is the same as the polymerization initiator to be used for producing the first monolith anion exchanger, so that its explanation is omitted.

The mixing method at the time of mixing an oil-soluble monomer containing no ion exchange group, a surfactant, water and a polymerization initiator to form a water droplets in oil type emulsion is the same as the mixing method in Step I of the first monolith anion exchanger, so that its explanation is omitted.

The monolith intermediate obtained in Step I has a continuous macropore structure. When this is allowed to coexist in the polymerization system, a porous structure having a thick-boned skeleton is formed using the structure of the monolith intermediate as a mold. Also, the monolith intermediate is an organic polymer material having a crosslinking structure.

A crosslinking density of the polymer material is not particularly limited, and the crosslinking structure unit is preferably contained in an amount of 0.3 to 10 mol %, preferably 0.3 to 5 mol % based on the whole constitutional unit constituting the polymer material. If the crosslinking structure unit is less than 0.3 mol %, it is not preferred since mechanical strength is insufficient. In particular, if the total pore volume is large as 10 to 16 mL/g, the crosslinking structure unit is preferably contained in an amount of 2 mol % or more to maintain the continuous macropore structure. On the other hand, if it exceeds 10 mol %, it is not preferred since there is a case where introduction of the anion exchange groups becomes difficult.

A kind of the polymer material of the monolith intermediate is not particularly limited, and the same material as in the above-mentioned polymer material of the monolith may be mentioned. According to this constitution, the same polymer is formed to the skeleton of the monolith intermediate to thicken the skeleton whereby a monolith having a uniform skeletal structure can be obtained.

The total pore volume of the monolith intermediate: is 5 to 16 mL/g, suitably 6 to 16 mL/g. If the total pore volume is too small, it is not preferred since the total pore volume of the monolith obtained after polymerization of the vinyl monomer is too small and the pressure loss at the time of fluid permeation becomes large. On the other hand, if the total pore volume is too large, it is not preferred since the structure of the monolith obtained after polymerization of the vinyl monomer is deviated from the continuous macropore structure. For making the total pore volume of the monolith intermediate the above-mentioned numerical range, a ratio of the monomer and water may be made approximately 1:5 to 1:20.

The monolith intermediate has an average diameter of the opening (mesopore) which is an overlapping part of macropores and macropores in a dry state is 20 to 200 μm. If the average diameter of the openings in a dry state is less than 20 μm, it is not preferred since the opening diameter of the monolith obtained after polymerization of the vinyl monomer becomes small and the pressure loss at the time of liquid flow becomes large. On the other hand, if it exceeds 200 μm, it is not preferred since the opening diameter of the monolith obtained after polymerization of the vinyl monomer becomes too large, contact between the organic liquid and the monolith anion exchanger becomes insufficient, and as a result, and the organic peroxide removal characteristics are lowered. The monolith intermediate preferably comprises a material having a uniform structure in which a size of the macropore and a diameter of the opening are uniform, but it is not limited thereto, and it may be a material in which nonuniform macropores larger than the size of the uniform macropore in the uniform structure may be dotted.

The vinyl monomer to be used in Step II is the same as the vinyl monomer used in the third, monolith anion exchanger, so that its explanation is omitted.

An amount of the vinyl monomer to be added used in Step II is 3 to 50-fold, preferably 4 to 40-fold in mass based on the monolith intermediate to be co-presented at the time of polymerization. If the amount of the vinyl monomer to be added is less than 3-fold based on the porous body, it is not preferred since the skeleton of the formed monolith (thickness of the wall part of the monolith skeleton) cannot be made thick and the anion exchange capacity per a volume after introducing the anion exchange group becomes small. On the other hand, if the amount of the vinyl monomer to be added exceeds 50-fold, it is not preferred since the opening diameter becomes small and the pressure loss at the time of liquid flow becomes large.

The crosslinking agent to be used in Step II is the same as the crosslinking agent to be used in the fourth monolith anion exchanger, so that its explanation is omitted. An amount of the crosslinking agent to be used is preferably 0.3 to 10 mol %, particularly 0.3 to 5 mol % based on the total amount of the vinyl monomer and the crosslinking agent. If the amount of the crosslinking agent to be used is less than 0.3 mol %, it is not preferred since mechanical strength of the monolith is insufficient. On the other hand, if it exceeds 10 mol %, it is not preferred since the introduced amount of the anion exchange group is reduced in some cases.

The organic solvent used in Step II and an amount thereof to be used are the same as the organic solvent used in Step II of the fourth monolith anion exchanger, so that its explanation is omitted.

The polymerization initiator is the same as the polymerization initiator to be used for producing the first monolith anion exchanger, so that its explanation is omitted.

Step III is a step in which the mixture obtained in Step II is polymerized in a stationary state in the presence of the monolith intermediate obtained in Step I to obtain a thick-boned monolith having thicker skeleton than the skeleton of the monolith intermediate. The monolith intermediate to be used in Step III plays an extremely important role in creating the monolith having the novel structure of the present invention. As disclosed in JP H7-501140A, etc., when the vinyl monomer and the crosslinking agent are subjected to standing polymerization in the specific organic solvent in the absence of the monolith intermediate, a particle agglomeration type monolithic organic porous body can be obtained.

To the contrary, when the monolith intermediate having the continuous macropore structure is present in the above-mentioned polymerization system as in the present invention, the structure of the monolith after polymerization changes drastically and the particle agglomeration structure disappears, whereby the above-mentioned thick-boned monolith can be obtained. Whereas the reason thereof has not been elucidated in detail, it can be considered that when no monolith intermediate is present, the crosslinked polymer formed by the polymerization is precipitated and deposited in a granular state to form a particle agglomeration structure, but when a porous body (intermediate) is present in the polymerization system, the vinyl monomer and the cross-linking agent are adsorbed and distributed from the liquid phase to the skeletal part of the porous body (intermediate), and polymerization proceeds in the porous body (intermediate) to obtain a monolith having a thick-boned skeleton.

Although the opening diameter is narrowed by the progress of the polymerization, since the total pore volume of the monolith intermediate is large, an opening diameter of an appropriate size can be obtained even if the skeleton becomes thick-boned.

An inner volume of the reaction apparatus may be used the same as that of the reaction apparatus used in Step II of the fourth monolith anion exchanger, so that its explanation is omitted.

In Step III, the monolith intermediate is placed in the state of being impregnated by the mixture (solution) in the reaction apparatus. A formulation ratio of the mixture obtained in Step II and the monolith intermediate is suitable to formulate that an amount of the vinyl monomer to be added is 3 to 50-fold, preferably 4 to 40-fold in mass based on the monolith intermediate, as mentioned above. According to this constitution, it is possible to obtain a monolith having a thick-boned skeleton while possessing an appropriate opening diameter. In the reaction apparatus, the vinyl monomer and the crosslinking agent in the mixture are adsorbed and distributed to the skeleton of the stationary placed monolith intermediate, and the polymerization proceeds in the skeleton of the monolith intermediate.

By the polymerization under hearing, the vinyl monomer and the crosslinking agent adsorbed and distributed to the skeleton of the monolith intermediate are polymerized in the skeleton to thicken the skeleton. After completion of the polymerization, the product is taken out, and extracted with a solvent such as acetone, etc., for the purpose of removing the unreacted vinyl monomer and the organic solvent to obtain a thick-boned monolith. It is preferred the method in which after producing the monolith according to the above-mentioned method, then, the anion exchange groups are introduced thereinto in the point that the porous structure of the resulting fourth monolith anion exchanger can be strictly controlled.

<Explanation of Fifth Monolith Anion Exchanger (Composite Monolith Anion Exchanger)>

The fifth monolith anion exchanger comprises a continuous skeletal phase and a continuous porous phase, the skeleton has a number of particle bodies having a diameter of 4 to 40 µm fixed to the surface or a number of protrusions having a size of 4 to 40 µm formed onto the surface of the skeleton of the organic porous body, an average diameter of the continuous pores is 10 to 150 µm, a total pore volume is 0.5 to 10 mL/g, an ion exchange capacity per a weight in a dry state is 0.5 to 6 mg equivalent/g, and ion exchange groups are uniformly distributed in the organic porous anion exchanger having a monolith structure.

Figure 7:
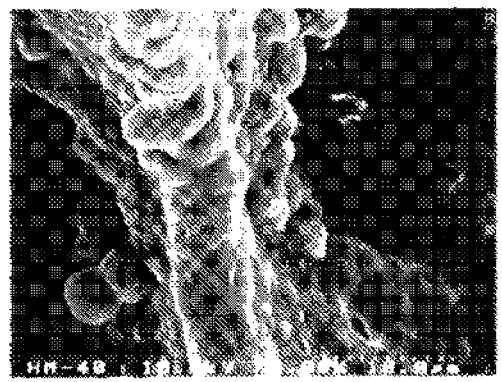
FIG. 7 is an SEM photograph of an example of the embodiment of the fifth monolith anion exchanger.
Figure 8A:
FIGS. 8A-8E are schematic sectional views of the protrusions of the fifth monolith anion exchanger.
Figure 8B:
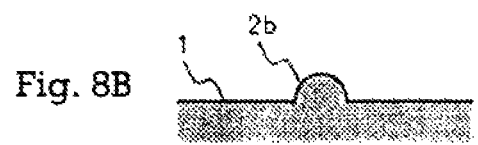
Figure 8C:
Figure 8D:
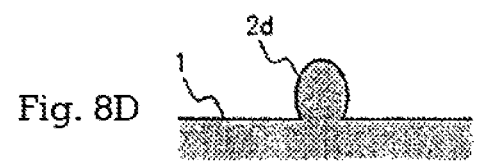
Figure 8E:
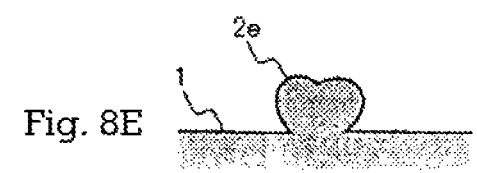

In FIG. 7, a SEM photograph of an example of the embodiment of the fifth monolith anion exchanger is shown, and in FIG. 8E, a schematic sectional view of the protrusions of the fifth monolith anion exchanger is shown.

The fifth monolith anion exchanger is a material obtained by introducing the anion exchange groups into the composite monolith, and is a composite structural body comprising an organic porous body which comprises a continuous skeletal phase and a continuous porous phase, and a number of particle bodies having a diameter of 4 to 40 µm fixed to the surface of the skeleton of the organic porous body or a number of protrusions having a size of 4 to 40 µm formed onto the surface of the skeleton of the organic porous body. In the present specification, the "particle bodies" and the "protrusions" are sometimes referred to "particle bodies, etc." Further, the composite monolith anion exchanger comprises a thickness of 1 mm or more, an average diameter of the pores in a wet state of 10 to 300 µm, a total pore volume of 0.5 to 10 mL/g, an ion exchange capacity per a volume in a wet state of 0.2 mg equivalent/mL or more, and the ion exchange groups being uniformly distributed in the composite structural body.

The continuous skeletal phase and the continuous porous phase of the composite monolith anion exchanger can be observed by an SEM image. The basic structure of the composite monolith anion exchanger may be mentioned a continuous macropore structure and a co-continuous structure. The skeletal phase of the composite monolith anion exchanger appears as a columnar continuous body, a continuous body having a concave wall surface, or a composite body thereof, and has a shape clearly different from the particle shape and protrusion shape.

A preferred structure of the composite monolith, i.e., the organic porous body before introducing the anion exchange groups may be mentioned a continuous macropore structural body in which bubble-like macropores are overlapped with each other, and the overlapped portion is an opening having an average diameter in a dry state of 10 to 150 µm (hereinafter also referred to as the "fifth-1 composite monolith"), and a co-continuous structural body comprising three-dimensionally continuous skeletons having an average thickness in a dry state of 0.8 to 40 µm and three-dimensionally continuous pores having an average diameter in a dry state of 10 to 200 µm between the skeletons (hereinafter also referred to as the "fifth-2 composite monolith").

The composite monolith anion exchanger according to the present invention is preferably a composite monolith anion exchanger in which the anion exchange groups are introduced into the fifth-1 composite monolith (hereinafter also referred to as the "fifth-1 composite monolith anion exchanger") and a composite monolith anion exchanger in which the anion exchange groups are introduced into the fifth-2 composite monolith (hereinafter also referred to as the "fifth-2 composite monolith anion exchanger").

In the case of the fifth-1 composite monolith anion exchanger, the fifth-1 composite monolith anion exchanger has a continuous macropore structural body in which bubble-like macropores are overlapped with each other and the overlapped portions are openings (mesopores) having an average diameter in a wet state of 10 to 150 µm, preferably 20 to 150 µm, particularly preferably 30 to 150 µm, and inside of the bubbles formed by the macropore and the openings (mesopores) become a flow passage. The continuous macropore structure preferably comprises a material having a uniform structure in which a size of the macropore and a diameter of the openings are uniform, but it is not limited thereto, and it may be a material in which nonuniform macropores larger than the size of the uniform macropore in the uniform structure may be dotted.

If the average diameter of the openings in a wet state of the fifth-1 composite monolith anion exchanger is less than 10 µm, it is not preferred since the pressure loss at the time of liquid flow becomes: large, while if the average diameter of the openings in a wet state exceeds 150 µm, it is not preferred since contact of the organic liquid, the monolith anion exchanger and the platinum group metal nanoparticles carried thereon becomes insufficient, and as a result, removal characteristics of the organic peroxide are lowered.

The average diameter of the openings of the fifth-1 composite monolith anion exchanger in a wet state is a value calculated by multiplying the average diameter of the openings of the composite monolith anion exchanger in a dry state by the swelling ratio, and the method of calculation is the same as the method used in the first monolith so that its explanation is omitted.

In the case of the fifth-2 composite monolith anion exchanger, the fifth-2 composite monolith anion exchanger is a co-continuous structure comprising the three-dimensionally continuous skeleton having an average thickness in a wet state of 1 to 60 µm, preferably 5 to 50 µm, and the three-dimensionally continuous pores having an average diameter in a wet state of 10 to 200 µm, preferably 15 to 180 µm between the skeletons.

If three-dimensionally continuous the average diameter in a wet state of the pores of the fifth-2 composite monolith anion exchanger is less than 10 µm, it is not preferred since the pressure loss at the time of liquid flow becomes large, while if it exceeds 200 µm, contact of the organic liquid, the monolith anion exchanger and the platinum group metal nanoparticles carried thereon becomes insufficient, and as a result, the organic peroxide removal characteristics are lowered so that it is not preferred. Also, if the average thickness of the skeleton of the fifth-2 composite monolith anion exchanger in a wet state is less than 1 µm, it is not preferred since there is a defect that the anion exchange capacity per a volume is lowered, and mechanical strength is lowered and the monolith anion exchanger is largely deformed particularly when the liquid is flown at a high flow rate.

On the other hand, if the average thickness of the skeleton of the fifth-2 composite monolith anion exchanger in a wet state exceeds 50 µm, it is not preferred since the skeleton becomes too thick, the pressure loss at the time of liquid flow increases.

The average diameter in a wet state of the pores of the above-mentioned fifth-2 composite monolith anion exchanger is a value calculated by multiplying the average diameter of the openings of the composite monolith anion exchanger in a dry state by the swelling ratio, and the method for calculation is the same method to be used in the third monolith so that it is omitted.

The total pore volume of the fifth-2 composite monolith anion exchanger is 0.5 to 10 mL/g. If the total pore volume is less than 0.5 mL/g, it is not preferred since the pressure loss at the time of liquid flow becomes large, and further an amount of the permeated liquid per a unit cross-sectional area becomes small and the amount of a treatment liquid is lowered. On the other hand, if the total pore volume exceeds 10 mL/g, it is not preferred since the anion exchange capacity per a volume is lowered, a carried amount of the platinum group metal nanoparticles is lowered and the catalytic effect is lowered. It is also not preferred since mechanical strength is lowered and the monolith anion exchanger is largely deformed particularly when the liquid is flown at a high flow rate. It is further not preferred since contact efficiency of the organic liquid and the monolith anion exchanger is lowered so that the organic peroxide removal effect is lowered.

If the size and the total pore volume of the three-dimensionally continuous pores are within the above-mentioned ranges, contact with the organic liquid is extremely uniform, the contact area is large, and it is possible to pass the liquid with a low pressure loss. The total pore volume of the monolith (the monolith intermediate, the monolith and the monolith anion exchanger) is the same in both of a dry state and a wet state.

The average diameter of the pores of the composite monolith anion exchanger in a wet state is 10 to 200 µm. In the case of the fifth-1 composite monolith anion exchanger, a preferred value of the pore size of the composite monolith anion exchanger in a wet state is 20 to 150 µm, and in the case of the fifth-2 composite monolith anion exchanger, a preferred value of the pore size of the composite monolith anion exchanger in a wet state is 15 to 180 µm.

In the composite monolith anion exchanger according to the present invention, a diameter of the particle body and a size of the protrusion in a wet state are 4 to 40 µm, preferably 4 to 30 µm, particularly preferably 4 to 20 µm. In the present invention, both of the particle body and the protrusion are observed at the surface of the skeleton as a projected shape, and what is observed in the granular form is called a particle body and a projected shape which cannot be said to be granular is referred to as a protrusion.

In FIGS. 8A-8E, schematic sectional views of the protrusions are shown. As shown in FIGS. 8A-8E, a projected shape material protruded from a surface of a skeleton 1 is a protrusion 2, and the protrusion 2 may be mentioned a shape close to a granular shape like a protrusion 2a shown in FIG. 8A, a hemispherical shape like a protrusion 2b shown in FIG. 8B and a rising of the surface of the skeleton like a protrusion 2c shown in FIG. 8C, etc. Further, as the others, in the protrusion 2, there are a shape in which the length in the direction perpendicular to the surface of the skeleton 1 is longer than the direction planar to the surface of the skeleton 1 like a protrusion 2d shown in FIG. 8D and a shape protruding in a plurality of directions like a protrusion 2e shown in FIG. 8E. The size of the protrusion is judged from the SEM image obtained by SEM observation and indicates the length of the portion where the width of each protrusion is the largest in the SEM image.

In the composite monolith anion exchanger according to the present invention, a ratio occupied by the particle bodies, etc., having 4 to 40 µm in a wet state based on the whole particle bodies, etc., is 70% or more, preferably 80% or more. The ratio occupied by the particle bodies, etc., having 4 to 40 µm in a wet state based on the whole particle bodies, etc., indicates a ratio of the numbers of the particle bodies, etc., having 4 to 40 µm in a wet state based on the number of the whole particle bodies, etc. In addition, the surface of the skeletal phase is covered by the whole particle bodies, etc., with 40% or more, preferably 50% or more.

The covering ratio of the surface of the skeletal layer by the whole particle bodies, etc., refers to the area ratio on the SEM image when observing the surface by SEM, that is, the area ratio when the surface is viewed in a plan view. If the size of the particles covering the wall surface or the skeleton deviates from the above-mentioned range, it is not preferred since the effect of improving the contact efficiency between the fluids, the surface of the skeleton of the composite monolith anion exchanger and the interior of the skeleton is undesirably reduced. Incidentally, the whole particle bodies, etc., refer to all the particle bodies and the protrusions formed on the surface of the skeletal layer including the particle bodies and the protrusions in the range of the sizes other than the particle bodies, etc., having 4 to 40 µm in a wet state.

A diameter or a size in a wet state of the particle bodies, etc., fixed onto the surface of the skeleton of the above-mentioned composite monolith anion exchanger is a value calculated by multiplying a diameter or a size of the particle bodies, etc., obtained by observation of the SEM image of the composite monolith anion exchanger in a dry state by the swelling ratio when it is changed from a dry state to a wet state, or a value calculated by multiplying a diameter or a size of the particle bodies, etc., obtained by observation of the SEM image of the composite monolith in a dry state before introducing the anion exchange groups by the swelling ratio before and after introduction of the anion exchange groups.

More specifically, when the diameter of the composite monolith anion exchanger in a wet state was x4 (mm), the diameter of the composite monolith anion exchanger in a dry state obtained by drying the composite monolith anion exchanger in a wet state was y4 (mm), and the diameter or the size of the particle bodies, etc., in the SEM image when the composite monolith anion exchanger in a dry state was subjected to SEM observation was z4 (µm), the diameter or the size (µm) of the particle bodies, etc., of the composite monolith anion exchanger in a wet state can be calculated by the following formula: the "diameter or the size (µm) of the particle bodies, etc., of the composite monolith anion exchanger in a wet state=z4×(x4/y4)".

Then, the diameters or the sizes of whole particle bodies, etc., observed in the SEM image of the composite monolith anion exchanger in a dry state are measured, and based on the values, the diameter or the size in a wet state of the whole particle bodies, etc., in one visual field of the SEM image was calculated. The SEM observation of the composite monolith anion exchanger in a dry state is carried out at least three times, the diameter or the size of the whole particle bodies, etc., in a wet state in the SEM image was calculated in the entire visual fields, and whether the particle bodies, etc., with the diameter or the size of 4 to 40 µm can be observed or not is confirmed. When it can be confirmed in the entire visual field, it is judged as the particle bodies, etc., having a diameter or a size of 4 to 40 µm in a wet state are formed on the surface of the skeleton of the composite monolith anion exchanger.

Further, according to the above, the diameter or the size of the whole particle bodies, etc., in a wet state in the SEM image was calculated by each one visual field, and a ratio of the particle bodies, etc., having 4 to 40 µm in a wet state occupied in the whole particle bodies, etc., is obtained with each view field. When the ratio of the particle bodies, etc., having 4 to 40 μm in a wet state occupied in the whole particle bodies, etc., is 70% or more in the entire visual field, then, the ratio of the particle bodies, etc., having 4 to 40 μm in a wet state occupied in the whole particle bodies, etc., formed on the surface of the skeleton of the composite monolith anion exchanger is judged to be 70% or more.

Moreover, according to the above, a covered ratio of the surface of the skeletal layer by the whole particle bodies, etc., in the SEM image is obtained by each one visual field, and in the entire visual field, when the covered ratio of the surface of the skeletal layer by the whole particle bodies, etc., is 40% or more, then, the ratio in which the surface of the skeletal layer of the composite monolith anion exchanger is covered by the whole particle bodies, etc., is judged to be 40% or more.

When the diameter or the size of the particle bodies, etc., of the composite monolith in a dry state before introducing the anion exchange groups, and the swelling ratio of the composite monolith anion exchanger in a wet state to the composite monolith in a dry state when the anion exchange groups are introduced into the monolith in a dry state are known, the diameter or the size of the particle bodies, etc., of the composite monolith in a dry state is multiplied by the swelling ratio to calculate the diameter or the size of the particle bodies, etc., of the composite monolith anion exchanger in a wet state, and in the same manner as mentioned above, the diameter or the size of the particle bodies, etc., of the composite monolith anion exchanger in a wet state, the ratio of the particle bodies, etc., having 4 to 40 μm in a wet state occupied in the whole particle bodies, etc., and the covered ratio of the surface of the skeletal layer by the particle bodies, etc., may be obtained.

In the composite monolith anion exchanger according to the present invention, if the covered ratio of the surface of the skeletal phase by the particle bodies, etc., is less than 40%, it is not preferred since the effect of improving contact efficiency of the organic liquid and the inside of the skeleton and the surface of the skeleton of the composite monolith anion exchanger becomes small, so that the improved effect of removing characteristics of the organic peroxide is lowered. A method for measuring the covered ratio by the above-mentioned particle bodies, etc., may be mentioned an image analysis method by the SEM image of the composite monolith anion exchanger.

The total pore volume of the composite monolith anion exchanger according to the present invention is 0.5 to 10 mL/g, preferably 0.8 to 7 mL/g.

If the total pore volume of the composite monolith anion exchanger is less than 0.5 mL/g, it is not preferred since the pressure loss at the time of liquid flow becomes large, and further an amount of the permeated liquid per a unit cross-sectional area becomes small whereby the treatment capacity is lowered. On the other hand, if the total pore volume of the composite monolith anion exchanger exceeds 10 mL/g, mechanical strength is lowered and the composite monolith anion exchanger is largely deformed particularly when the liquid is flown at a high flow rate. It is further not preferred since contact efficiency of the organic liquid, the composite monolith anion exchanger and the platinum group metal nanoparticles carried thereon is lowered, so that the catalytic effect is also lowered. The total pore volumes of the monolith intermediate, the composite monolith and the composite monolith anion exchanger are the same in both of a dry state and a wet state.

The composite monolith anion exchanger according to the present invention has an anion exchange capacity per a volume in a wet state of 0.2 mg equivalent/mL or more, preferably the anion exchange capacity of 0.3 to 1.8 mg equivalent/mL.

If the anion exchange capacity per a volume of the composite monolith anion exchanger is less than 0.2 mg equivalent/mL, it is not preferred since a carried amount of the platinum group metal nanoparticles per a volume is lowered. On the other hand, if the anion exchange capacity per a volume of the composite monolith anion exchanger exceeds 1.8 mg equivalent/mL, it is not preferred since the pressure loss at the time of liquid flow becomes large. The anion exchange capacity per a mass in a dry state of the composite monolith anion exchanger according to the present invention is not particularly limited, and is 3 to 6 mg equivalent/g since the anion exchange groups are uniformly introduced into the surface of the skeleton and the inside of the skeleton of the monolith anion exchanger. The anion exchange capacity of the organic porous anion exchanger into which the anion exchange groups have been introduced only the surface of the skeleton cannot be determined universally depending on the kind of the organic porous body or the anion exchange group, and it is at most 500 μg equivalent/g.

In the composite monolith anion exchanger according to the present invention, a material constituting the skeletal phase of the continuous pore structure is an organic polymer material having a crosslinking structure. A crosslinking density of the polymer material is not particularly limited, and the crosslinking structure unit is preferably contained in an amount of 0.3 to 10 mol %, suitably 0.3 to 5 mol % based on the whole constitutional unit constituting the polymer material. If the crosslinking structure unit is less than 0.3 mol %, it is not preferred since mechanical strength is insufficient, and on the other hand, if it exceeds 10 mol %, it is not preferred since introduction of the anion exchange groups becomes difficult, whereby an introduced amount is reduced in some cases.

The kind of the polymer material is not particularly limited and, for example, at polymer material constituting the first monolith may be used so that its explanation is omitted.

In the composite monolith anion exchanger according to the present invention, a material constituting the skeletal phase of the organic porous body and the particle bodies, etc., formed on the surface of the skeletal phase may be mentioned the same material in which the same structure is continued and a material in which not the same tissues are continued, which are made of different materials with each other. As the material in which not the same tissues are continued, which are made of different materials with each other, in the case of the materials in which a kind of the vinyl monomers is different from each other, there may be mentioned the case where the kinds of the vinyl monomer and the crosslinking agent are the same but the formulation ratio thereof is different, etc.

The anion exchange group of the composite monolith anion exchanger according to the present invention is the same as the anion exchange group in the first monolith anion exchanger, so that its explanation is omitted. In the second monolith anion exchanger, the introduced anion exchange groups are uniformly distributed not only at the surface of the porous body but also at the inside of the skeleton of the porous body. The definition of uniformly distributed is the same as the definition of uniformly distributed in the first monolith anion exchanger.

The composite monolith anion exchanger according to the present invention has a thickness of 1 mm or more, which is differentiated from the porous body in a film state. If the thickness is less than 1 mm, it is not preferred since the ion exchange capacity per one porous body becomes extremely low. The thickness of the composite monolith anion exchanger according to the present invention is preferably 3 to 1,000 mm. In the composite monolith anion exchanger according to the present invention, the basic structure of the skeleton is a continuous pore structure so that mechanical strength is high.

<Producing Method of Composite Monolith Anion Exchanger>

The composite monolith anion exchanger according to the present invention can be obtained by subjecting to the processes of Step I in which a mixture of an oil-soluble monomer containing no anion exchange group, a surfactant and water is stirred to prepare a water droplets in oil type emulsion, then, the water droplets in oil type emulsion is polymerized to obtain a monolithic organic porous intermediate (monolith intermediate) having a continuous macropore structure with a total pore volume of 5 to 30 mL/g, Step II in which a mixture comprising a vinyl monomer, a crosslinking agent having at least two or more vinyl groups in one molecule, an organic solvent which dissolves the vinyl monomer or the crosslinking agent but does not dissolve a polymer formed by polymerization of the vinyl monomer and a polymerization initiator is prepared, Step III in which the mixture obtained in Step II is polymerized in a stationary state in the presence of the monolith intermediate obtained in Step I to obtain a composite monolith having a composite structure, and a step of introducing the anion exchange groups into the composite monolith obtained in the Step III.

In the process for producing the composite monolith anion exchanger according to the present invention, Step I may be carried out in accordance with the method disclosed in JP 2002-306976A.

(Producing Method of Monolith Intermediate)

In the production of the monolith intermediate of Step I, the oil-soluble monomer containing no ion exchange group is the same as the oil-soluble monomer used for producing the first monolith anion exchanger, so that its explanation is omitted.

The surfactant is the same as the surfactant used in Step I of the first monolith anion exchanger, so that its explanation is omitted.

In addition, in Step I, a polymerization initiator may be used, if necessary, at the time of forming the water droplets in oil type emulsion. The polymerization initiator is the same as the polymerization initiator used in the production of the first monolith anion exchanger, so that its explanation is omitted.

The mixing method at the time of mixing an oil-soluble monomer containing no ion exchange group, a surfactant, water and a polymerization initiator to form a water droplets in oil type emulsion is the same as the mixing method in Step I of the first monolith anion exchanger, so that its explanation is omitted.

The monolith intermediate obtained in Step I has a continuous macropore structure. When this is allowed to coexist in the polymerization system, particle bodies, etc., are formed on the surface of the skeletal phase having a continuous macropore structure, or particle bodies, etc., are formed on the surface of the skeletal phase having a co-continuous structure using the structure of the monolith intermediate as a mold. Also, the monolith intermediate is an organic polymer material having a crosslinking structure. A crosslinking density of the polymer material is not particularly limited, and the crosslinking structure unit is preferably contained in an amount of 0.3 to 10 mol %, preferably 0.3 to 5 mol % based on the whole constitutional unit constituting the polymer material. If the crosslinking structure unit is less than 0.3 mol %, it is not preferred since mechanical strength is insufficient. On the other hand, if it exceeds 10 mol %, it is not preferred since flexibility of the porous body is lost, and introduction of the anion exchange groups becomes difficult in some cases.

A kind of the polymer material of the monolith intermediate is not particularly limited, and the same polymer material as the above-mentioned composite monolith may be mentioned. According to this constitution, the same polymer is formed at the skeleton of the monolith intermediate whereby a monolith having a composite structure can be obtained.

The total pore volume of the monolith intermediate is 5 to 30 mL/g, preferably 6 to 28 mL/g. If the total pore volume of the monolith intermediate is too small, it is not preferred since the total pore volume of the monolith obtained after polymerization of the vinyl monomer becomes too small and the pressure loss at the time of fluid permeation becomes large. On the other hand, if the total pore volume of the monolith intermediate is too large, it is not preferred since the structure of the composite monolith obtained after polymerization of the vinyl monomer tends to be nonuniform and it causes structural collapse in some cases. For making the total pore volume of the monolith intermediate the above-mentioned numerical range, a ratio (mass) of the monomer and water may be made approximately 1:5 to 1:35.

If the ratio of the monomer and water is made approximately 1:5 to 1:20, a material having a continuous macropore structure with the total pore volume of 5 to 16 mL/g of the monolith intermediate can be obtained, and the composite monolith obtained by subjecting to Step III becomes the fifth-1 composite monolith. Also, if the formulation ratio is made approximately 1:20 to 1:35, the total pore volume of the monolith intermediate exceeds 16 mL/g, and a material having a continuous macropore structure of 30 mL/g or less can be obtained and the composite monolith obtained by subjecting to Step III becomes the fifth-2 composite monolith.

The monolith intermediate has an average diameter of the opening (mesopore) which is an overlapping part of macropores and macropores in a dry state is 20 to 200 μm. If the average diameter of the openings in a dry state of the monolith intermediate is less than 20 μm, it is not preferred since the opening diameter of the monolith obtained after polymerization of the vinyl monomer becomes small and the pressure loss at the time of liquid flow becomes large. On the other hand, if the average diameter of the openings in a dry state of the monolith intermediate exceeds 200 μm, it is not preferred since the opening diameter of the monolith obtained after polymerization of the vinyl monomer becomes too large, contact between the organic liquid and the monolith anion exchanger becomes insufficient, and as a result, the organic peroxide removal characteristics are lowered. The monolith intermediate preferably comprises a material having a uniform structure in which a size of the macropore and a diameter of the opening are uniform, but it is not limited thereto, and it may be a material in which nonuniform macropores larger than the size of the uniform macropore in the uniform structure may be dotted.

(Producing Method of Composite Monolith)

Step II is a step of preparing a mixture comprising a vinyl monomer, a second crosslinking agent having at least two or more vinyl groups in one molecule, an organic solvent which dissolves the vinyl monomer or the second crosslinking agent but does not dissolve a polymer formed by polymerization of the vinyl monomer and a polymerization initiator. There is no order in Step I and Step II, Step II may be carried out after Step I, or Step I may be carried out after Step II.

The vinyl monomer to be used in Step II is the same as the vinyl monomer used in the third monolith anion exchanger, so that its explanation is omitted.

An amount of these vinyl monomers to be added is 3 to 50-fold, preferably 4 to 40-fold in mass based on the monolith intermediate to be co-presented at the time of polymerization. If the amount of the vinyl monomer to be added is less than 3-fold, it is not preferred since the particle bodies cannot be formed at the skeleton of the formed monolith and the anion exchange capacity per a volume after introduction of the anion exchange group becomes small. On the other hand, if the amount of the vinyl monomer to be added exceeds 50-fold, it is not preferred since the opening diameter becomes small and the pressure loss at the time of liquid flow becomes large.

The crosslinking agent to be used in Step II suitably used is a material containing at least two polymerizable vinyl groups in the molecule and having high solubility in the organic solvent. Specific examples of the crosslinking agent may be mentioned divinylbenzene, divinyl naphthalene, divinyl biphenyl, ethylene glycol dimethacrylate, trimethylolpropane triacrylate, butanediol diacrylate, etc. These crosslinking agents may be used a single kind alone or two or more kinds in combination. Preferred crosslinking agent is an aromatic polyvinyl compound such as divinylbenzene, divinyl naphthalene, divinyl biphenyl, etc., from high mechanical strength and stability to hydrolysis.

An amount of the crosslinking agent to be used is preferably 0.3 to 20 mol %, particularly 0.3 to 10 mol % based on the total amount of the vinyl monomer and the crosslinking agent. If the amount of the crosslinking agent to be used is less than 0.3 mol %, it is not preferred since mechanical strength of the monolith is insufficient. On the other hand, if it exceeds 20 mol %, it is not preferred since embrittlement of the monolith proceeds and flexibility is lost, and the introduction amount of the anion exchange group sometimes lowers.

The organic solvent to be used in Step II is the same as the organic solvent to be used in Step II of the third monolith anion exchanger, so that its explanation is omitted.

The polymerization initiator is the same as the polymerization initiator to be used in Step II of the third monolith anion exchanger, so that its explanation is omitted.

Step III is a step in which the mixture obtained in Step II is polymerized in a stationary state in the presence of the monolith intermediate obtained in Step I to obtain a composite monolith. The monolith intermediate to be used in Step III plays an extremely important role in creating the composite monolith having the novel structure of the present invention. As disclosed in JP H7-501140A, etc., when the vinyl monomer and the crosslinking agent are subjected to standing polymerization in the specific organic solvent in the absence of the monolith intermediate, a particle agglomeration type monolithic organic porous body can be obtained. To the contrary, when the monolith intermediate is present in the above-mentioned polymerization system as in the present invention, the structure of the composite monolith after polymerization changes drastically, and not a particle agglomeration structure but a composite monolith having the above-mentioned specific skeletal structure can be obtained.

An inner volume of the reaction apparatus is not particularly limited as long as it has a size which can exist the monolith intermediate in the reaction apparatus, and it may be either of one that forms a gap around the monolith in a plan view when the monolith intermediate is placed in the reaction apparatus, or one in which the monolith intermediate enters in the reaction apparatus without gaps. Among these, an apparatus in which a thick-boned monolith after polymerization enters in the reaction apparatus without gaps and without receiving pressure from the inner wall of the apparatus is efficient since no distortion is generated in the monolith and no waste of reaction raw materials, etc., is generated. Even when the inner volume of the reaction apparatus is large and gaps are present around the monolith after polymerization, the vinyl monomer and the crosslinking agent are adsorbed and distributed to the monolith intermediate, so that no particle agglomeration structure product is formed at the gap portion in the reaction apparatus.

In Step III, the monolith intermediate is placed in the state of being impregnated by the mixture (solution) in the reaction apparatus. A formulation ratio of the mixture obtained in Step II and the monolith intermediate is suitable to formulate that an amount of the vinyl monomer to be added is 3 to 50-fold, preferably 4 to 40-fold in mass based on the monolith intermediate, as mentioned above. According to this constitution, if is possible to obtain a composite monolith having a specific skeleton can be obtained while having a suitable opening diameter. In the reaction apparatus, the vinyl monomer and the crosslinking agent in the mixture are adsorbed and distributed to the skeleton of the stationary placed monolith intermediate, and the polymerization proceeds in the skeleton of the monolith intermediate.

The polymerization conditions may be selected various conditions depending on the kind of the monomers and the kind of the initiator. For example, when 2,2'-azobis(isobutyronitrile), 2,2'-azobis(2,4-dimethylvaleronitrile), benzoyl peroxide, lauroyl peroxide, etc., are used as the initiator, polymerization may be carried out in a sealed apparatus under inert atmosphere at 20 to 100° C. for 1 to 48 hours. According to the polymerization under heating, the vinyl monomer and the crosslinking agent adsorbed and distributed to the skeleton of the monolith intermediate are polymerized in the skeleton to form the specific skeletal structure. After completion of the polymerization, the product is taken out and extracted by a solvent such as acetone, etc., for the purpose of removing the unreacted vinyl monomer and the organic solvent to obtain a composite monolith having a specific skeletal structure.

When the above-mentioned composite monolith is produced, if Step II or Step III is carried out under the conditions satisfying at least one conditions among the following conditions (1) to (5), a composite monolith in which the particle bodies, etc., have been formed onto the surface of the skeleton which is a characteristic structure of the present invention can be produced.

(1) The polymerization temperature in Step III is at least 5° C. lower than the 10 hour half-life temperature of the polymerization initiator.

(2) The mol % of the crosslinking agent used in Step II is 2-fold or more of the mol % of the crosslinking agent used in Step I.

(3) The vinyl monomer used in Step II is a vinyl monomer having a different structure from the oil-soluble monomer used in Step I.

(4) The organic solvent used in Step II is a polyether having a molecular weight of 200 or more.

(5) A concentration of the vinyl monomer used in Step II is 30% by mass or less in the mixture of Step II.

(Explanation of the Above-Mentioned (1))

The 10 hour half-life temperature is a characteristic value of the polymerization initiator, and when the polymerization initiator to be used is determined, the 10 hour half-life temperature can be known. If there is a desired 10 hour half-life temperature, a polymerization initiator corresponding thereto may be selected. In Step III, by lowering the polymerization temperature, the polymerization rate is lowered, and the particle bodies, etc., can be formed onto the surface of the skeletal phase. The reason thereof can be considered that lowering in the monomer concentration at the inside of the skeletal phase of the monolith intermediate becomes gentle and the rate of monomer distribution from the liquid phase part to the monolith intermediate is lowered, so that excess monomer is concentrated in the vicinity of the surface of the skeletal layer of the monolith intermediate and polymerized at the place.

Preferred polymerization temperature is a temperature at least 10° C. lower than the 10 hour half-life temperature of the polymerization initiator to be used. The lower limit value of the polymerization temperature is not particularly limited, and the polymerization rate is lowered as the temperature lowers and the polymerization time becomes so long as to be unacceptable for practical use, so that the polymerization temperature is preferably set within the range of 5 to 20° C. lower than the 10 hour half-life temperature.

(Explanation of the Above-Mentioned (2))

When the mol % of the crosslinking agent used in Step II is set to 2-fold or more of the mol % of the crosslinking agent used in Step I and polymerization is carried out, a composite monolith having the composite structure according to the present invention can be obtained. The reason thereof is that compatibility between the monolith intermediate and the polymer produced by impregnation polymerization is lowered and phase separation proceeds, so that the polymer formed by the impregnation polymerization is excluded near the surface of the skeletal phase of the monolith intermediate, so that unevenness of the particle bodies, etc., is considered to be formed onto the surface of the skeletal phase. Incidentally, the mol % of the crosslinking agent is a crosslinking density mol %, and refers to an amount (mol %) of the crosslinking agent based on the total amount of the vinyl monomer and the crosslinking agent.

The upper limit of the mol % of the crosslinking agent used in Step II is not particularly limited, but the mol % of the crosslinking agent becomes remarkably large, it is not preferred since the problems are generated that crack occurs in the monolith after polymerization, embrittlement of the monolith proceeds and flexibility is lost and the introduced amount of the anion exchange group is lowered in some cases. Preferred multipliers of the mol % of the crosslinking agent is 2-fold to 10-fold. On the other hand, even when the mol % of the crosslinking agent used in Step I is set to 2-fold or more based on the mol % of the crosslinking agent used in Step II, formation of the particle bodies, etc., onto the surface of the skeletal phase does not occur, and the composite monolith according to the present invention could not be obtained.

(Explanation of the Above-Mentioned (3))

When the vinyl monomer used in Step II is a vinyl monomer having a different structure from the oil-soluble monomer used in Step I, a composite monolith having the composite structure according to the present invention can be obtained. For example, if the structure of the vinyl monomer is slightly different as in the styrene and the vinylbenzyl chloride, a composite monolith in which the particle bodies, etc., have been formed onto the surface of the skeletal phase can be formed. In general, two kinds of homopolymers obtained by two kinds of monomers having a slightly different structure are not compatible with each other.

Accordingly, when the polymerization is carried out in Step III by using, in Step II, a monomer having a different structure from the monomer used for formation of the monolith intermediate used in Step I, the monomer used in Step II is uniformly distributed or impregnated in the monolith intermediate but when a polymer is formed by the progress of the polymerization, the formed polymer does not compatible with the monolith intermediate so that phase separation proceeds and the formed polymer is excluded near the surface of the skeletal phase of the monolith intermediate whereby unevenness of the particle bodies, etc., is considered to be formed onto the surface of the skeletal phase.

(Explanation of the Above-Mentioned (4))

When the organic solvent used in Step II is a polyether having a molecular weight of 200 or more, a composite monolith having the composite structure according to the present invention can be obtained. The polyether has a relatively high affinity with the monolith intermediate, in particular, the cyclic polyether with a low molecular weight is a good solvent for the polystyrene, and the linear polyether with a low molecular weight has considerable affinity whereas it is not a good solvent. However, if the molecular weight of the polyether becomes large, affinity with the monolith intermediate is lowered drastically and it shows less affinity with the monolith intermediate. When such a solvent having less affinity is used as the organic solvent, diffusion of the monomer to the inside of the skeleton of the monolith intermediate is inhibited, and as a result, the monomer polymerizes only in the vicinity of the surface of the skeleton of the monolith intermediate, so that the particle bodies, etc., are formed onto the surface of the skeletal phase whereby unevenness is considered to be formed onto the surface of the skeleton.

The upper limit of the molecular weight of the polyether is not particularly limited as long as it is 200 or more, but it is too high molecular weight, it is not preferred since the viscosity of the mixture prepared in Step II becomes high and impregnation into the inside of the monolith intermediate becomes difficult. Preferred molecular weight of the polyether is 200 to 100,000, particularly preferably 200 to 10,000. The terminal structure of the polyether may be an unmodified hydroxyl group or may be etherified with an alkyl group such as a methyl group and an ethyl group, etc., or may be esterified with acetic acid, oleic acid, lauric acid, stearic acid, etc.

(Explanation of the Above-Mentioned (5))

If the concentration of the vinyl monomer used in Step II is 30% by mass or less in the mixture in Step II, a composite monolith according to the present invention can be obtained. By lowering the monomer concentration in Step II, the polymerization rate is lowered, and by the same reason as in the above-mentioned (1), the particle bodies, etc., can be formed onto the skeletal phase whereby unevenness can be formed onto the surface of the skeletal phase. The lower limit value of the monomer concentration is not particularly limited, but as the monomer concentration lowers, the polymerization rate also lowers and the polymerization time becomes so long as to be unacceptable for practical use, so that the monomer concentration is preferably set to 10 to 30% by mass.

As a preferred structure of the composite monolith thus obtained, i.e., the organic porous body having a composite structure before introducing the anion exchange groups, there may be mentioned a continuous macropore structural body (the "fifth-1 composite monolith") in which bubble-like macropores are overlapped with each other and the overlapping portion becomes an opening having an average diameter in a dry state of 5 to 120 µm and a co-continuous structural body (the "fifth-2 composite monolith") which comprises a three-dimensionally continuous skeleton having an average thickness in a dry state of 0.8 to 40 µm and a three-dimensionally continuous pores having a diameter in a dry state of 5 to 100 µm between the skeletons.

When the composite monolith is the fifth-1 monolith, the fifth-1 composite monolith has a continuous macropore structural body in which bubble-like macropores are overlapped with each other and the overlapping portion becomes an opening (mesopore) having an average diameter in a dry state of 10 to 120 µm, preferably 20 to 120 µm, particularly preferably 25 to 120 µm, and the inside of the bubbles formed by the macropore and the opening (mesopore) becomes a flow passage. The continuous macropore structure preferably comprises a material having a uniform structure in which a size of the macropore and a diameter of the opening are uniform, but it is not limited thereto, and it may be a material in which nonuniform macropores larger than the size of the uniform macropore in the uniform structure may be dotted.

If the average diameter of the openings in a dry state of the fifth-1 composite monolith is less than 10 µm, it is not preferred since the average diameter of the openings of the monolith anion exchanger after introduction of the anion exchange groups also become small and the pressure loss at the time of liquid flow becomes large, while if the average diameter of the openings in a dry state exceeds 120 µm, it is not preferred since the average diameter of the openings of the monolith anion exchanger after introduction of the anion exchange groups becomes too large, contact of the organic liquid, the monolith anion exchanger and the platinum group metal nanoparticles carried thereon becomes insufficient, and as a result, the organic peroxide removal characteristics are lowered.

In the case of the fifth-2 composite monolith, the fifth-2 composite monolith is a material comprising three-dimensionally continuous skeletons having an average thickness in a dry state of 0.8 to 40 µm, and a co-continuous structure having a three-dimensionally continuous pores having an average diameter in a dry state of 3 to 120 µm between the skeletons. If the average diameter in a dry state of the three-dimensionally continuous pores of the fifth-2 composite monolith is less than 8 µm, it is not preferred since the average diameter of the openings of the monolith anion exchanger after introduction of the anion exchange groups becomes also small and the pressure loss at the time of liquid flow becomes large, while if it exceeds 120 µm, it is not preferred since the average diameter of the openings of the monolith anion exchanger after introduction of the anion exchange groups becomes too large, contact of the organic liquid, the monolith anion exchanger and the platinum group metal nanoparticles carried thereon becomes insufficient, and as a result, the organic peroxide removal characteristics are lowered so that it is not preferred.

If the average thickness in a dry state of the fifth-2 composite monolith is less than 0.8 µm, it is not preferred since there is a defect that the anion exchange capacity per a volume of the monolith anion exchanger after introduction of the anion exchange groups is lowered, and mechanical strength is lowered and the monolith anion exchanger is largely deformed particularly when the liquid is flown at a high flow rate. On the other hand, if the average thickness in a dry state of the skeleton exceeds 40 µm, it is not preferred since the skeleton of the monolith anion exchanger after introduction of the anion exchange groups becomes too thick and the pressure loss at the time of liquid flow increases.

<Explanation of Sixth Monolith Anion Exchanger (Truncation Type Monolith Anion Exchanger)>

The sixth monolith anion exchanger comprises a continuous macropore structural body in which bubble-like macropores are overlapped with each other and the overlapped portion becomes an opening having an average diameter in a wet state of 20 to 300 µm, the surface-layer part of the skeletal part of the continuous macropore structural body is a porous structure, an anion exchange capacity per a volume in a wet state is 0.4 mg equivalent/mL or more, and anion exchange groups are uniformly distributed in the organic porous anion exchanger having a monolith structure.

Figure 9:
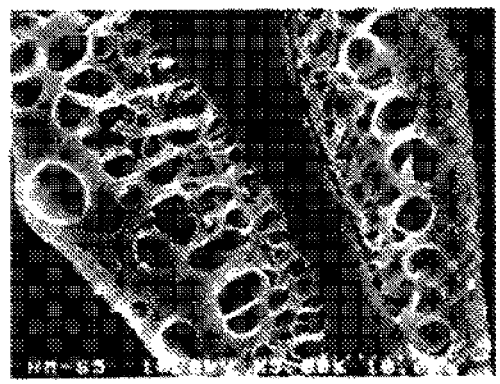
FIG. 9 is an SEM photograph of an example of the embodiment of the portion "A" in FIG. 10 of the sixth monolith anion exchanger.
Figure 10:
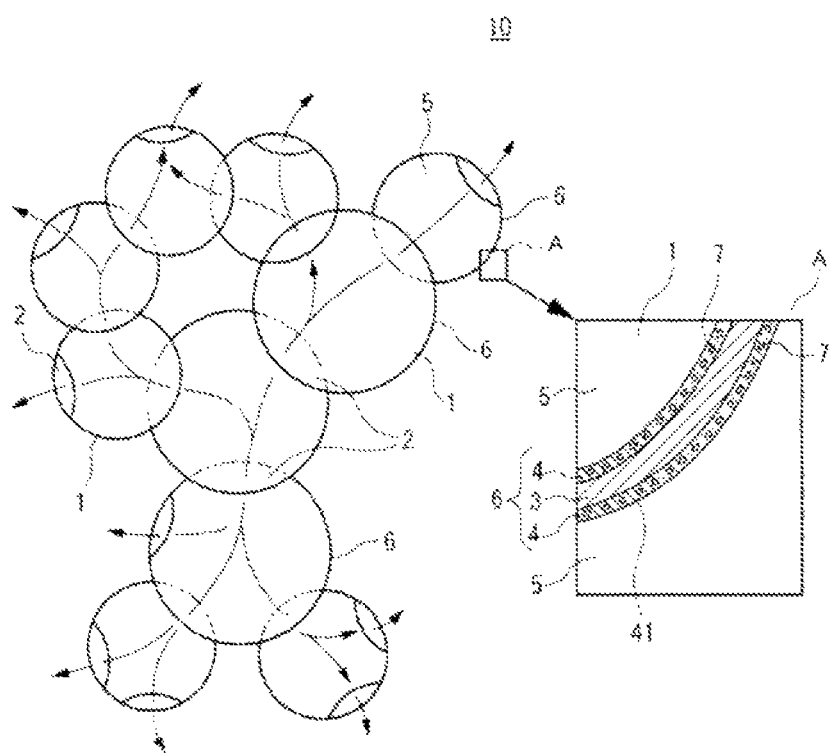
FIG. 10 is a schematic drawing of the basic structure of the sixth monolith anion exchanger.

In FIG. 9, a SEM photograph of an example of the embodiment of the portion "A" in FIG. 10 of the sixth monolith anion exchanger is shown, and in FIG. 10, a schematic drawing of the basic structure of the sixth monolith anion exchanger is shown.

Explanation is made by referring to FIG. 10 which is a schematic drawing of the basic structure of the sixth monolith anion exchanger. In FIG. 10, a rectangular drawing on the right side is an enlarged schematic view of the wall part (the skeletal part) A of the monolith anion exchanger. The monolith anion exchanger 10 is a continuous macropore structure in which bubble-like macropores 1 are overlapped with each other and the overlapping portion becomes common openings (mesopores) 2, an average diameter of the openings 2 in a wet state is 20 to 300 µm, preferably 20 to 200 µm, particularly 20 to 150 µm, and the inside of bubbles formed by the macropore 1 and the openings 2 becomes a flow passage.

The average diameter of the openings of the monolith anion exchanger is larger than the average diameter of the openings of the monolith since the entire monolith swells when anion exchange groups are introduced into the monolith. The continuous macropore structure preferably comprises a material having a uniform structure in which a size of the macropore and a diameter of the opening are uniform, but it is not limited thereto, and it may be a material in which nonuniform macropores larger than the size of the uniform macropore in the uniform structure may be dotted. If the average diameter of the openings (mesopores) in a wet state of the monolith anion exchanger is less than 20 µm, it is not preferred since the pressure loss at the time of liquid flow becomes large, while if the average diameter of the openings (mesopores) in a wet state exceeds 300 µm, it is not preferred since contact of the organic liquid, the monolith anion exchanger and the platinum group metal nanoparticles carried thereon becomes insufficient, and as a result, the organic peroxide removal characteristics are lowered.

The average diameter of the openings of the monolith anion exchanger in a wet state is a value calculated by multiplying the average diameter of the openings of the monolith anion exchanger in a dry state by the swelling ratio, and the method of the calculation is the same as the method used in the first monolith so that its explanation is omitted.

The monolith anion exchanger 10 has a porous structure at the surface-layer part of the skeleton, and the average diameter of the mesopore can be obtained by the mercury penetration method because a ratio of the surface-layer part occupied in the skeleton is small and further the porous structure comprises discontinuous pores such as "nest" in almost all the part thereof.

In the monolith anion exchanger 10, the skeletal part 6 of the continuous macropore structural body comprises an inner layer part 3 and a surface-layer part 4, and the surface-layer part 4 is a porous structure. That is, the porous structure is a structure in which countless fine pores 7 having a diameter in a wet state of 0.1 to 30 µm, particularly 0.1 to 15 µm are present in the surface-layer part 4, i.e., the cross-section of the surface-layer part is similar to a so-called honeycomb. A number of the fine pores 7 are independent from each other or some of the adjacent pores of which communicate with each other. The thickness of the surface-layer part 4 in a wet state is approximately 1 to 45 µm.

In FIG. 10, the reference numeral 5 is a vapor phase (bubble) part. The porous structure of the skeletal part 6 can be confirmed by an SEM (a secondary electron image by a scanning type electron microscope) image of the surface cutting the continuous macropore structural body (dried body). That is, the monolith anion exchanger 10 may be mentioned a material in which the fine pores 7 constituting the porous structure cannot be observed from the outside (hereinafter also referred to as an "integrated monolith anion exchanger") and a material in which the fine pores 7 constituting the porous structure can be observed from the outside at the edge surface such as a skeleton cut surface, etc., (hereinafter also referred to as a "truncated monolith anion exchanger").

The integrated monolith anion exchanger is a material which is taken out from the reaction apparatus and cutting is not applied thereto, and the truncated monolith anion exchanger is a material which is cut by a cutting tool, etc., having, for example, a dice shape. When the platinum group metal-carried catalyst of the present invention onto which the platinum group metal has been carried is used in the monolith anion exchanger according to the present invention as a catalyst, permeation of the liquid to the surface layer of the porous structure is fast, contact efficiency of the liquid and the anion exchange group becomes high and catalyst activity becomes high.

The fine pore diameter of the surface-layer part in a wet state of the above-mentioned continuous macropore structural body is a value obtained by subjecting to an SEM observation of the monolith anion exchanger in a dry state at least three times, measuring the fine pore diameters in the obtained image and calculating by multiplying the average value by the swelling ratio. More specifically, when the diameter of the monolith anion exchanger in a wet state was x2 (mm), the diameter of the monolith anion exchanger in a dry state obtained by drying the monolith anion exchanger in a wet state was y2 (mm), and the average value of the fine pore diameters measured in the obtained image by subjecting to an SEM observation of the monolith anion exchanger in a dry state at least three times was z2 (µm), the fine pore diameter (µm) in a wet state at the surface-layer part of the continuous structural body of the monolith anion exchanger can be calculated by the following formula "the fine pore diameter (µm) in a wet state at the surface-layer part of the continuous structural body of the monolith anion exchanger=z2×(x2/y2)".

When the fine pore diameter of the surface-layer part of the monolith in a dry state before introduction of the anion exchange groups, and the swelling ratio of the monolith anion exchanger in a wet state to the monolith in a dry state to which the anion exchange groups had been introduced into the monolith in a dry state are known, it is also possible to calculate the fine pore diameter of the surface-layer part of the monolith anion exchanger in a wet state by multiplying the fine pore diameter at the surface-layer part of the monolith in a dry state by the swelling ratio. The thickness of the surface-layer part of the monolith anion exchanger can be also calculated by the same method.

The truncated monolith anion exchanger has an extremely large specific surface area since the porous structure of the surface-layer part of the skeletal part appears on the surface, and in most cases, the specific surface area measured by drying the monolith anion exchanger is 20 to 70 m$^2$/g. Since the truncation type monolith anion exchanger has a large specific surface area, when the platinum group metal-carried catalyst of the present invention onto which the platinum group metal has carried is used as a catalyst, the contact area with the fluid is large and smooth circulation of the fluid becomes possible whereby excellent catalytic performance can be exhibited. In the present invention, the specific surface area of the monolith and the monolith anion exchanger is a value obtained by measuring the dried body by the mercury penetration method.

The monolith anion exchanger according to the present invention has an anion exchange capacity per a volume in a wet state of 0.2 mg equivalent/mL or more, preferably 0.2 to 1.8 mg equivalent/mL. If the anion exchange capacity of the monolith anion exchanger per a volume is less than 0.4 mg equivalent/mL, it is not preferred since a carried amount of the platinum group metal nanoparticles per a volume is lowered. On the other hand, if the anion exchange capacity of the monolith anion exchanger per a volume exceeds 1.8 mg equivalent/mL, it is not preferred since the pressure loss at the time of liquid flow becomes large. The anion exchange capacity per a mass in a dry state of the monolith anion exchanger according to the present invention is not particularly limited, and the anion exchange groups are uniformly introduced into the surface of the skeleton and the inside of the skeleton of the monolith anion exchanger so that it is 3 to 6 mg equivalent/g (dried body). The anion exchange capacity of the organic porous anion exchanger into which the ion exchange groups have been introduced only the surface of the skeleton cannot be determined universally depending on the kinds of the organic porous body and the anion exchange group, and it is at most 500 µg equivalent/g (dried body).

The anion exchange group in the sixth monolith anion exchanger is the same as the anion exchange group of the sixth monolith anion exchanger, so that its explanation is omitted. In the sixth monolith anion exchanger, the introduced anion exchange groups are uniformly distributed not only at the surface of the porous body but also at the inside of the skeleton of the porous body. The definition of uniformly distributed is the same as the definition of uniformly distributed in the first monolith anion exchanger.

The thickness of the monolith anion exchanger according to the present invention is 1 mm or more, and it is differentiated from the film state porous body. If the thickness is less than 1 mm, it is not preferred since the anion exchange capacity per a sheet of the porous body becomes markedly low. The thickness of the monolith anion exchanger according to the present invention is preferably 3 to 1,000 mm. In addition, the basic structure of the skeleton of the monolith anion exchanger according to the present invention is a continuous macropore structure so that its mechanical strength is high.

The monolith anion exchanger according to the present invention is a material having a total pore volume 0.5 to 10 mL/g, suitably 0.8 to 7 mL/g. If the total pore volume is less than 0.5 mL/g, it is not preferred since an amount of the permeated liquid or an amount of the permeated gas per a unit cross-sectional area becomes small and the treatment capacity is lowered. On the other hand, if the total pore volume exceeds 10 mL/g, it is not preferred since catalyst activity is lowered. In the present invention, the total pore volume of the monolith (the monolith intermediate, the monolith and the monolith anion exchanger) is a value measured by the mercury penetration method. The total pore volume of the monolith (the monolith intermediate, the monolith and the monolith anion exchanger) are the same in both of a dry state and a wet state.

The kind of the polymer material is not particularly limited and, for example, the polymer material which constitute the first monolith can be used so that its explanation is omitted.

<Producing Method of Monolith Anion Exchanger>

The monolith anion exchanger according to the present invention can be obtained by subjecting to the processes of Step I in which a mixture of an oil-soluble monomer containing no anion exchange group, a surfactant and water is stirred to prepare a water droplets in oil type emulsion, then, the water droplets in oil type emulsion is polymerized to obtain a monolithic organic porous intermediate (the monolith intermediate) having a continuous macropore structure which has a total pore volume of 5 to 16 mL/g, Step II which is a step of preparing a mixture comprising a vinyl monomer, a crosslinking agent having at least two or more vinyl groups in one molecule, an aliphatic alcohol having 3 to 9 carbon atoms and a polymerization initiator, wherein a concentration (% by mass) of the vinyl monomer in the mixture comprising the vinyl monomer, the crosslinking agent and the aliphatic alcohol is made 56 to 80%, or the concentration of the vinyl monomer is made 40% or more and less than 56% and an amount of the crosslinking agent based cm the total amount of the vinyl monomer and the crosslinking agent is made 0.1 to 1 mol %, Step III in which the mixture obtained in Step II is polymerized in a stationary state in the presence of the monolithic organic porous intermediate obtained in Step I to obtain a monolithic organic porous body (monolith), a step of introducing the anion exchange groups into the monolith obtained in Step III.

In the process for producing the monolith anion exchanger according to the present invention, Step I may be carried out in accordance with the method described in JP 2002-306976A.

(Producing Method of Monolith Intermediate)

The production of the monolith intermediate in Step I is the same as Step I of the fourth the monolith anion exchanger, so that its explanation is omitted.

(Producing Method of Monolith)

Step II is a step of preparing a mixture comprising a vinyl monomer, a second crosslinking agent having at least two or more vinyl groups in one molecule, an aliphatic alcohol having 3 to 9 carbon atoms and a polymerization initiator, the vinyl monomer, wherein a concentration (% by mass) of the vinyl monomer in the mixture comprising the vinyl monomer, the second crosslinking agent and the aliphatic alcohol is made 56 to 80%, or the concentration of the vinyl monomer is made 40% or more and less than 56% and an amount of the second crosslinking agent based on the total amount of the vinyl monomer and the second crosslinking agent is made 0.1 to 1 mol %. There is no order in Step I and Step II, Step II may be carried out after Step I, or Step I may be carried out after Step II.

The organic solvent used in Step II is the same as the organic solvent used in Step II of the third the monolith anion exchanger, so that its explanation is omitted.

When the concentration of the vinyl monomer (% by mass) in the mixture comprising the vinyl monomer, the second crosslinking agent and the aliphatic alcohol is 56 to 80%, the amount of the second crosslinking agent based on the total amount of the vinyl monomer and the second crosslinking agent is preferably 0.1 to 5 mol %, further preferably 0.3 to 4 mol %. On the other hand, when the concentration of the vinyl monomer in the mixture comprising the vinyl monomer, the second crosslinking agent and the aliphatic alcohol is 40% or more and less than 56%, the amount of the second crosslinking agent based on the total amount of the vinyl monomer and the second crosslinking agent is 0.1 to 1 mol %, preferably 0.2 to 1 mol %. If the concentration of the vinyl monomer is out of the above-mentioned range, introduction of the porous structure into the skeletal part cannot be recognized. Also, if the concentration of the vinyl monomer exceeds 80%, it is not preferred since removal of heat generated by the polymerization is difficult, which makes control of the polymerization reaction difficult.

An amount of the vinyl monomer to be added is 3 to 70-fold, preferably 4 to 50-fold in mass based on the monolith intermediate to be co-presented at the time of the polymerization. If the amount of the vinyl monomer to be added is less than 3-fold based on the monolith intermediate, it is not preferred since introduction of the porous structure into the skeletal part becomes difficult. On the other hand, if the amount of the vinyl monomer to be added exceeds 70-fold, it is not preferred since the opening diameter becomes small and the pressure loss at the time of liquid flow becomes large.

The second crosslinking agent used in Step II is the same as the cross-linking agent used in Step II of the third the monolith anion exchanger, so that its explanation is omitted.

The amount of the second crosslinking agent to be used may vary depending on the concentration of the vinyl monomer (% by mass) in the mixture comprising the vinyl monomer, the second crosslinking agent and the aliphatic alcohol, and it is preferably 0.1 to 5 mol %, particularly 0.2 to 5 mol % based on the total amount of the vinyl monomer and the second crosslinking agent. If the amount of the second crosslinking agent to be used is less than 0.1 mol %, it is not preferred since mechanical strength of the monolith is insufficient. On the other hand, if it exceeds 5 mol %, it is not preferred since introduction of the porous structure into the skeletal portion becomes difficult. The amount of the above-mentioned second crosslinking agent to be used is preferably used so that it becomes substantially equal to the crosslinking density of the monolith intermediate to be co-presented at the time of the polymerization of the vinyl monomer/the second crosslinking agent. If the amounts of both to be used are far apart from each other, the distribution of the crosslinking density is deviated in the generated monolith, and cracks are likely to occur at the time of the introducing reaction of the anion exchange groups.

The solvent used in Step II is an aliphatic alcohol having 3 to 9 carbon atoms. Specific examples of the aliphatic alcohol may be mentioned 1-propanol, 2-propanol, 1-butanol, isobutanol, sec-butanol, t-butanol, 1-pentanol, 1-hexanol, cyclohexanol, 1-octanol, 2-ethylhexanol, ethylene glycol, propylene glycol, tetramethylene glycol, glycerol, cellosolve, methyl cellosolve, butyl cellosolve, etc.

In addition, even if it is a solvent other than the above-mentioned aliphatic alcohol, it may be used by adding to the above-mentioned aliphatic alcohol when the amount to be used is a little. An amount of the aliphatic alcohol to be used is preferably so used that the concentration of the above-mentioned vinyl monomer is 40 to 80% by mass. When the amount of the aliphatic alcohol to be used is deviated from the above-mentioned range and the concentration of the vinyl monomer is less than 40%, it is not preferred since introduction of the porous structure into the skeletal portion becomes difficult. On the other hand, if the concentration of the vinyl monomer exceeds 80% by mass, it is not preferred since removal of heat generated by the polymerization is difficult, which makes control of the polymerization reaction difficult.

The polymerization initiator is the same as the polymerization initiator to be used in Step II for producing the third monolith anion exchanger, so that its explanation is omitted.

Step III is a step in which the mixture obtained in Step II is polymerized in a stationary state in the presence of the monolith intermediate obtained in Step I to obtain a monolith having thicker skeleton than the skeleton of the monolith intermediate and having the surface layer of the skeleton being a porous structure.

An inner volume of the reaction apparatus is the same as that of the reaction apparatus used for producing the third monolith anion exchanger, so that its explanation is omitted.

In Step III, the monolith intermediate is placed in the state of being impregnated by the mixture (solution) in the reaction apparatus. A formulation ratio of the mixture obtained in Step II and the monolith intermediate is suitable to formulate that an amount of the vinyl monomer to be added is 3 to 70-fold, preferably 4 to 50-fold in mass based on the monolith intermediate, as mentioned above. According to this constitution, it is possible to obtain a monolith in which the porous structure has been introduced in the skeleton while possessing an opening diameter. In the reaction apparatus, the vinyl monomer and the second crosslinking agent in the mixture are adsorbed and distributed to the skeleton of the stationary placed monolith intermediate, and the polymerization proceeds in the skeleton of the monolith intermediate. In the course of proceeding the polymerization, whereas the detail of the reason of forming the porous structure is unknown, but it can be considered that progress of the polymerization is nonuniform when the concentration of the vinyl monomer is markedly high or when the amount of the crosslinking agent is markedly little so that the crosslinking structure is unevenly distributed.

The polymerization conditions may be selected various conditions depending on the kind of the monomers and the kind of the initiator. For example, when 2,2'-azobis(isobutyronitrile), 2,2'-azobis(2,4-dimethylvaleronitrile), benzoyl peroxide, lauroyl peroxide, etc., are used as the initiator, polymerization may be carried out under heating at 30 to 100° C. for 1 to 48 hours in a sealed apparatus under inert atmosphere. According to the polymerization under heating, the vinyl monomer and the second crosslinking agent adsorbed and distributed to the monolith intermediate are polymerized in the skeleton to thicken the skeleton as well as form the porous structure in the skeleton. After completion of the polymerization, the product is taken out, and extracted with a solvent such as methanol and acetone, etc., for the purpose of removing the unreacted vinyl monomer and the organic solvent to obtain at monolith having a specific skeletal structure.

The monolith has a continuous macropore structure in which bubble-like macropores 1 are overlapped with each other and the overlapped portions are common openings (mesopores) 2, and an average diameter of the openings 2 in a dry state is 15 to 200 μm, preferably 15 to 150 μm, particularly 15 to 100 μm. The monolith has a porous structure at the surface-layer part of the skeleton similar to that of the monolith anion exchanger. The porous structure of the monolith is a structure in which countless fine pores 7 having a diameter in a dry state of 0.1 to 20 μm, particularly 0.1 to 10 μm are present in the surface-layer part 4 and the SEM cross-section is similar to a so-called honeycomb.

Next, a process for producing the monolith anion exchanger according to the present invention is explained. The process for producing the monolith anion exchanger is not particularly limited, and preferred is a method in which the monolith is produced by the above-mentioned process and then the anion exchange groups are introduced in the point that the porous structure of the obtained monolith anion exchanger can be strictly controlled.

The method for introducing the anion exchange groups into the first to the sixth monoliths is not particularly limited, and a conventionally known method of a polymerization reaction and a graft polymerization, etc., can be used. For example, as a method for introducing the quaternary ammonium group, when the monolith is a styrene-divinylbenzene copolymer, etc., there may be mentioned a method in which a chloromethyl group is introduced by using chloromethyl methyl ether, etc., and then, the resulting material is reacted with a tertiary amine, a method in which a monolith is prepared by copolymerization of chloromethylstyrene and divinylbenzene, and then, the resulting material is reacted with a tertiary amine, the method in which radical initiation groups or chain transfer groups are uniformly introduced into the surface of the skeleton and the inside of the skeleton of the monolith, and then, the resulting material is subjected to graft polymerization with N,N,N-trimethyl ammonium ethyl acrylate or N,N,N-trimethyl ammonium propyl acrylamide; and a method in which glycidyl methacrylate is similarly subjected to graft polymerization, and then, quaternary ammonium groups are introduced thereinto by conversion of the functional group, etc.

Among these methods, a method for introducing the quaternary ammonium group preferably used may be mentioned a method in which after introducing chloromethyl groups into the styrene-divinylbenzene copolymer by using chloromethyl methyl ether, etc., and then, the resulting material is reacted with a tertiary amine or a method in which a monolith is prepared by copolymerization of chloromethylstyrene and divinylbenzene, and then, the resulting material is reacted with a tertiary amine in the point that the ion exchange groups can be uniformly and quantitatively introduced. The ion exchange groups to be introduced may be mentioned a quaternary ammonium group such as a trimethyl ammonium group, a triethyl ammonium group, a tributyl ammonium group, a dimethylhydroxyethyl ammonium group, a dimethylhydroxypropyl ammonium group and a methyldihydroxyethyl ammonium group, etc., a tertiary sulfonium group and a phosphonium group, etc.

A pressure loss when a catalyst in which a platinum group metal carried onto the first to the sixth monolith anion exchangers is filled in a column and an organic liquid is permeated therethrough is preferably in the range of 0.001 to 0.1 MPa/m·LV, particularly 0.005 to 0.05 MPa/m·LV when it is shown by the pressure loss when a liquid is passed through a column filled with 1 m of the catalyst with a liquid flow linear velocity (LV) of 1 m/h (hereinafter referred to as "differential pressure coefficient").

<Anion Exchanger Having Monolith Structure in General>

The total pore volume of the anion exchanger having a monolith structure is preferably 1 to 50 mL/g, particularly preferably 2 to 30 mL/g. If the total pore volume is too small, the pressure loss becomes large, an amount of liquid flow per a unit cross-sectional area becomes small and the treatment capacity is lowered in some cases.

On the other hand, if the total pore volume is too large, mechanical strength is lowered and the material is deformed in some cases, and further, contact efficiency of the organic liquid and "an anion exchanger having a monolith structure" and the platinum group metal catalyst carried thereon is lowered so that the catalytic effect is lowered in some cases.

The total pore volume is a value measured by the mercury penetration method. The total pore volume is the same in both of a dry state and a wet state.

An anion exchange capacity per a mass in a dry state of the anion exchanger having a monolith structure is not particularly limited and is preferably 0.5 to 5.0 mg equivalent/g. If the anion exchange capacity is too little, a carried amount of the platinum group metal catalyst is lowered and removal efficiency of the organic peroxide is lowered in some cases.

On the other hand, if the anion exchange capacity is too large, volume change of the "anion exchanger having a monolith structure" due to change in an ionic form becomes large whereby cracks and crushing occur in the anion exchanger having a monolith structure in some cases.

An average particle size of the platinum group metal particle is generally 1 to 100 nm, preferably 1 to 50 nm, further preferably 1 to 20 nm. If the average particle size is too small, the possibility of particles being desorbed from the carrier becomes high, on the other hand, if the average particle size is too large, the surface area per a unit mass of a metal becomes small and the catalytic effect cannot efficiently be obtained in some cases.

A carried amount of the platinum group metal catalyst particle carried onto the anion exchanger having a monolith structure in a dry state is generally 0.004 to 20% by mass, preferably 0.005 to 15% by mass based on the whole carrier which is the "anion exchanger having a monolith structure onto which the platinum group metal catalyst has been carried".

If the carried amount is too little, the effect of removing the organic peroxide becomes insufficient in some cases. On the other hand, if the carried amount is too much, it is useless and separation of the platinum group metal catalyst particle may be observed in some cases.

A method of carrying the platinum group metal is not particularly limited, and particles which are the platinum group metal catalyst can be carried onto the anion exchanger having a monolith structure by the conventionally known method.

There may be mentioned, for example, a method in which the anion exchanger having a monolith structure in a dry state is dipped in an aqueous hydrochloric acid solution containing palladium chloride to adsorb the chloroplatinic anion to the anion exchanger having a monolith structure by ion exchange, then, the resulting material is contacted with a reducing agent to carry the palladium metal particles onto the anion exchanger having a monolith structure, and a method in which the anion exchanger having a monolith structure is filled in a column, an aqueous hydrochloric acid solution containing palladium chloride is passed therethrough to adsorb the chloroplatinic anion to the anion exchanger having a monolith structure by ion exchange, then, a reducing agent is passed through the column to carry the palladium metal particles onto the anion exchanger having a monolith structure, etc.

In addition, particles which are the platinum group catalyst may be carried onto the organic porous body having a monolith structure via the ligand-derived chemical structure. Particles which are platinum group catalysts may be supported on the organic porous body having a monolithic structure.

The reducing agent to be used at that time is not particularly limited, and may be mentioned a carboxylic acid such as formic acid, oxalic acid, citric acid and ascorbic acid, etc.; an aldehyde such as formaldehyde and acetaldehyde, etc.; sodium borohydride; and hydrazine, etc.

In the platinum group metal-carried catalyst, an ionic form of the anion exchanger having a monolith structure which is a carrier of the platinum group metal nanoparticles generally becomes a salt form such as a chloride form after the platinum group metal particle has been carried. In addition, the platinum group metal catalyst is preferably such a material that the ionic form of the anion exchanger having a monolith structure is regenerated to an $OH^-$ form and a $NO_3^-$ form, etc., since these materials show higher effect of removing the organic peroxide.

A method for regenerating the anion exchanger having a monolith structure to an $OH^-$ form is not particularly limited, and a conventionally known method such as passing a liquid of an aqueous sodium hydroxide solution, etc., may be used.

In the present invention, the "organic liquid which is a solvent of the resist for producing electronic parts or the organic acid ester-type liquid which is a rinsing liquid for producing electronic parts" which is an object from which the organic peroxide is to be removed is not particularly limited, and it may be applied to any of the organic acid ester-type liquids as long as it is an organic acid ester-type liquid to be used for such a purpose.

The above-mentioned "organic acid ester-type liquid" is not particularly limited, and may be mentioned a carboxylic acid ester-type liquid such as methyl acetate, ethyl acetate, propyl acetate, butyl acetate, methyl lactate, ethyl lactate, propyl lactate, butyl lactate, methyl pyruvate, ethyl pyruvate, butyl pyruvate, etc.

In the method for removing the organic peroxide of the present invention, it is carried out until the peroxide value (POV) of the organic acid ester-type liquid becomes preferably 2 mmol/kg or less, more preferably 1 mmol/kg or less, particularly preferably 0.5 mmol/kg or less, further preferably 0.3 mmol/kg or less, and most preferably 0.1 mmol/kg or less.

According to the present invention, it is possible to remove the organic peroxide until the peroxide value (POV) becomes 2 mmoL/kg or less, and when the peroxide value (POV) is 2 mmoL/kg or less, the above-mentioned effects of the present invention can be achieved to the organic acid ester-type liquid which is a solvent of the resist for producing electronic parts and to the organic acid ester-type liquid which is a rinsing liquid for producing electronic parts.

Particularly preferred is a method for removing the organic peroxide which comprises removing the organic peroxide in the above-mentioned organic acid ester-type liquid from the above-mentioned organic liquid having a peroxide value (POV) of 100 mmol/kg or less until the peroxide value (POV) becomes 2 mmoL/kg or less.

Further preferred is a method for removing the organic peroxide which comprises removing the organic peroxide in the above-mentioned organic acid ester-type liquid from the above-mentioned organic liquid having a peroxide value (POV) of 0.01 mmol/kg or more and 100 mmol/kg or less until the peroxide value (POV) becomes 2 mmoL/kg or less.

Prior to carry out the present invention, it is preferred that the organic peroxide is previously removed until the peroxide value (POV) becomes 100 mmol/kg or less by the conventionally known method.

It is more preferred that the organic peroxide is removed until the peroxide value (POV) becomes 1 mmol/kg or less, particularly preferably 0.5 mmol/kg or less, further preferably 0.3 mmol/kg or less, and most preferably 0.1 mmol/kg or less. According to the present invention, the above can be attained even in consideration of the cost, and the above-mentioned lower limit is particularly desired as an amount of the organic peroxide for producing electronic parts.

The above-mentioned "lower limit of the amount of the organic peroxide remaining in the organic acid ester-type liquid after the treatment" (removal level) is larger than the "remaining amount of the hydrogen peroxide in water after the treatment" (removal level) at the time of removing the hydrogen peroxide from water by the conventionally known method. This is because, it is difficult to remove quantitatively an organic peroxide from an organic acid ester-type liquid than to remove hydrogen peroxide from water, and in the case of the organic liquid, if the above-mentioned lower limit can be achieved, it can be suitably used also for producing the electronic parts.

Further, an increase in the organic peroxide in the liquid was observed over time during the period of storage and transportation, etc., of the above-mentioned organic acid ester-type liquid and until use thereof. Therefore, for the organic acid ester-type liquid, increased amount with a lapse of time [mmol/(kg·month)] of the peroxide value (POV) per a unit time is an important criteria of properties.

In the "increased amount with a lapse of time [mmol/(kg·month)]" of the present invention, "month" is to show "30 days".

According to the present invention, it is possible to remove the organic peroxide until an increased amount of the peroxide value (FOV) with a lapse of time (hereinafter abbreviated to as the "increased amount of the peroxide value (POV) with a lapse of time" or simply as the "increased amount with a lapse of time") becomes 2 mmol/(kg·month) or less, and if the increased amount of the peroxide value (POV) with a lapse of time is 2 mmol/(kg·month) or less, the above-mentioned effect of the present invention can be achieved to the organic acid ester-type liquid which is a solvent of the resist for producing electronic parts and the organic acid ester-type liquid which is a rinsing liquid for producing electronic parts.

Preferred is a method for removing the organic peroxide which comprises removing the organic peroxide in the above-mentioned organic acid ester-type liquid from the above-mentioned liquid having an increased amount of the peroxide value (POV) with a lapse of time of 100 mmol/(kg·month) or less until the increased amount of the peroxide value (POV) with a lapse of time becomes 2 mmol/(kg·month) or less.

It is more preferred to remove the organic peroxide until the increased amount of the peroxide value (POV) with a lapse of time becomes 1 mmol/(kg·month) or less, particularly preferably 0.5 mmol/(kg·month) or less, further preferably 0.2 mmol/(kg·month) or less.

According to the present invention, the above can be attained even in consideration of the cost, and the above-mentioned lower limit is particularly preferred as an increased amount of the organic peroxide with a lapse of time for producing electronic parts.

The method for removing the organic peroxide of the present invention is not particularly limited, and a method in which the organic acid ester-type liquid which is an object is passed through a filled column is preferred.

In such a case, it is preferred that the liquid is passed through until a concentration of the organic peroxide becomes (so as to be) the above-mentioned concentration or less, and with regard to a space velocity (SV), it is not particularly limited, and is preferably 10 $hr^{-1}$ or more and 2,000 $hr^{-1}$ or less, more preferably 20 $hr^{-1}$ or more and 500 $hr^{-1}$ or less, and particularly preferably 30 $hr^{-1}$ or more and 300 $hr^{-1}$ or less.

When it is the above-mentioned lower limit or more, the flow rate can be made large, which is advantageous in the cost, and according to the present invention, the organic peroxide can be removed with a level which can be suitably used for producing the electronic parts even when it is the above-mentioned lower limit or more. On the other hand, if it is the above-mentioned upper limit or more, there is a case where removal of the organic peroxide cannot sufficiently be carried out.

The "space velocity (SV)" is a value in which the mass of the organic liquid which passes through the platinum group metal catalyst or a carrier onto which the platinum group metal catalyst has been carried per one hour is divided by the mass of the platinum group metal catalyst or a carrier onto which the platinum group metal catalyst has been carried. In other words, it is an inverse number of the time when the organic acid ester-type liquid contacts with the carrier, etc., per a unit time.

When the process for producing an organic acid ester-type liquid of the present invention is used, "a resist solvent or a rinsing liquid for producing electronic parts" which can achieve the above-mentioned effect of the present invention can be produced.

Other embodiment of the present invention is an organic peroxide-removed organic acid ester-type liquid which comprises an organic acid ester-type liquid which is a solvent of a resist for producing electronic parts or an organic acid ester-type liquid which is a rinsing liquid for producing electronic parts from which an organic peroxide has been removed until a peroxide value (POV) becomes 2 mmoL/kg or less.

Still further embodiment of the present invention is an organic peroxide-removed organic acid ester-type liquid which comprises an organic acid ester-type liquid having a peroxide value (POV) of 100 mmoL/kg or less from which an organic peroxide has been removed until a peroxide value (POV) becomes 2 mmoL/kg or less.

In addition this is to provide a process for producing a resist solvent for producing electronic parts or a rinsing liquid for producing electronic parts, which comprises a step of removing an organic peroxide contained in an organic acid ester-type liquid which is a solvent of a resist for producing electronic parts or an organic acid ester-type liquid which is a rinsing liquid for producing electronic parts by using the above-mentioned process for producing an organic acid ester-type liquid.

Still further embodiment of the present invention is a resist solvent for producing electronic parts or a rinsing liquid for producing electronic parts, which comprises an organic liquid which is an organic acid ester-type liquid which is a solvent of a resist for producing electronic parts or a rinsing liquid for producing electronic parts from which an organic acid ester-type peroxide has been removed until a peroxide value (POV) becomes 2 mmoL/kg or less by using the above-mentioned process for producing an organic acid ester-type liquid.

That is, this is a resist solvent for producing electronic parts or a rinsing liquid for producing electronic parts containing the above-mentioned organic peroxide-removed organic acid ester-type liquid and to be used as a solvent of the resist for producing electronic parts or a rinsing liquid for producing electronic parts, and having a peroxide value (POV) of 2 mmoL/kg or less.

Moreover, the other embodiment of the present invention is a resist solvent for producing electronic parts or a rinsing liquid for producing electronic parts, which comprises an organic liquid which is an organic acid ester-type liquid which is a solvent of a resist for producing electronic parts or a rinsing liquid for producing electronic parts from which an organic acid ester-type peroxide has been removed by using the above-mentioned process for producing an organic acid ester-type liquid, and making the above-mentioned liquid having an increased amount of a peroxide value (POV) with a lapse of time of 100 mmol/(kg·month) or less a liquid having the increased amount of the peroxide value (POV) with a lapse of time of 2 mmol/(kg·month) or less.

That is, it is a resist solvent for producing electronic parts or a rinsing liquid for producing electronic parts which comprises the above-mentioned organic peroxide-removed organic acid ester-type liquid which is used as a solvent of the resist for producing electronic parts or a rinsing liquid for producing electronic parts, and the increased amount of the peroxide value (POV) with a lapse of time is 2 mmol/(kg·month) or less.

The peroxide value (POV) is preferably 2 mmol/kg or less, more preferably 1 mmol/kg or less, particularly preferably 0.5 mmol/kg or less, further preferably 0.3 mmol/kg or less and most preferably 0.1 mmol/kg or less. According to the present invention, the above-mentioned lower limit can be attained even in consideration of the cost, and the organic peroxide desirably has the above-mentioned lower limit for producing electronic parts.

EXAMPLES

In the following, the present invention is more specifically explained by referring to Examples and Comparative examples, but the present invention is not limited by these Examples as long as it does not exceed the gist of the invention.

Preparation Example

<Preparation of Carrier onto which Platinum Group Metal Catalyst has been Carried>
<<Preparation of Anion Exchanger Having a Monolith Structure onto which Palladium (Pd) has been Carried>>

As a carrier onto which the platinum group metal catalyst has been carried, the "anion exchanger having a monolith structure onto which palladium (Pd) has been carried" (hereinafter abbreviated to as "Pd/M" or "Pd-M") which is the above-mentioned "third monolith anion exchanger" was purchased from ORGANO CORPORATION.

The constitution and the embodiment (regulated by the producing method) are described in Japanese Journal of Polymer Science and Technology, Vol. 68, No. 5, pp. 320-325 (2011) in detail, and the main points of the producing method are described below.

(1) First Step Polymerization

An emulsifier, styrene, divinylbenzene and a radical polymerization initiator were mixed to form a uniform solution. The solution and pure water were charged in an apparatus and the mixture was stirred by using a mixer to form a water droplets in oil type (W/O type) emulsion.

After an inside of the apparatus into which the emulsion had been charged was replaced with nitrogen, the apparatus was sealed and polymerization was carried out in a stationary state under heating.

After completion of the polymerization, the polymerized resin was taken out from the apparatus, purified by Soxhlet extraction and subjected to drying under reduced pressure to synthesize a monolithic structural body (A).

(2) Second Step Polymerization

Styrene, divinylbenzene, "a poor solvent for the polystyrene" and a radical polymerization initiator were mixed to form a uniform solution. The monolithic structural body (A) synthesized in Step (1) was dipped into the solution, and deformed under a nitrogen atmosphere to permeate the solution into the inside of the monolithic structural body (A).

After sealing under a nitrogen atmosphere, it was polymerized in a stationary state by heating.

After completion of the polymerization, the material was taken out from the apparatus, purified by Soxhlet extraction, and dried under reduced pressure to synthesize a monolithic structural body (B).

(3) Chloromethylation

The monolithic structural body (B) obtained in Step (2) and chloromethyl methyl ether were reacted in the presence of tin tetrachloride to introduce chloromethyl groups into the monolithic structural body (B).

(4) Amination

The "chloromethylated monolithic structural body (B)" obtained in Step (3) was dipped in a mixed solution of trimethylamine and THF to react the materials to introduce quaternary ammonium groups thereinto.

After completion of the reaction, the obtained "anion exchanger having a monolith structure" was washed with pure water, whereby the inside thereof was substituted by pure water.

The finally obtained "anion exchanger having a monolith structure" had a pillar shaped having a diameter of 190 mm and a thickness of 40 mm, and a counter ion of the quaternary ammonium group was a chloride ion.

(5) Carry of Platinum Group Metal Catalyst

The "anion exchanger having a monolith structure" obtained in Step (4) was cut out into a shape of disc having a thickness of 10 mm. $PdCl_2$ was used as the Pd source, and upon dissolving in dil. hydrochloric acid, it was used by diluting with water. It could be considered that a divalent $[PdCl_4]^{2-}$ (chloropalladate ion) as a Pd species was introduced by ion exchange, so that the cut "anion exchanger having a monolith structure" was dipped in an aqueous $PdCl_2$ solution prepared to a predetermined concentration, and chloropalladate ions were introduced by ion exchange.

After washing with pure water sufficiently, reduction was carried out by using an aqueous hydrazine solution to carry the palladium (Pd) catalyst.

Thereafter, it was dipped in 1 mol/L of an aqueous sodium hydroxide solution and an ionic form was made an OH⁻ form by stirring, and then, washed with pure water to obtain the objective "carrier in which the platinum group metal catalyst has been carried onto the anion exchanger having a monolith structure" (Pd/M).

A part thereof was made a nitric acid-sealed form.

Evaluation Example

<Measurement of Peroxide Value (POV)>

The peroxide value (POV) of the organic liquid was measured in accordance with ISO3960.

Example 1

<Confirmation of Effect by Shaking Method>

As the carrier onto which the platinum group metal catalyst has been carried, Pd/M (OH⁻ form, Pd carried amount is 3% by mass) and Pd/M (nitric acid-sealed form, Pd carried amount is 5% by mass) prepared in Preparation example were evaluated.

As an example of the organic acid ester-type-liquid, ethyl lactate (ETL) was evaluated.

Pd/M (OH⁻ form) and Pd/M (nitric acid-sealed form) which are "carriers onto which the platinum group metal catalyst has been carried" washed previously with an ethyl lactate liquid as a test solution were each weighed or cut out (Pd/M was cut out into about 7 mm square) so that the sample contains 10 mg of Pd.

These carriers were each added to the respective 100 mL of the ethyl lactate liquids whose peroxide values were quantified, then, placed in a 500 mL of the brown bottle and shaken at 25° C. for 12 hours.

After shaking, the carrier was collected by filtration and the peroxide value thereof was determined. The results are shown in the following Table 1.

TABLE 1

| Solvent | Added catalyst | Peroxide value (mmol/kg) | |
| --- | --- | --- | --- |
| | | Before treatment | After treatment |
| ETL | Pd—M (nitric acid-sealed form) | 1.01 | 0.02 |
| ETL | Pd—M (OH form) | 4.88 | 0.02 |

As can be seen from Table 1, after shaking at 25° C. for 12 hours, the peroxide value (POV) was decreased.

Example 2

<Confirmation of Effect (1) by Filling in Column and Changing Space Velocity (SV)>

In a column having an inner diameter of 10 mm was filled 7.9 mL (layer height 10 cm) of Pd/M (OH⁻ form), and ethyl lactate (ETL) the peroxide value of which had been measured was passed through the column with an upflow by changing a liquid flow space velocity (SV).

The peroxide value (POV) of the ethyl lactate (ETL) sampled at the column outlet was quantified. The results are shown in the following Table 2.

TABLE 2

| Liquid flow space velocity | Peroxide value [mmol/kg] | |
| --- | --- | --- |
| (SV) [hr⁻¹] | Before liquid flow | After liquid flow |
| 174 | 2.98 | 1.83 |
| 131 | 2.98 | 1.58 |
| 10 | 2.98 | 0.15 |

As cleanly seen from Table 2, even when the liquid flow space velocity (SV) was changed, lowering in the peroxide value (POV) was confirmed. At the time of the liquid flow space velocity (SV) of 10 [hr⁻¹], the peroxide value (POV) was extremely small as 0.15 [mmol/kg].

Example 3

<Confirmation of Effect (2) by Filling in Column and Changing Space Velocity (SV)>

In a column having an inner diameter of 75 mm was filled 830 mL (layer height 161 mm) of Pd/M (OH⁻ form) in a wet state, and the ethyl lactate (ETL) the peroxide value of which had been measured was passed through the column with an upflow by changing a liquid flow space velocity (SV). Incidentally, the volume of the Pd/M (OH⁻ form) shrinks to 760 ml in the ethyl lactate.

The peroxide value (POV) of ethyl lactate (ETL) sampled at the column outlet was quantified. The results are shown in the following Table 3.

TABLE 3

| Liquid flow space velocity | Peroxide value (POV) [mmol/kg] | |
| --- | --- | --- |
| (SV) [hr⁻¹] | Before liquid flow | After liquid flow |
| 1440 | 1.54 | 1.26 |
| 1040 | 1.54 | 1.18 |
| 480 | 1.54 | 0.72 |
| 240 | 1.54 | 0.28 |

As clearly seen from Table 3, when the column was scaled up, even if the liquid flow space velocity (SV) was changed, lowering in the peroxide value (POV) was confirmed.

Example 4

<Confirmation of Effect (1) by Filling in Column and Circulating>

In a column having an inner diameter of 10 mm was filled 7.9 mL (layer height 10 cm) of Pd/M (OH⁻ form), ethyl lactate (ETL) in which the peroxide value (POV) was changed to three grades (0.22, 0.53 and 5.40 mmol/kg) was passed therethrough as a sample liquid while circulating in an upflow. The space velocity (SV) was unified to 177 hr⁻¹.

The peroxide in the ethyl lactate (ETL) was quantified by sampling from the vicinity of the column outlet at regular time intervals. The results are shown in the following Table 4 (the results after 700 minutes) and FIG. 11.

TABLE 4

| Peroxide value (POV) [mmol/kg] | |
| --- | --- |
| Before liquid flow | After liquid flow |
| 0.22 | 0.05 |
| 0.53 | 0.06 |
| 5.40 | 0.03 |

Figure 11:
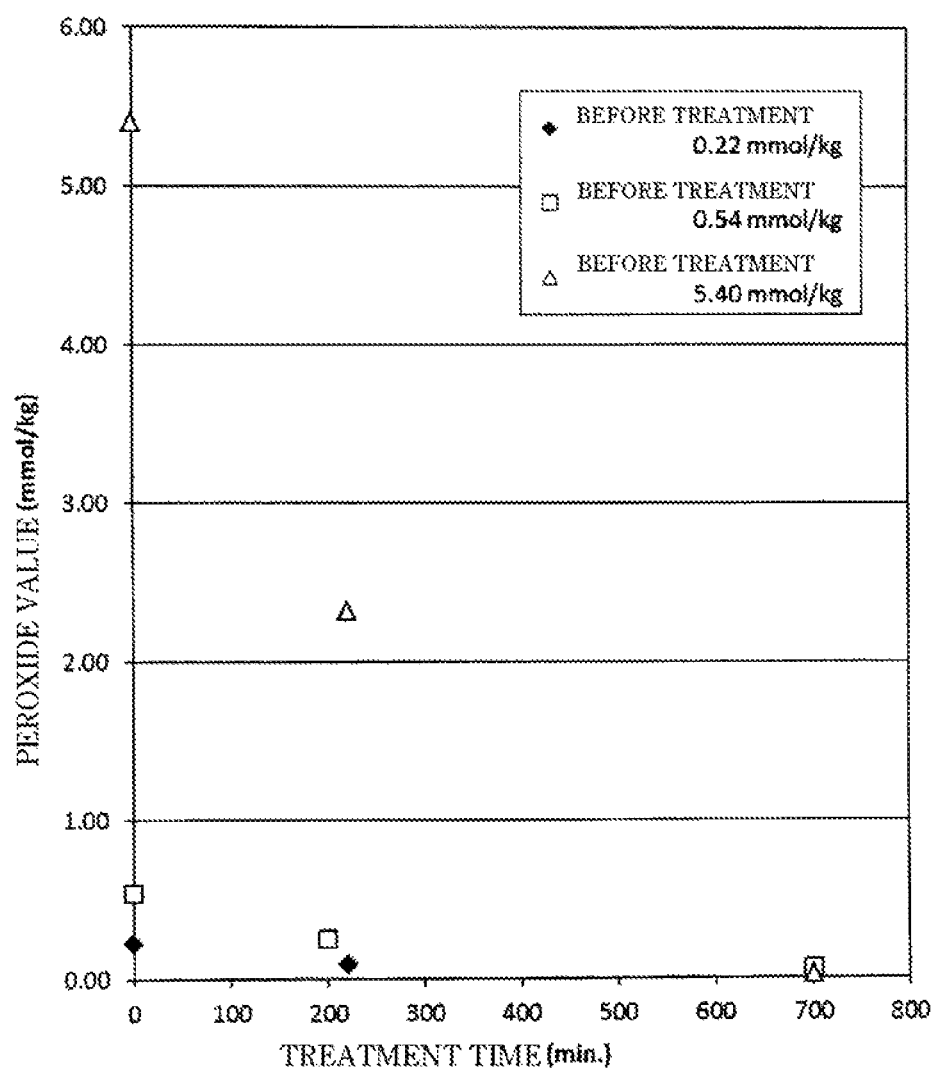
FIG. 11 is a graph in which the effect of removing the organic peroxide is confirmed by filling "an anion exchanger having a monolith structure onto which the platinum group metal catalyst has been carried" in the present invention and circulated (Example 4)

As clearly seen from Table 4 and FIG. 11, the peroxide value was decreased with a lapse of the treatment time. When the ethyl lactate (ETL) which is a sample to be evaluated was evaluated by changing the initial (before liquid flow) peroxide value (POV) thereof, and as a result, it could be confirmed that each can be removed to 0.1 mmol/kg or less irrespective of the initial (before liquid flow) peroxide value (POV).

Example 5

<Confirmation of Effect (2) by Filling in Column and Circulating>

In a column having an inner diameter of 75 mm was filled 830 mL (layer height 161 mm) of Pd/M (OH$^-$ form) in a wet state, and the ethyl lactate (ETL) having an peroxide value (POV) of 1.54 mmol/kg was passed therethrough as a sample liquid while circulating in an upflow. The space velocity (SV) was unified to 1040 hr$^{-1}$. Incidentally, the volume of the Pd/M (OH$^-$ form) shrinks to 760 mL in the ethyl lactate.

The peroxide in the ethyl lactate (ETL) was quantified by sampling from the vicinity of the column outlet at regular time intervals. The results are shown in the following FIG. 12.

Figure 12:
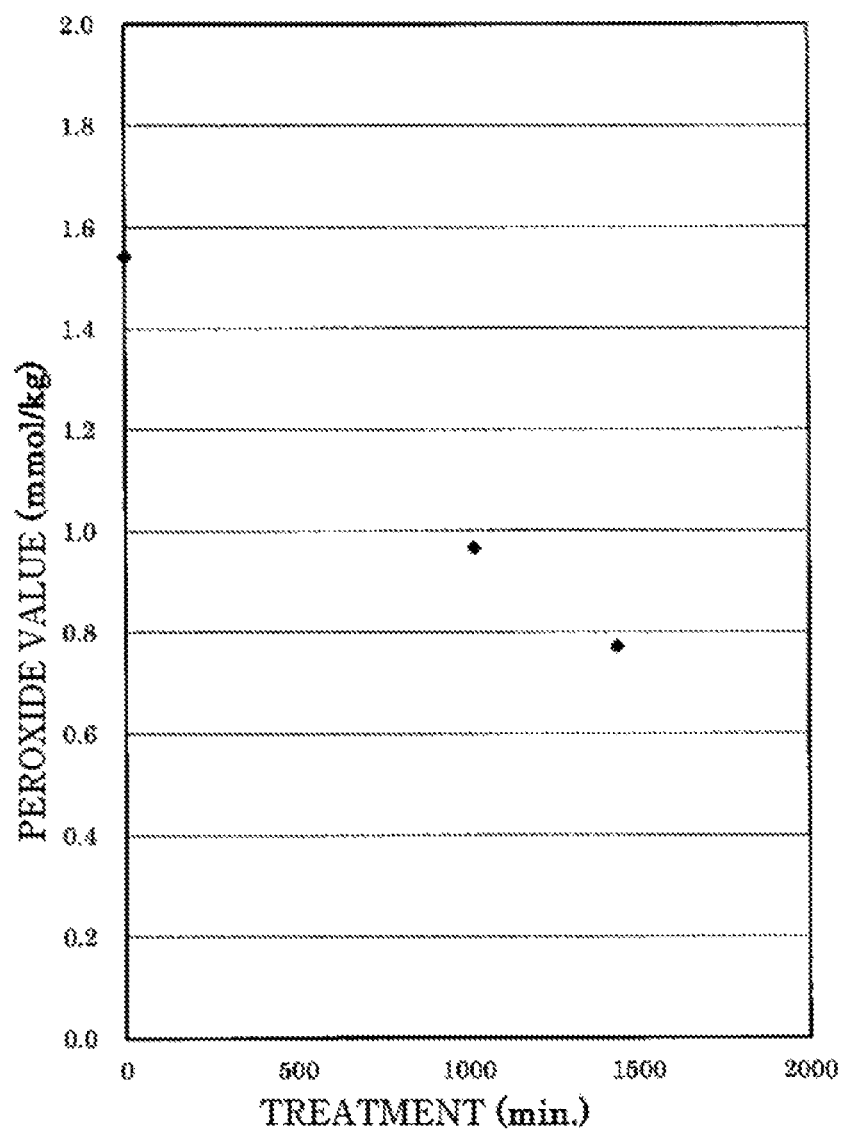
FIG. 12 is a graph in which the effect of removing the organic peroxide is confirmed by filling "an anion exchanger having a monolith structure onto which the platinum group metal catalyst has been carried" in the present invention and circulated (Example 5).

As clearly seen from FIG. 12, the peroxide value was decreased with a lapse of the treatment time.

Example 6

<Confirmation of Stability with a Lapse of Time>

The "ethyl lactate (ETL) which became POV=0.06 mmol/kg after liquid flow" (abbreviated to as "monolith treated") and the "ethyl lactate (ETL) having POV=5.40 mmol/kg which is not subjected to liquid flow" (abbreviated to as "monolith untreated") obtained in Example 4 were each stationally stored in a dark place at 20° C. for one month (30 days).

The results are shown in Table 5.

TABLE 5

| | | Peroxide value (POV) (mmol/kg) | |
| --- | --- | --- | --- |
| | | Monolith untreated | Monolith treated |
| Stored days (month) | 0 | 5.40 | 0.06 |
| | 1 | 10.50 | 0.20 |
| Increased amount with a lapse of time | | 5.10 | 0.14 |

The "monolith treated" produced by the process for producing an organic acid ester-type liquid of the invention was able to suppress the increase in the peroxide value with a lapse of time during the storage as compared with that of the "monolith untreated". That is, while the obtained peroxide value (POV) increased amount with a lapse of time was 0.14 mmoL/(kg·month) in the "monolith treated", the "monolith untreated" was 5.10 mmoL/(kg·month).

According to the above, it could be understood that the organic acid ester-type liquid produced by the process for producing an organic acid ester-type liquid of the present invention was suppressed in the "peroxide value (POV) increased amount with a lapse of time" with regard to the peroxide value (POV). That is, it could be understood that stability with a lapse of time was excellent.

Example 7

<Method for Reprocessing Organic Acid Ester-Type Liquid Increased in POV>

"Ethyl lactate (ETL) in which the peroxide value (POV) became 10.50 mmol/kg after storage for one month (30 days)" obtained in Example 6 was passed through a column having an inner diameter of 10 mm into which 7.9 mL (layer height 10 cm) of Pd/M (OH$^-$ form) has been filled, while circulating in an upflow. The space velocity (SV) was unified to 177 hr$^{-1}$.

The peroxide in the ethyl lactate (ETL) was quantified by sampling from the vicinity of the column outlet at regular time intervals. The peroxide values (POV) of ethyl lactate (ETL) before and after the treatment are shown in the following Table 6 (Results after 700 minutes).

TABLE 6

| | Peroxide value (POV) [mmol/kg] | | Recovery rate % |
| --- | --- | --- | --- |
| Item | Before liquid flow | After liquid flow | After liquid flow |
| Column immediately after filling | 10.5 | 0.06 | 99.9 |
| Column in which liquid was passed continuously for three months | 10.5 | 0.07 | 99.9 |

As can be seen from Table 6, the ethyl lactate (ETL) in which the peroxide value (POV) was increased to 10.50 mmol/kg during the storage became the peroxide value (POV) of 0.06 mmoL/kg after liquid flow, so that it could be understood that the present invention is excellent as a "method for reprocessing an organic acid ester-type liquid".

The recovery rate of the ethyl lactate (ETL) was 99.9% by mass. In addition, the same results as above were obtained even when a column passed continuously for three months instead of the column immediately after filling was used.

Further, the metal content of the ethyl lactate (ETL) was analyzed by using ICP-MS (23 elements including Pd) before and after circulation for 700 minutes using a column which was continuously passed for three months, no increase in metal content was confirmed before and after the treatment.

UTILIZABILITY IN INDUSTRY

The organic acid ester-type liquid produced by using the present invention is excellent as a solvent or a rinsing liquid or a resist for producing electronic parts, and it is useful as a photoresist in the process; for producing electronic parts, in particular, for producing an integrated circuit (IC), and a resist for producing a color filter for a display, so that it can be widely used in the field of producing electronic parts, etc.

EXPLANATION OF REFERENCE NUMERALS

1 in FIG. 4: Skeletal phase
2 in FIG. 4: Pore phase 11 in FIG. 6: Image region
12 in FIG. 6: Skeletal part appearing in cross-section
13 in FIG. 6: Macropore
1 in FIGS. 8A-8E: Surface of skeleton
2 in FIG. 8A-8E: Protrusion
1 in FIG. 10: Macropore
2 in FIG. 10: Opening
3 in FIG. 10: Inner layer part
4 in FIG. 10: Surface layer part
5 in FIG. 10: Vapor phase part (Bubble part)
6 in FIG. 10: Wall part (Skeletal part)
7 in FIG. 10: Fine pore

The invention claimed is:

1. A process for producing a peroxide-removed organic acid ester liquid, comprising:
  contacting an organic acid ester liquid with a platinum group metal catalyst which is carried on a synthetic resin, thereby removing an organic peroxide from the organic acid ester liquid,
  wherein the organic acid ester liquid is a solvent of a resist for producing electronic parts or a rinsing liquid for producing electronic parts.

2. The process for producing a peroxide-removed organic acid ester liquid according to claim 1,
  wherein the organic acid ester liquid is contacted with the synthetic resin onto which the platinum group metal catalyst has been carried, and
  wherein the synthetic resin is a material in which the platinum group metal catalyst is carried onto an organic porous anion exchanger having a monolith structure.

3. The process for producing a peroxide-removed organic acid ester liquid according to claim 2,
  wherein nanoparticles of a platinum group metal having an average particle size of 1 to 100 nm are carried onto the organic porous anion exchanger,
  wherein the organic porous anion exchanger comprises a continuous skeletal phase and a continuous porous phase,
  wherein a thickness of a continuous skeleton of the continuous skeletal phase is 1 to 100 μm,
  wherein the organic porous anion exchanger has an average diameter of continuous pores of 1 to 1,000 μm,
  wherein the organic porous anion exchanger has a total pore volume of 0.5 to 50 mL/g,
  wherein the organic porous anion exchanger has an ion exchange capacity per a weight in a dry state of 0.5 to 6 mg equivalent/g, and
  wherein ion exchange groups are uniformly distributed in the organic porous anion exchanger.

4. The process for producing a peroxide-removed organic acid ester liquid according to claim 2,
  wherein the organic porous anion exchanger has a continuous cell structure which has mesopores having an average diameter of 1 to 1,000 μm in walls of macropores which are interconnected to each other,
  wherein the organic porous anion exchanger has a total pore volume of 1 to 50 mL/g,
  wherein the organic porous anion exchanger has an ion exchange capacity per a weight in a dry state of 0.5 to 6 mg equivalent/g, and
  wherein ion exchange groups are uniformly distributed in the organic porous anion exchanger.

5. The process for producing a peroxide-removed organic acid ester liquid according to claim 2,
  wherein the organic porous anion exchanger forms a three-dimensionally continuous skeletal portion by agglomerating organic polymer particles having an average particle size of 1 to 50 μm,
  wherein the organic porous anion exchanger has three-dimensionally continuous pores having an average diameter of 20 to 100 μm between skeletons,
  wherein the organic porous anion exchanger has a total pore volume of 1 to 10 mL/g,
  wherein the organic porous anion exchanger has an ion exchange capacity per a weight in a dry state of 0.5 to 6 mg equivalent/g, and
  wherein ion exchange groups are uniformly distributed in the organic porous anion exchanger.

6. The process for producing a peroxide-removed organic acid ester liquid according to claim 2,
  wherein the organic porous anion exchanger is a co-continuous structural body comprising three-dimensionally continuous skeletons having an average thickness of 1 to 60 μm,
  wherein the organic porous anion exchanger comprises an aromatic vinyl polymer containing 0.3 to 5.0 mol % of a crosslinking structure unit based on whole constitutional units into which ion exchange groups have been introduced,
  wherein the organic porous anion exchanger comprises three-dimensionally continuous pores having an average diameter of 10 to 200 μm between the skeletons,
  wherein the organic porous anion exchanger has a total pore volume of 0.5 to 10 mL/g,
  wherein the organic porous anion exchanger has an ion exchange capacity per a weight in a dry state of 0.5 to 6 mg equivalent/g, and
  wherein ion exchange groups are uniformly distributed in the organic porous anion exchanger.

7. The process for producing a peroxide-removed organic acid ester liquid according to claim 2,
  wherein the organic porous anion exchanger is a continuous macropore structural body in which bubble shaped macropores are overlapped with each other, overlapping portions being openings having an average diameter of 30 to 300 μm,
  wherein the organic porous anion exchanger has a total pore volume of 0.5 to 10 mL/g,
  wherein the organic porous anion exchanger has an ion exchange capacity per a weight in a dry state of 0.5 to 6 mg equivalent/g,
  wherein ion exchange groups are uniformly distributed in the organic porous anion exchanger, and
  wherein, in an SEM image of a cut surface of the continuous macropore structural body, a skeletal part area appearing in a cross-section is 25 to 50% in an image area.

8. The process for producing a peroxide-removed organic acid ester liquid according to claim 2,
  wherein the organic porous anion exchanger comprises a continuous skeletal phase and a continuous porous phase,
  wherein the skeletal phase has
    a plurality of particle bodies having a diameter of 4 to 40 μm fixed to a surface of the skeletal phase of the organic porous body, or
    a plurality of protrusions having a size of 4 to 40 μm formed onto the surface of the skeletal phase of the organic porous body,
  wherein the organic porous anion exchanger has an average diameter of continuous pores of 10 to 150 μm,
  wherein the organic porous anion exchanger has a total pore volume of 0.5 to 10 mL/g, wherein the organic porous anion exchanger has an ion exchange capacity per a weight in a dry state of 0.5 to 6 mg equivalent/g, and wherein ion exchange groups are uniformly distributed in the organic porous anion exchanger.

9. The process for producing a peroxide-removed organic acid ester liquid according to claim 2, wherein the organic porous anion exchanger is a continuous macropore structural body in which bubble shaped macropores are overlapped with each other, overlapping portions being openings having an average diameter of 20 to 300 μm, wherein a surface-layer part of a skeletal part of the continuous macropore structural body is a porous structure, wherein the organic porous anion exchanger has an anion exchange capacity per a volume in a wet state of 0.4 mg equivalent/mL or more, and wherein the organic porous anion exchanger has anion exchange groups are uniformly distributed in the organic porous anion exchanger.

10. The process for producing a peroxide-removed organic acid ester liquid according to claim 2, wherein the organic porous anion exchanger is an OH⁻ form.

11. The process for producing a peroxide-removed organic acid ester liquid according to claim 1, wherein the platinum group metal catalyst is a palladium catalyst.

12. The process for producing a peroxide-removed organic acid ester liquid according to claim 1, wherein the organic peroxide in the organic acid ester liquid is removed until a peroxide value (POV) becomes 2 mmol/kg or less.

13. The process for producing a peroxide-removed organic acid ester liquid according to claim 1, wherein the organic acid ester liquid contains at least one selected from the group consisting of methyl acetate, ethyl acetate, propyl acetate, butyl acetate, methyl lactate, ethyl lactate, propyl lactate, butyl lactate, methyl pyruvate, ethyl pyruvate and butyl pyruvate.

14. The process for producing a peroxide-removed organic acid ester liquid according to claim 1, wherein the synthetic resin is a crosslinked resin having fine pores.

15. The process for producing a peroxide-removed organic acid ester liquid according to claim 14, wherein the crosslinked resin has through holes.

16. A process for producing a resist solvent for producing electronic parts or a rinsing liquid for producing electronic parts, comprising:

removing an organic peroxide contained in an organic acid ester liquid which is a solvent of a resist for producing electronic parts or a rinsing liquid for producing electronic parts by using the process for producing an organic acid ester liquid according to claim 1.

17. A method for reprocessing an organic acid ester liquid which is a method for reprocessing an organic acid ester liquid using the process for producing an organic acid ester liquid according to claim 1, comprising:

removing an organic peroxide in the organic acid ester liquid by contacting the organic acid ester liquid a peroxide value (POV) of which is increased during storage or transportation with a platinum group metal catalyst.

* * * * *